(12) United States Patent
Fujii

(10) Patent No.: US 8,318,601 B2
(45) Date of Patent: Nov. 27, 2012

(54) METHOD FOR MANUFACTURING THIN FILM TRANSISTOR AND DISPLAY DEVICE

(75) Inventor: Gen Fujii, Kanagawa (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 0 days.

(21) Appl. No.: 13/098,751

(22) Filed: May 2, 2011

(65) Prior Publication Data

US 2011/0256702 A1  Oct. 20, 2011

Related U.S. Application Data

(62) Division of application No. 10/586,661, filed as application No. PCT/JP2005/002681 on Feb. 15, 2005, now Pat. No. 7,951,710.

(30) Foreign Application Priority Data

Feb. 17, 2004 (JP) ................................ 2004-040499

(51) Int. Cl.
*H01L 21/44* (2006.01)
*H01L 21/00* (2006.01)

(52) U.S. Cl. ........ 438/665; 438/151; 438/586; 438/585; 438/674; 257/E21.174

(58) Field of Classification Search .................. 438/151, 438/149, 586, 585, 665, 674; 257/E21.174, 257/E21.159
See application file for complete search history.

(56) References Cited

U.S. PATENT DOCUMENTS

| | | | |
|---|---|---|---|
| 6,087,196 A * | 7/2000 | Sturm et al. | ..................... 438/29 |
| 6,810,814 B2 * | 11/2004 | Hasei | ............................. 101/485 |
| 6,838,361 B2 | 1/2005 | Takeo | |
| 2002/0017149 A1 | 2/2002 | Maikner | |
| 2003/0059987 A1 | 3/2003 | Sirringhaus et al. | |
| 2003/0068581 A1 | 4/2003 | Kawamura et al. | |
| 2003/0083203 A1 * | 5/2003 | Hashimoto et al. | ........... 505/100 |
| 2006/0160277 A1 * | 7/2006 | Sirringhaus et al. | .......... 438/149 |

FOREIGN PATENT DOCUMENTS

| | | |
|---|---|---|
| JP | 11-207959 | 8/1999 |
| JP | 11-251259 | 9/1999 |
| JP | 2003-59940 | 2/2003 |
| WO | WO-02/073712 | 9/2002 |

OTHER PUBLICATIONS

Written Opinion of the International Searching Authority for PCT/JP2005/002681 dated May 10, 2005.
International Search Report for PCT/JP2005/002681 dated May 10, 2005.

* cited by examiner

*Primary Examiner* — Shouxiang Hu
(74) *Attorney, Agent, or Firm* — Nixon Peabody LLP; Jeffrey L. Costellia

(57) ABSTRACT

The present invention discloses a display device and a manufacturing method thereof by which a manufacturing process can be simplified. Further, the present invention discloses technique for manufacturing a pattern such as a wiring into a desired shape with good controllability. A method for forming a pattern for constituting the display device according to the present invention comprises the steps of forming a first region and a second region; discharging a composition containing a pattern formation material to a region across the second region and the first region; and flowing a part of the composition discharged to the first region into the second region; wherein wettability with respect to the composition of the first region is lower than that of the second composition.

5 Claims, 44 Drawing Sheets

METHOD FOR MANUFACTURING THIN FILM TRANSISTOR AND DISPLAY DEVICE

TECHNICAL FIELD

The present invention relates to a method for forming a pattern, a thin film transistor, a method for manufacturing the same, a display device, a method for manufacturing the same, and a television device using the foregoing thin film transistor and display device.

BACKGROUND ART

A thin film transistor (hereinafter, TFT) and an electronic circuit using the TFT is manufactured by stacking various thin films such as a semiconductor, an insulator, or a conductor over a substrate, and forming appropriately a predetermined pattern by photolithography technique. The photolithography technique means technique of transferring a pattern such as a circuit made from a material that does not transmit light formed over a transparent plane surface referred to as a photomask to a substrate by utilizing light. The photolithography technique is widely used in a manufacturing process for a semiconductor integrated circuit and the like.

In a manufacturing process using the conventional photolithography technique, many processes such as exposing, developing, baking or exfoliating are required to handle a mask pattern formed by using a photosensitive organic resin material referred to as a photoresist. Therefore, the increase of the number of the photolithography processes inevitably leads to the increase of a manufacturing cost. In order to solve such problems, it has been tried to manufacture a TFT by a method with reduced number of the photolithography processes (Unexamined Patent Publication No. 11-251259).

However, the technique disclosed by Unexamined Patent Publication No. 11-251259 does not contribute to reduce drastically the number of processes, since a part of the photolithography processes performed at a plurality of times in a TFT manufacturing process is merely substituted by a printing process. A photolithography machine, which is used for transferring a mask pattern in the photolithography process, is a machine for transferring a pattern of 1 micron or less by means of same magnification projection exposure or reduced projection exposure. In principle, it is technically-difficult that a large substrate having a side of 1 meter or more is exposed at one time by the photolithography machine.

DISCLOSURE OF INVENTION

It is an object of the present invention to provide technique by which the number of photolithography processes is reduced in a manufacturing process of a TFT, a display device using the TFT, and an electronic circuit using the TFT; a manufacturing process is simplified; and manufacture at low costs with good yields can be realized even if a large substrate having a side of one meter or more is used.

It is another object of the present invention to provide technique for forming a pattern such as a wiring that composes these display devices into a desired shape with good controllability.

As a display device according to the present invention, a light-emitting display device in which a light-emitting element including a medium containing an organic matter generating light emission referred to as electroluminescence (hereinafter, EL) or a mixture of the organic matter and an inorganic matter is interposed between a pair of electrodes is connected to TFT; and a liquid crystal display device using a liquid crystal element including a liquid crystal material as a display element are taken as examples.

A method for forming a pattern comprises the steps of forming a first region and a second region; discharging a composition containing a pattern formation material to a region across the second region and the first region; and flowing a part of the composition discharged to the first region into the second region; wherein wettability with respect to the composition of the first region is lower than that of the second region.

A method for forming a pattern comprises the steps of forming selectively a mask to a subject formation region; forming a first region by using the mask; forming a second region by removing the mask; discharging a composition containing a pattern formation material to a region across the second region and the first region; and flowing a part of the composition discharged to the first region into the second region; wherein wettability with respect to the composition of the first region is lower than that of the second region.

A method for forming a pattern comprises the steps of forming selectively a photocatalytic substance to a subject formation region; forming a first region over the subject formation region and the photocatalytic substance; emitting light to the photocatalytic substance to form a second region; discharging a composition containing a pattern formation material to a region across the second region and the first region; and flowing a part of the composition discharged to the first region into the second region; wherein wettability with respect to the composition of the first region is lower than that of the second region.

A method for forming a pattern comprises the steps of forming a first region to a subject formation region; emitting light selectively to the first region to form a second region; discharging a composition containing a pattern formation material to a region across the second region and the first region; and flowing a part of the composition discharged to the first region into the second region; wherein wettability with respect to the composition of the first region is lower than that of the second region.

A method for manufacturing a thin film transistor comprises the steps of forming a first region and a second region; discharging a composition containing a conductive material to a region across the second region and the first region; and flowing a part of the composition discharged to the first region into the second region to form an electrode layer; wherein wettability with respect to the composition of the first region is lower than that of the second region.

A method for manufacturing a thin film transistor comprises the steps of forming a first region and a second region; discharging a composition containing a conductive material to a region across the second region and the first region; flowing a part of the composition discharged to the first region into the second region to form an electrode layer; and discharging a conductive material to the second region to be in contact with the electrode layer to form a wiring layer; wherein wettability with respect to the composition of the first region is lower than that of the second region.

A method for forming a pattern comprising the steps of forming selectively a photocatalytic substance to a subject formation region; forming a first region over the subject formation region and the photocatalytic substance; emitting light to the photocatalytic substance to form a second region; discharging a composition containing a conductive material to a region across the second region and the first region; and flowing a part of the composition discharged to the first region into the second region to form an electrode layer; wherein wettability with respect to the composition of the first region is lower than that of the second region.

A method for manufacturing a thin film transistor comprising the steps of forming a first region and a second region; discharging a composition containing a mask formation material to a region across the second region and the first region; flowing a part of the composition containing the mask formation material discharged to the first region into the second region to form a mask; removing a part of the first region by using the mask to form a fourth region and to form a third region by removing the mask; discharging a composition containing a conductive material to a region across the fourth region and the third region; flowing a composition containing the conductive material in the third region into the fourth region to form a first electrode layer and a second electrode layer; and flowing a part of the composition discharged to the first region into the second region; wherein wettability with respect to the composition containing the mask formation material of the first region is lower than that of the second composition, and wettability with respect to the conductive material of the third region is lower than that of the fourth region.

In the foregoing structures, a display device can be manufactured by forming the electrode layer as a gate electrode layer and forming the wring layer as a gate wiring layer. Further, in the foregoing structure, a display device can be manufactured by forming each of the first electrode layer and the second electrode layer as a source electrode layer or a drain electrode layer.

A thin film transistor comprises a wiring layer provided over an insulating surface having a first region and a second region; and an electrode layer being in contact with the wiring layer; wherein the wiring layer is provided to the second region, the electrode layer is provided to the first region, and wettability with respect to the electrode layer and the wiring layer of the first region is lower than that of the second region.

A thin film transistor comprises a wiring layer provided over an insulating surface having a first region and a second region; and an electrode layer being in contact with the wiring layer; wherein the wiring layer is provided to the second region, the electrode layer is provided to the first region, wettability with respect to the electrode layer and the wiring layer of the first region is lower than that of the second region, and the electrode layer has a smaller width and a thinner thickness than those of the wiring layer.

A display device comprises a gate wiring layer provided over an insulating surface having a first region and a second region; and a thin film transistor including a gate electrode layer being in contact with the gate wiring layer; wherein the gate wiring layer is provided to the second region, the gate electrode layer is provided to the first region, and wettability with respect to the gate electrode layer and the gate wiring layer of the first region is lower than that of the second region.

A display device comprises a gate wiring layer provided over an insulating surface having a first region and a second region; and a thin film transistor including a gate electrode layer being in contact with the gate wiring layer; wherein the gate wiring layer is provided to the second region, the gate electrode layer is provided to the first region, wettability with respect to the gate electrode layer and the gate wiring layer of the first region is lower than that of the second region, and the gate electrode layer has a smaller width and a thinner thickness than those of the gate wiring layer.

A television device comprises a display screen formed by a display device having a gate wiring layer provided over an insulating surface having a first region and a second region and a thin film transistor including a gate electrode layer being in contact with the gate wiring layer; wherein the gate wiring layer is provided to the second region, the gate electrode layer is provided to the first region, and wettability with respect to the gate electrode layer and the gate wiring layer of the first region is lower than that of the second region.

A television device comprises a display screen formed by a display device having a gate wiring layer provided over an insulating surface having a first region and a second region and a thin film transistor including a gate electrode layer being in contact with the gate wiring layer; wherein the gate wiring layer is provided to the second region, the gate electrode layer is provided to the first region, wettability with respect to the gate electrode layer and the gate wiring layer of the first region is lower than that of the second region, and the gate electrode layer has a smaller width and a thinner thickness than those of the gate wiring layer.

In the foregoing structure, a first region can be formed by forming a substance including a fluorocarbon chain that is a substance having a fluoride. As the photocatalytic substance, titanium oxide can be used.

According to the present invention, a desired pattern can be formed with well controllability; and loss of material can be reduced, and costs can be reduced. Therefore, a display device having high performance and high reliability can be manufactured with good yields.

BEST MODE FOR CARRYING OUT THE INVENTION

Embodiment 1

Figure 1A:
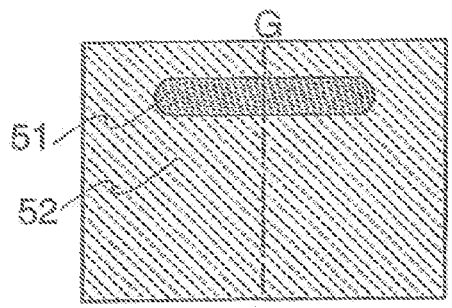
FIGS. 1A to 1H are explanatory views for the present invention.

Although the present invention will be fully described by way of embodiments with reference to the accompanying drawings, it is to be understood that various changes and modifications will be apparent to those skilled in the art. Therefore, unless otherwise such changes and modifications depart from the scope of the present invention hereinafter described, they should be construed as being included therein. Through the drawing of the embodiments, same components are denoted by same numerals, and will not be further explained.

Figure 29A:
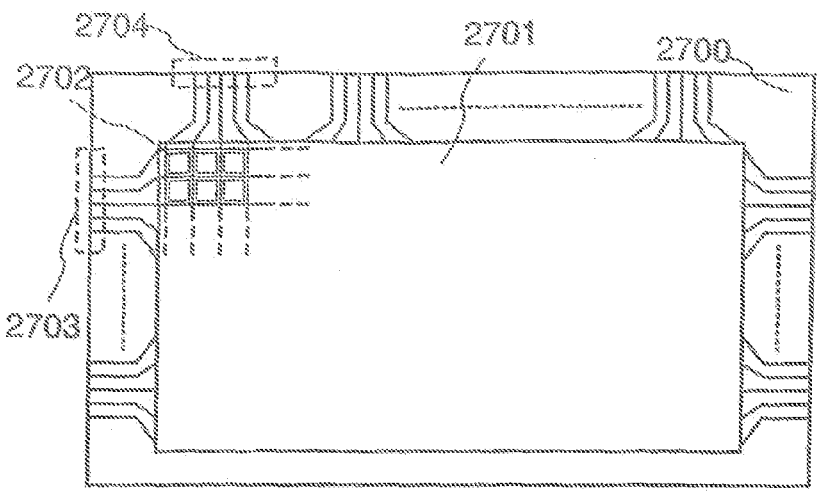
FIGS. 29A to 29C are top views of display devices according to the present invention.

FIG. 29A illustrates a top view for showing an example of a structure of a display panel according to the present invention. A pixel portion 2701 composed of pixels 2702 in a matrix configuration over a substrate 2700 having an insulating surface, a scanning line side input terminal 2703, and a signal line side input terminal 2704 are formed. The number of pixels may be set according to various specifications, for example, 1024×768×3 (RGB) for XGA, 1600×1200×3 (RGB) for UXGA, or 1920×1080×3 (RGB) in case of corresponding to full spec high vision.

The pixels 2702 are arranged in a matrix configuration by crossing scanning lines extended from the scanning line side input terminal 2703 and signal lines extended from the signal line side input terminal 2704. Each of the pixels 2702 is provided with a switching element and a pixel electrode that connects to the switching element. A typical example of the switching element is a thin film transistor (TFT). Each of the pixels can be independently controlled by signals input from the outside by connecting the scanning line to a gate electrode side of the TFT and connecting a source or a drain to the signal lines.

As main components of a TFT, a semiconductor layer, a gate insulating layer, and a gate electrode layer can be used. A wiring layer connected to source and drain regions formed over the semiconductor layer is attached to the foregoing main components. As a structure of the TFT, a top gate structure composed sequentially of a substrate, a semiconductor layer, a gate insulating layer, and a gate electrode layer; or a bottom gate structure composed sequentially of a substrate, a gate electrode layer, a gate insulating layer, and a semiconductor layer are typically known. The present invention can use either of the structures.

As a material for forming the semiconductor layer, amorphous semiconductor (hereinafter, AS) by a vapor deposition method or a sputtering method, each of which uses a semiconductor material gas as typified by silane or germane; polycrystalline semiconductor that is formed by crystallizing the amorphous semiconductor using light energy or thermal energy; or semiamorphous semiconductor that may be referred to microcrystal (hereinafter, SAS) can be used.

The SAS has an intermediate structure between an amorphous structure and a crystalline structure (including a single crystal and a poly crystal). The semiamorphous semiconductor has a stable third state with respect to free energy, and a crystalline region having a short-range order and lattice distortion. At least a part of the semiconductor includes crystal grains with grain diameters of from 0.5 to 20 nm. Raman spectrum originated by LO phonon peal is shifted to a lower wave number than 520 cm$^{-1}$. By X-ray diffraction, diffraction peaks (111), (220) that may be derived from a Si crystalline lattice are observed. Hydrogen or halogen of 1 atomic % or more is contained in the semiamorphous semiconductor as neutralizer for dangling bond. Such semiamorphous semiconductor is referred to as what is called micro crystal semiconductor. A silicide gas is used to be carried out with glow discharge decomposition (plasma CVD). As the silicide gas, $Si_2H_6$, $SiH_2Cl_2$, $SiHCl_3$, $SiCl_4$, $SiF_4$, or the like in addition to $SiH_4$ can be used. The silicide gas can be diluted by $H_2$, or the $H_2$ and one or a plurality of rare gas elements selected from the group consisting of He, Ar, Kr, and Ne. The dilution rate is in the range of from 2 to 1000 times. An applied voltage is in the range of from 0.1 to 133 Pa. A power source frequency is in the range of from 1 to 120 MHz, preferably, 13 to 60 MHz. A heat temperature for a substrate is at most 300° C., preferably, 100 to 250° C. As impurity elements in the film, atmospheric constituents such as oxygen, nitrogen, carbon, and the like have preferably concentrations of $1 \times 10^{20}$ atoms/$cm^3$ or less, especially, oxygen concentration is $5 \times 10^{19}/cm^3$ or less, preferably, $1 \times 10^{19}$ atoms/$cm^3$ or less. By mixing a rare gas element such as helium, argon, krypton, or neon into the SAS to enhance the lattice distortion, stability of the SAS can be increased. Accordingly, favorable SAS can be obtained. A SAS layer formed by a hydrogenation gas can be stacked over a SAS layer formed by a fluoride gas as a semiconductor layer.

Figure 30A:
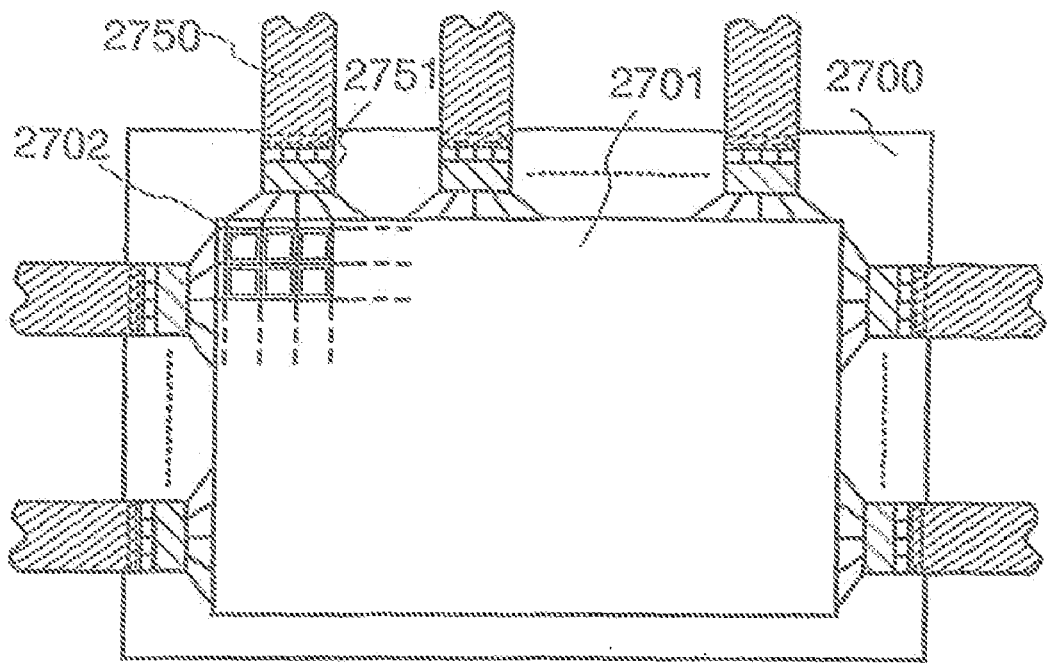
FIGS. 30A and 30B are top views of display devices according to the present invention.
Figure 30B:
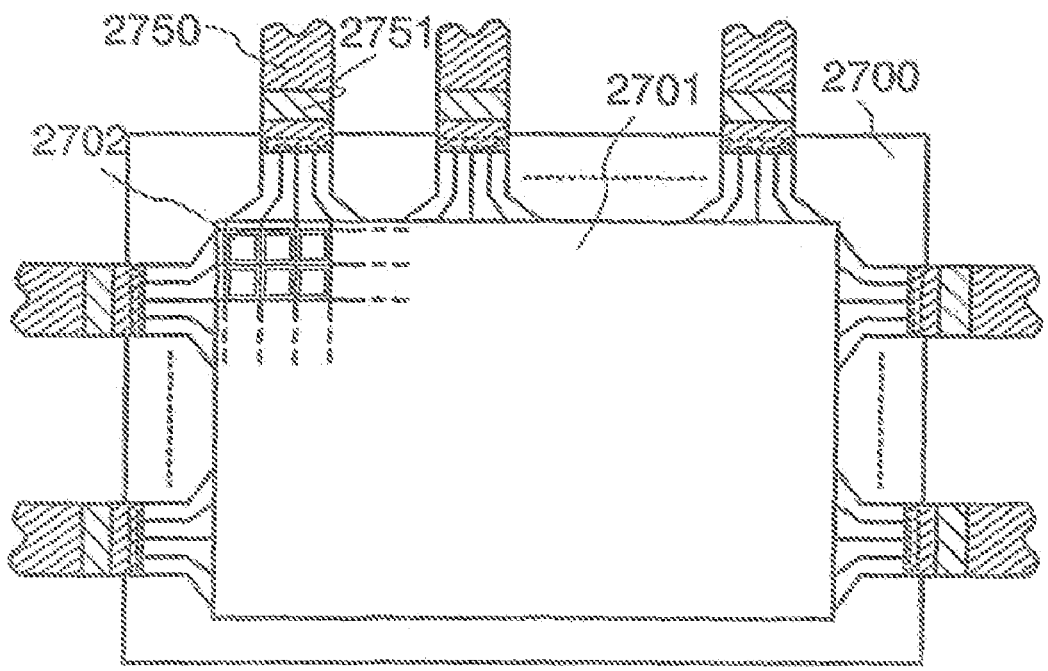

FIG. 29A illustrates a structure of a display panel in which a signal input to a scanning line or a signal line is controlled by an external driver circuit. As illustrated in FIG. 30A, a driver IC 2751 can be mounted over the substrate 2700 by COG (Chip on Glass) technique. As another mounting form, TAB (Tape Automated Bonding) technique as illustrated in FIG. 30B can be used. The driver IC may be formed using a single crystalline semiconductor substrate, or formed by forming a circuit by a TFT over a glass substrate. In FIGS. 30A and 30B, the driver IC 2751 is connected to an FPC (Flexible Printed Circuit) 2750.

Figure 29B:
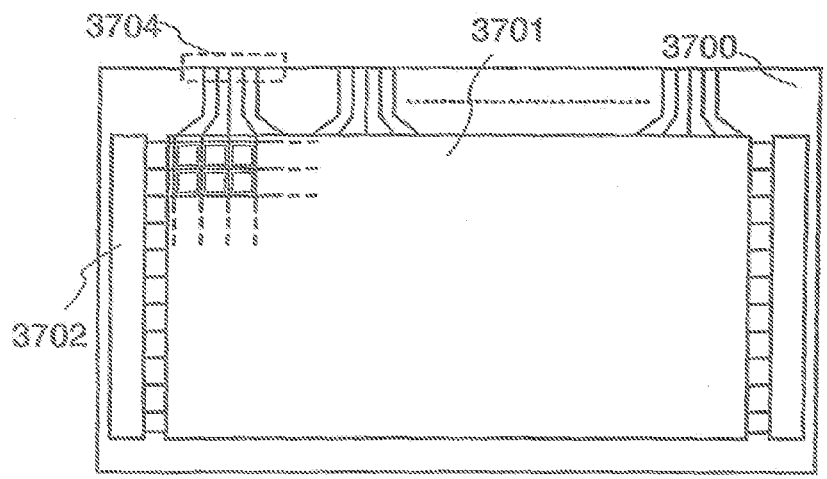
Figure 29C:
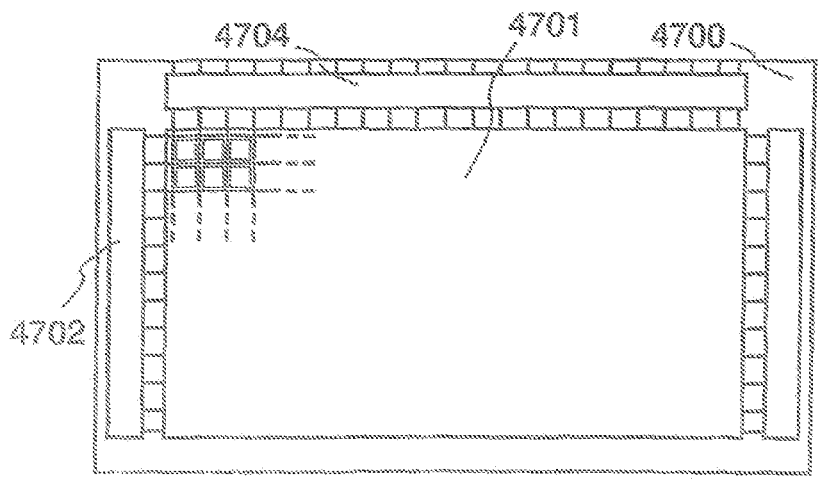

In the case that a TFT provided to a pixel is formed by SAS, a scanning line driver circuit 3702 can be integrally formed over a substrate 3700 as illustrated in FIG. 29B. In FIG. 29B, a pixel portion 3701 is controlled by an external driver circuit connected to a signal line driver circuit 3704 as is the case with FIG. 29A. In the case that the TFT provided to the pixel is formed by a polycrystalline (microcrystalline) semiconductor or a single crystalline semiconductor, each of which has high mobility, a display panel illustrated in FIG. 29C can be formed by a pixel portion 4701, a scanning line driver circuit 4702, and a signal line driver circuit 4704 being integrally formed over a substrate 4700.

An embodiment of the present invention is explained with reference to FIGS. 1A to 1H. FIGS. 1A to 1D are top views of a pattern. FIGS. 1E to 1H are cross-sectional view taken along line G-H of FIGS. 1A to 1D. FIGS. 1A to 1D correspond respectively to FIGS. 1E to 1H.

According to the present invention, among patterns such as a conductive layer for forming a wiring layer or an electrode, or a mask layer for forming a predetermined pattern; a display device is manufactured by forming at least one or more of the patterns by a method by which a pattern can be formed selectively. As the method by which a pattern can be formed selectively, droplet discharging (squirting) (also referred to as ink jetting depending on its method) by which a conductive layer or an insulating layer is formed to form a predetermined pattern by discharging (squirting) selectively a composition prepared for specific purposes is used. Alternatively, a method by which a pattern can be transferred or drawn, for example, printing (method such as screen printing or offset printing by which a pattern is formed) can be used.

According to this embodiment, a method by which a composition including a fluid pattern is selectively discharged (squirted) as droplets is used. Droplets containing a pattern formation material are discharged to a subject formation region to be provided with a pattern, and solidified by baking, drying, and the like. Accordingly, a pattern can be formed. In the present invention, a pattern formation region is pretreated.

Figure 28:
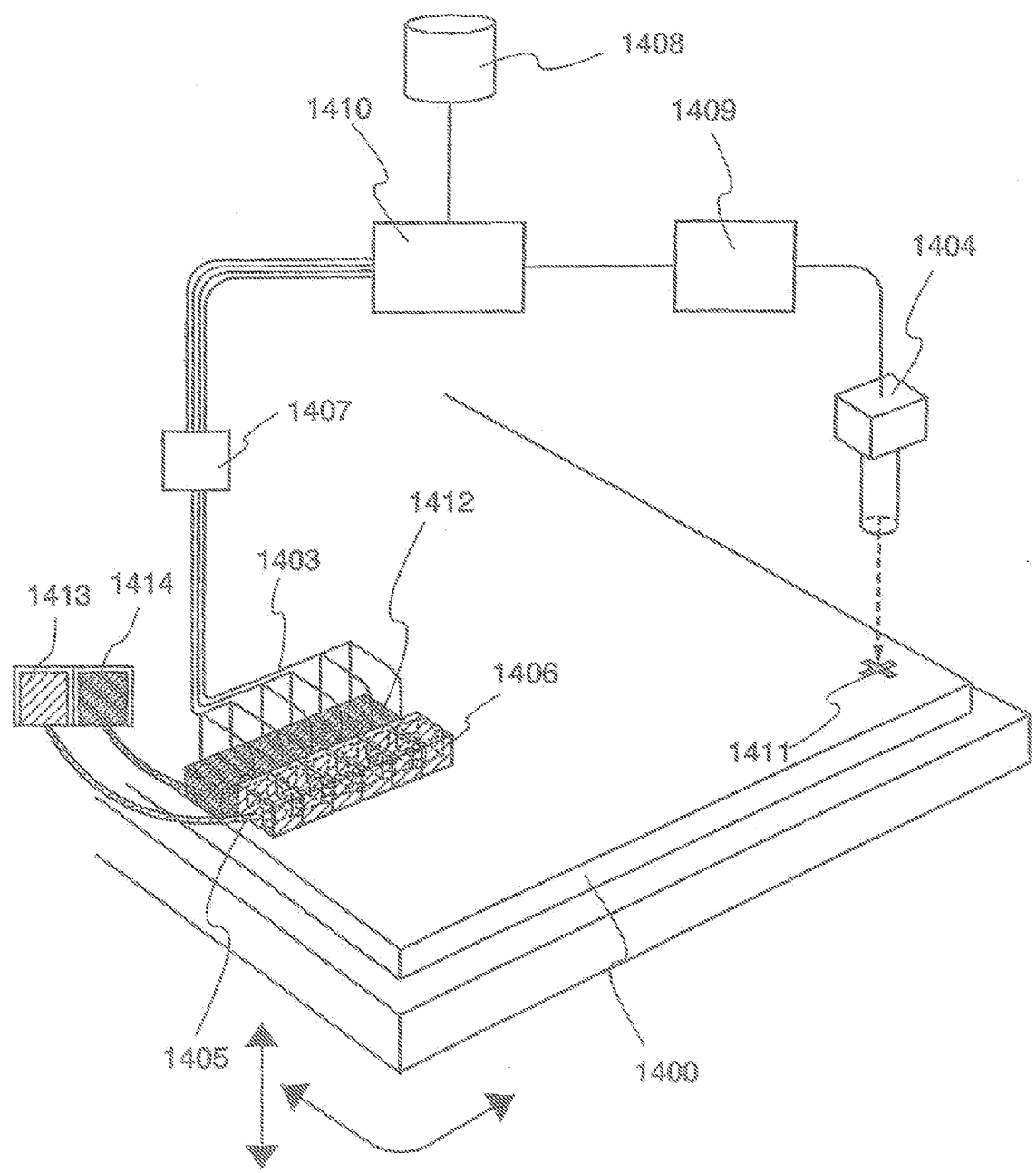
FIG. 28 is an explanatory view for a structure of a droplet discharging device that can be applied to the present invention.

FIG. 28 illustrates one mode of a droplet discharging device that is used for forming a pattern. Each of the heads 1405 and 1412 of the droplet discharging means 1403 is connected to a controlling means 1407. The heads can draw a pattern that is preliminarily programmed by controlling the controlling means by a computer 1410. The timing of the drawing, for example, may be based on the marker 1411 formed over the substrate 1400. Alternatively, the base point may be decided on the basis of the edge of the substrate 1400. The base point is detected by an imaging means 1404 such as a CCD, converted into a digital signal by an image processing means 1409, and recognized by the computer 1410 to generate a control signal. Then, the control signal is sent to a controlling means 1407. Of course, information on a pattern that should be formed over the substrate 1400 is stored in a storing medium 1408. The control signal can be sent to the controlling means 1403 based on the information to control independently each head 1405, 1412 of the droplet discharging means 1403. A material for discharging is supplied to the heads 1405 and 1412 through material supply sources 1413 and 1414.

The interior of the head 1405 has a space for being filled with a liquid material as indicated by dotted line 1406 and a nozzle that is a discharge opening. Although not shown, the head 1412 has the same interior structure as that of the head 1405. By providing nozzles having different sizes to the heads 1405 and 1412, a conductive material and an organic or inorganic material can be respectively discharged and drawn at a time, and different materials to have different widths; or same materials can be discharged simultaneously from a plurality of nozzles and drawn in order to improve throughput in the case of drawing over a wide region such as a interlayer film. In the case of using a large substrate, the heads 1405 and 1412 scan freely over the substrate by moving in the directions of arrows to set freely a drawing region, and draw directly a plurality of same patterns over one substrate.

According to a pattern formation method for forming a conductive layer by droplet discharging, a pattern is formed according to the procedure, that is, a pattern formation material processed into particles is delivered, and the delivered material is fused or fusion bonded by baking to be solidified. Therefore, most patterns formed by sputtering or the like have a column structure, whereas the pattern is in a polycrystalline state having many grain boundaries.

Figure 1B:
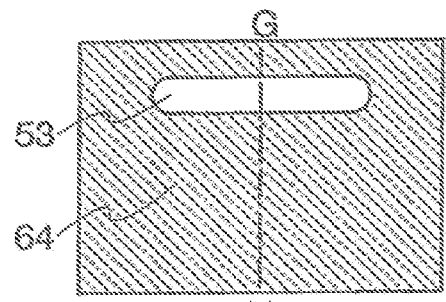
Figure 1C:
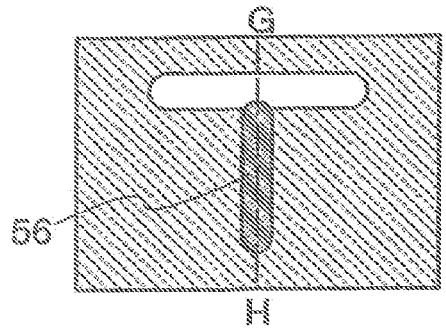

As illustrated in FIG. 1A, as pretreatment, a region having wettability that is different from that of a pattern formation material is formed to the periphery region including a subject formation region for being provided with a pattern over the substrate 50. The difference in wettability is a relative relationship between the subject formation regions. The regions may have a difference in wettability in the degree of being different from that of the pattern formation material within the subject pattern. The region having different wettability has a different contact angle from that of another region. A region having a large contact angle is a region having low wettability (hereinafter, the region may be referred to as a low wettability region), whereas a region having a small contact angle is a region having high wettability (hereinafter, the region may be referred to as a high wettability region). In the case that a contact angle is large, a liquid composition having fluidity does not spread over the surface nor wet the surface. In the case that a contact angle is small, a liquid composition having fluidity spreads over the surface and wet sufficiently the surface. In the present invention, a contact angle of the region having different wettability has preferably a difference of 30° or more, more preferably, 40° or more. According to this embodiment, a mask 51 is formed to form a low wettability substance 52 over another region in the substrate 50 using the mask 51 (FIGS. 1A and 1E). Thereafter, regions having different wettability 53 and 64 are formed by removing the mask 51 (FIGS. 1B and 1F). In this embodiment, a region having low wettability 64 is referred to as a low wettability region 64, whereas a region having high wettability 53 is referred to as a high wettability region 53.

A droplet 55 of a composition containing a pattern formation material is discharged by droplet discharging so as to be crossing a boundary between the high wettability region 53 and the low wettability region 64. Discharging the composition may be started from either of the high wettability region 53 or the low wettability region 64. The composition containing a pattern formation material is discharged from a nozzle 54 as the droplet 55 to form a pattern 56 (FIGS. 1C and 1G).

Immediately after discharging the composition, the pattern formation material formed in the pattern 56 does not settle in the low wettability region 64 due to the difference in wettability of the subject formation region, and flows partly from the boundary between the high wettability region 53 and the low wettability region 64 to the high wettability region 53. This arises from the fact that the composition containing a pattern formation material cannot sufficiently get wet in the low wettability region 64 that has low wettability with respect to the composition containing a pattern formation material, and so the composition is difficult to be solidified and flows to the high wettability region 53 that has higher stability than that of the low wettability region 53. As a result, due to fluidity and the difference in wettability with respect to the subject formation region, the composition containing pattern formation material that is formed into the form of the pattern 56 immediately after discharging is changed its form into a pattern 57 to be stabilized. The pattern 57 formed over the low wettability region 64 is formed to be fine since a part of the composition flows to the high wettability region 53. Therefore, a pattern that is finer than the pattern formed by droplet discharging can be freely formed.

On the contrary, in the case that a composition containing pattern formation material is discharged to only a high wettability region, a droplet is repelled by a low wettability region that surrounds the high wettability region, accordingly, the composition discharged to the high wettability regions serves as a bank at a boundary between the high wettability region and the low wettability region. Therefore, a pattern can be increased its width and thickness since a composition containing a pattern formation material having fluidity can settle in the high wettability region.

According to the present invention, a fine pattern can be formed in order to form a fine pattern such as an electrode layer by moving a discharged extra droplet into an adjacent high wettability region even if a large nozzle is used. The pattern that is flown in the high wettability region may be removed by etching. Alternatively, another pattern material may be discharged over the pattern in the high wettability region and drawn to form into a part of a wiring layer or the like having a wide width pattern. In this case, discharging a droplet to only the high wettability region surrounded by the low wettability region leads to increase a width and a thickness of a pattern formed by the composition discharged over the high wettability region. According to the present invention, a fine wiring or electrode can be formed with well controllability; and reliability can be improved, loss of material can be prevented, manufacturing yields can be improved, and costs can be reduced.

In this embodiment, a low wettability substance that is formed as pretreatment having an ultra thin thickness is not required to be formed in a film depending on a formation condition. The method for forming a low wettability region (region having comparative low wettability) and a high wettability region (region having comparative high wettability) is not limited to this embodiment. Any method can be used. Though a low wettability substance is formed in this embodiment; on the contrary, a substance that enhances wettability may be formed. All one have to do is forming a region having different levels of wettability by using any method.

Treatment for selectively enhancing wettability or lessening wettability may be carried out by forming a substance at the periphery of a subject formation region. As the treatment, heat treatment, light irradiation treatment, and the like can be used. For example, ultraviolet light that can decompose a substance that lessens wettability is emitted; the substance that lessens wettability at an irradiated region is recomposed and removed; and an effect of lessening wettability is diminished, then, a high wettability region is formed. In this instance, a wavelength of light may be appropriately selected depending on the substance that lessens wettability. Light having high energy at 300 nm or less is preferably used. A substance that has an effect of improving adhesiveness may be formed over the periphery of a subject formation region as a base film. In this instance, a region having different wettability may be formed over the base film.

Alternatively, a substance is formed selectively over a region to which a high wettability region is formed later, and a substance having an effect of lessening wettability is formed over the foregoing substance. Thereafter, the substance formed over the region to be a high wettability region is activated by heat treatment or light irradiation treatment to enhance wettability, and a high wettability region can be formed. As a substance for forming the high wettability region, a substance having a light catalytic function (hereinafter, light catalytic substance) can be used. A low wettability substance is formed over the light catalytic substance to form a low wettability region, and the low wettability region is irradiated with light. The selectively formed light catalytic substance is activated by light irradiation since it has a light catalytic function. Further, the low wettability substance is decomposed and removed, and a high wettability region can be formed at the region where the low wettability substance is formed.

Titanium oxide ($TiO_x$), strontium titanate ($SrTiO_3$), cadmium selenide (CdSe), potassium tantalate ($KTaO_3$), cadmium sulfide (CdS), zirconium oxide ($ZrO_2$), niobium oxide ($Nb_2O_5$), zinc oxide (ZnO), iron oxide ($Fe_3O_3$), tungsten oxide ($WO_3$), or the like is preferably used as the photocatalytic substance. The photocatalytic substance may be irradiated with light at an ultraviolet light region (wavelength of 400 nm or less, preferably, 380 nm or less) to be photocatalytically activated. The photocatalytic substance can be formed by dip coating of sol-gel, spin coating, droplet discharging, ion plating, ion beam, chemical vapor deposition (CVD), sputtering, RF magnetron sputtering, plasma spraying, or anodic oxidation. In addition, the substance does not need to have continuity as a film, depending on its formation method. In the case that the photocatalytic substance is made of an oxide semiconductor including a plurality of metals, the photocatalytic substance can be formed by mixing and melting a salt of a constituent element. The photocatalytic substance may be baked or dried when it is necessary to remove solvent in the case of forming the photocatalytic substance by a coating method such as dip coating or spin coating. Specifically, it may be heated at a predetermined temperature (for example, 300° C. or more), preferably, in an atmosphere including oxygen.

According to the heat treatment, the photocatalytic substance can have a predetermined crystal structure. For example, it has an anatase type or a rutile-anatase mixed type crystal structure. The anatase type is preferentially formed in a low temperature phase. Therefore, the photocatalytic substance may also be heated even if it does not have a predetermined crystal structure. In addition, the photocatalytic substance can be formed at plural numbers of times to obtain a predetermined film thickness in the case of being formed by a coating method.

As a material for forming the mask 51, a resin material such as epoxy resin, acrylic resin, phenol resin, novolac resin, melamine resin, or urethane resin is used. Further, the mask 51 can be formed by droplet discharging using an organic material such as benzocyclobutene, parylene, flare, or polyimide having permeability; a compound material formed by polymerization of siloxane-based polymer or the like; a composition material containing water-soluble homopolymer and water-soluble copolymer; or the like. Alternatively, a commercial resist material including a photosensitizer, for example, a typical positive type resist such as a novolac resin, a naphthoquinonediazide compound that is a photosensitizer, base resin that is negative type resist, diphenylsilanediol, or an acid generating agent may be used. In any case of using any material, surface tension and viscosity are appropriately adjusted by adjusting concentration of solvent or adding a surface-active agent or the like.

Treatment for enhancing wettability means to make the function of fixing a droplet at a discharged place (also referred to adherence or fixing strength) be weaker than that of the periphery region. Further, the treatment also means to modify a region and to enhance adhesiveness between the region and the droplet by heat treatment or light (laser light or the like) irradiation. Only the surface of a region that is in contact with a droplet to fix it thereto may have the wettability. It is not always required that a whole region in a direction of the thickness includes the same level of the wettability.

The substance that enhances or lessens wettability formed as pretreatment may be left after forming the pattern, or unnecessary portion may be removed after forming the pattern. The unnecessary portion may be removed by using the pattern as a mask, ashing with oxygen, etching, or the like.

As an example of a composition of solution for forming the low wettability region, a silane-coupling agent, which is represented by a chemical formula: $R_n$—Si—$X_{(4-n)}$ (n=1, 2, 3), is used. In the foregoing formula, R includes a group that is comparatively inactive, for example, an alkyl group or the like; and X includes a hydrolytic group capable of coupling by means of shrinking with a hydroxyl group such as a methoxy group, an ethoxy group, or an acetoxy group over the surface of a substrate or adsorption water.

Wettability can be further enhanced by using fluorite silane coupling agent (fluoroalkylsilane (FAS)) having a fluoroalkyl group as R, which is a typical example of the silane-coupling agent. The fluoroalkyl group R of FAS has a structure of $(CF_3)(CF_2)_x(C_2)_y$, wherein x is 0 or more and 10 or less and y is 0 or more and 4 or less. When a plurality of R or X is coupled with Si; all of the R or X may be the same or different. As a typical example of the FAS, fluoroalkylsilane such as heptadefluorotetrahydrodecyltriethoxysilane, heptadecafluorotetrahydrodecyltrichlorosilane, tridecafluorotetrahydrooctyltrichlorosilane, and trifluoropropyltrimethoxysilane can be used.

As solvent of solution for forming the low wettability region, hydrocarbon-based solvent such as n-pentane, n-hexane, n-heptane, n-octane, n-decane, dicyclopentane, benzene, toluene, xylene, durene, indene, tetrahydronaphthalene, decahydronaphthalene, and squalene; or tetrahydrofuran can be used.

As an example of a composition of solution for forming the low wettability region, a substance having a fluorocarbon chain (fluorinated resin) can be used. As the fluorinated resin, polytetrafluoroethylene (PTFE; 4-fluorinated ethylene resin), perfluoroalkoxy alkane (PFA; 4-fluorinated ethylene perfluoroalkylvinylether copolymer resin), perfluoroethylenepropene copolymer (PFEP; 4-fluorinated ethylene 6-fluorinated propylene copolymer resin), ethylene-tetrafluoroethylene copolymer (ETFE; 4-fluorinated ethylene-ethylene copolymer resin), polyvinylidene fluoride (PVDF; fluorinated vinylidene resin), polychlorotrifluoroethylene (PCTFE; 3-fluorinated ethylene chloride resin), ethylene-chlorotrifluoroethylene copolymer (ECTFE; 3-fluorinated ethylene chloride-ethylene copolymer resin), polytetrafluoroethyleneperfluorodioxole copolymer (TFE/PDD), polyvinyl fluoride (PVF; fluorinated vinyl resin), or the like can be used.

A low wettability region may be formed by using an organic material that does not form a low wettability region (that is, the organic material forms a high wettability region) and performing treatment by $CF_4$ plasma. For example, a material formed by mixing water-soluble resin such as polyvinyl alcohol (PVA) into solvent such as $H_2O$ can be used. Alternatively, the PVA may be used with another water-soluble resin in combination. An organic material (a material, which has a skeleton formed by the bond of silicon (Si) and oxygen (O), which includes at least hydrogen, and which may include one selected from the group consisting of fluoride, alkyl group, and aromatic hydrocarbon as a substituent) can be used. Even if a material having low wettability is used, the wettability can be further lessened by plasma treatment or the like.

In order to improve adhesiveness between the pattern and the subject formation region, a base film may be formed. For example, a titanium oxide film may be formed over a substrate as a conductive film in order to improve adhesiveness in the case that a conductive material containing silver is coated over a substrate to form a silver wiring. Since the adhesiveness between the titanium oxide film and the conductive material containing silver is well, the reliability can be improved.

According to the present invention, a desired pattern can be formed with well controllability, and so loss of material can be prevented and costs can be reduced. Therefore, a display device with high performance and high reliability can be manufactured with good yields.

Embodiment 2

An embodiment of the present invention is explained with reference to FIGS. 2A to 2H. FIGS. 2A to 2D are top views of a pattern. FIGS. 2E to 2H are cross-sectional views taken along line I-J of FIGS. 2A to 2D. FIG. 2A to 2D correspond respectively to FIGS. 2E to 2H.

In this embodiment, another example of forming a pattern according to the present invention is explained. In Embodiment 1, an example of forming a pattern into a fine line is explained. In this embodiment, an example of forming finely spaced apart patterns with good controllability is explained.

Figure 1D:
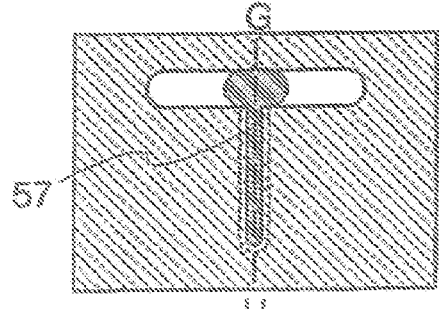
Figure 1E:
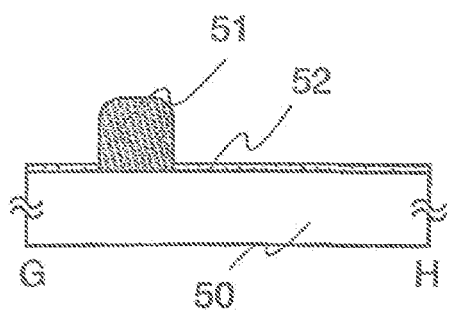
Figure 1F:
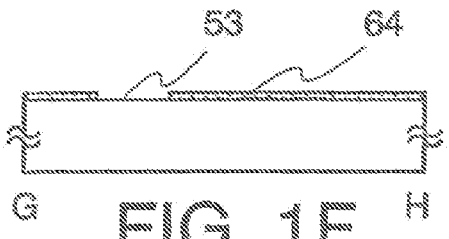
Figure 1G:
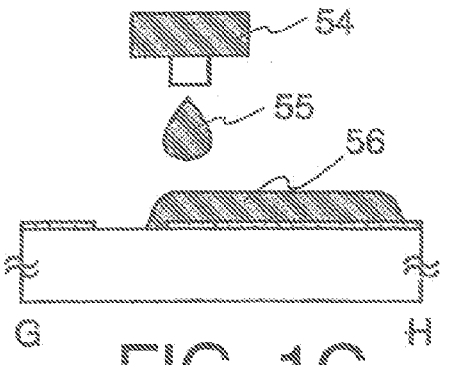
Figure 1H:
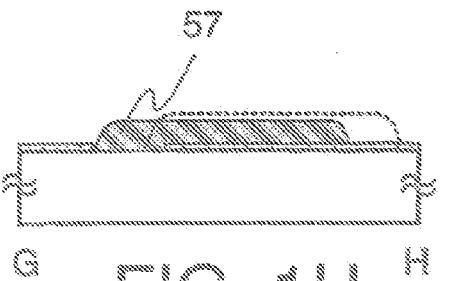
Figure 2A:
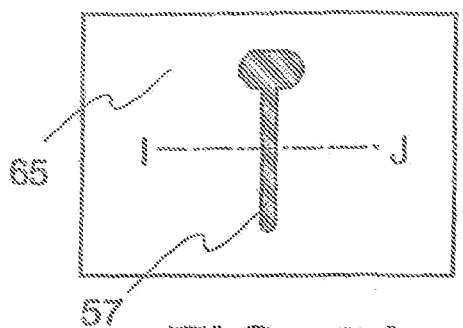
FIGS. 2A to 2H are explanatory views for, the present invention.
Figure 2E:
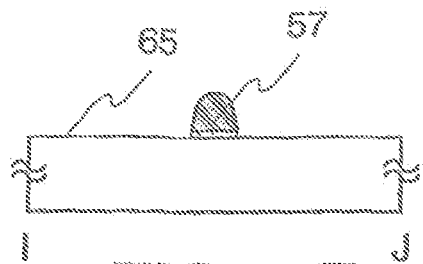

FIG. 2A illustrates the state that a low wettability substance 52 that has an effect of imparting low wettability is removed from the state illustrated in FIG. 1D using a pattern 57 as a mask. As illustrated in FIG. 2E, only the low wettability substance 52 is left below the pattern 57 and the periphery thereof is a high wettability region 65. The high wettability region has high wettability since it has not the low wettability substance 52. Then, only the pattern 57 is removed by an etching method having a high selective ratio to the low wettability substance 52. As the etching method, either a dry etching method or a wet etching method may be used. Alternatively, ashing or the like can be used as the etching method. In this instance, an etching gas or etchant, each of which has a high selective ratio to the low wettability substance and a pattern formation material is preferably used.

Figure 2B:
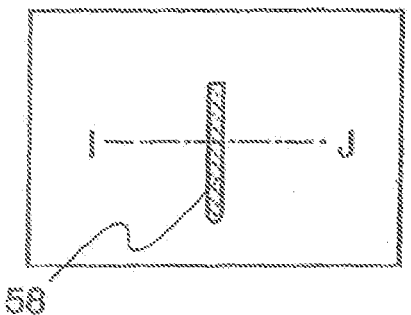
Figure 2F:
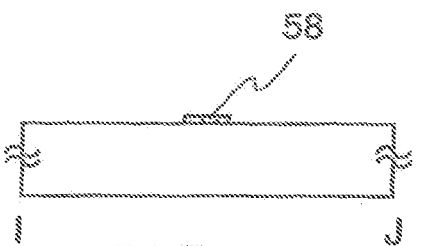
Figure 2C:
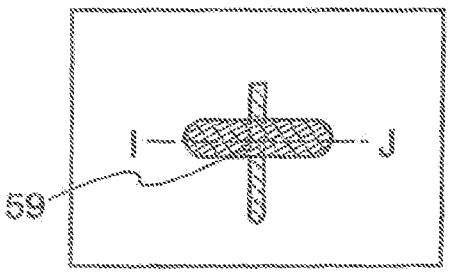
Figure 2G:
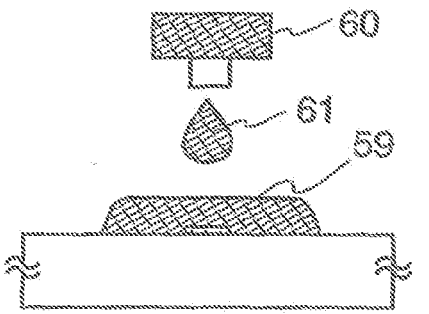
Figure 2D:
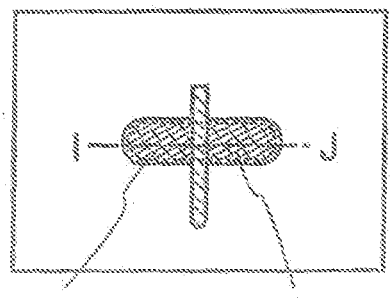
Figure 2H:
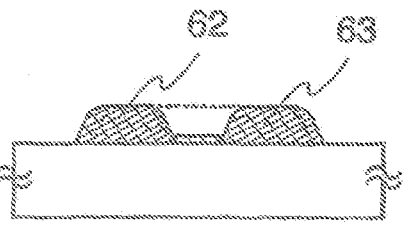
Figure 3:
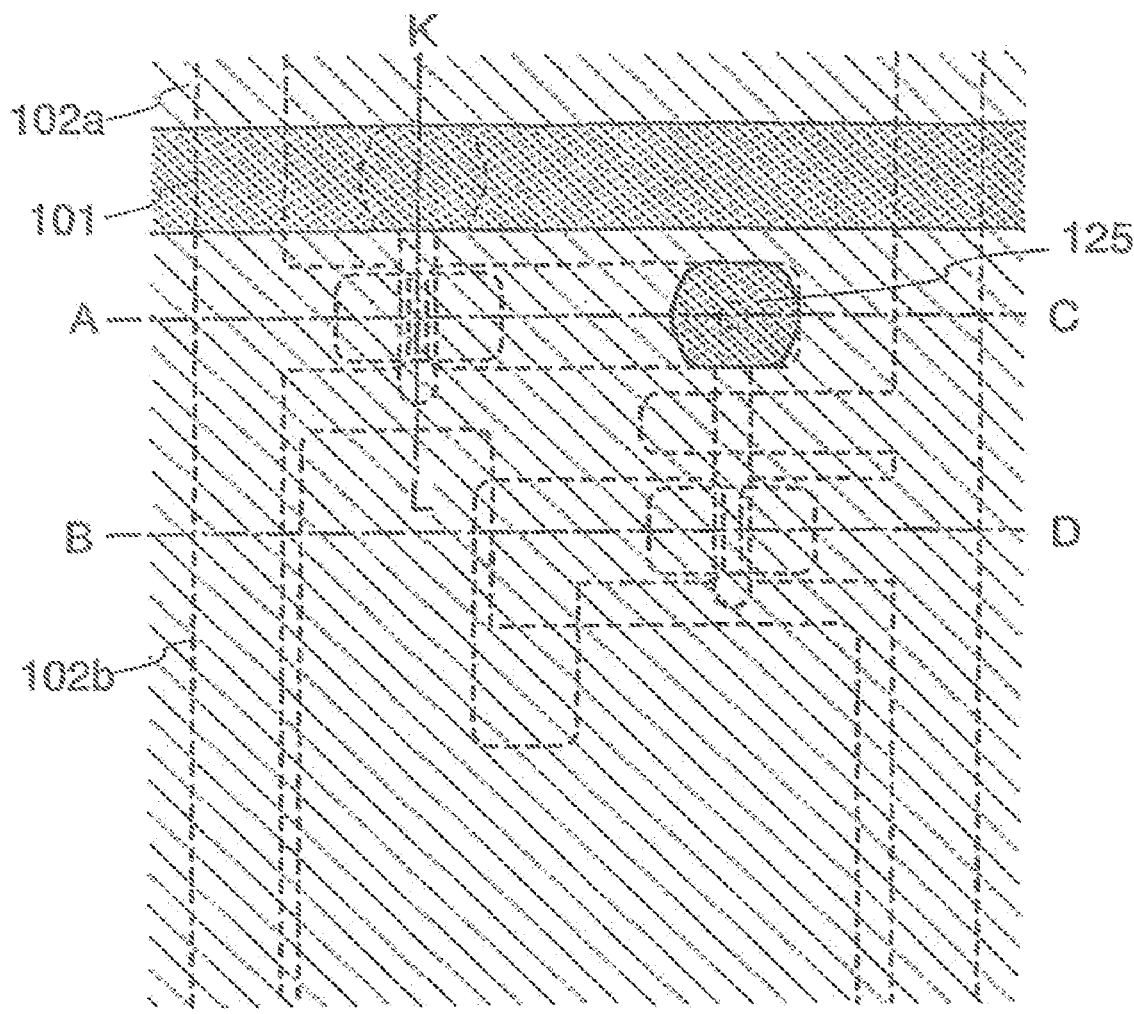
FIG. 3 is an explanatory view for a method for manufacturing a display device according to the present invention.
Figure 4:
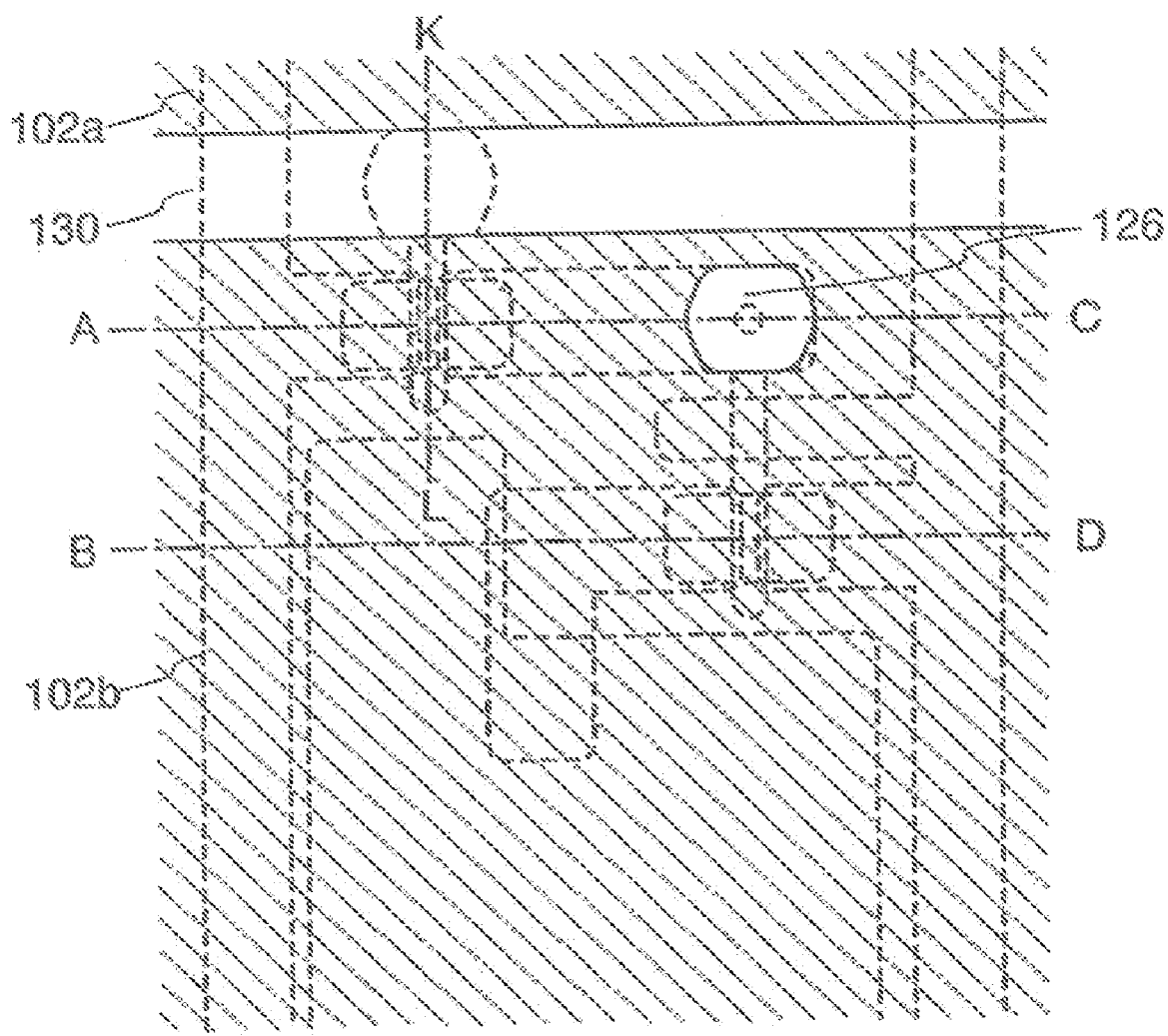
FIG. 4 is an explanatory view for a method for manufacturing a display device according to the present Invention.
Figure 5:
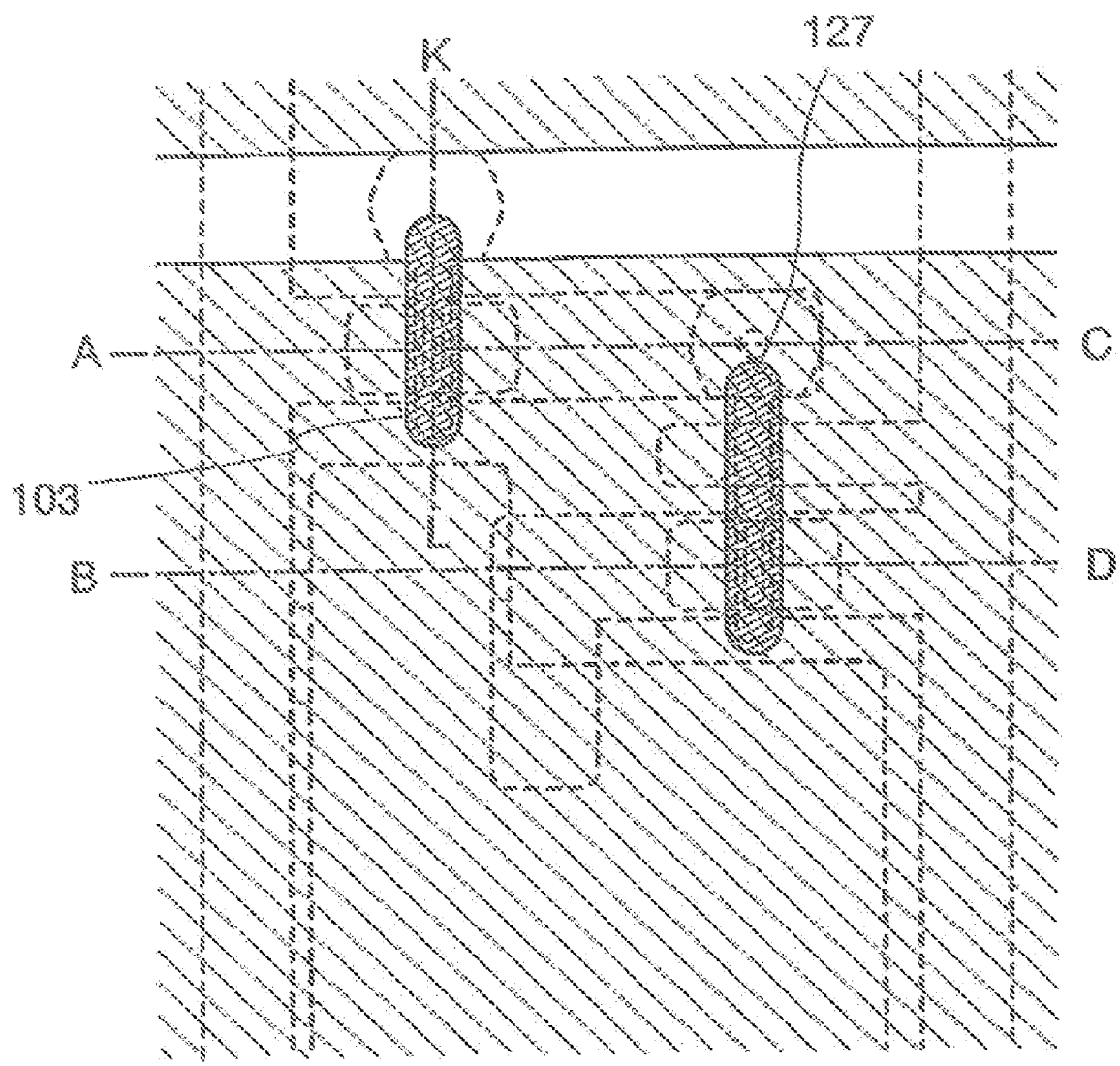
FIG. 5 is an explanatory view for a method for manufacturing a display device according to the present invention.
Figure 6:
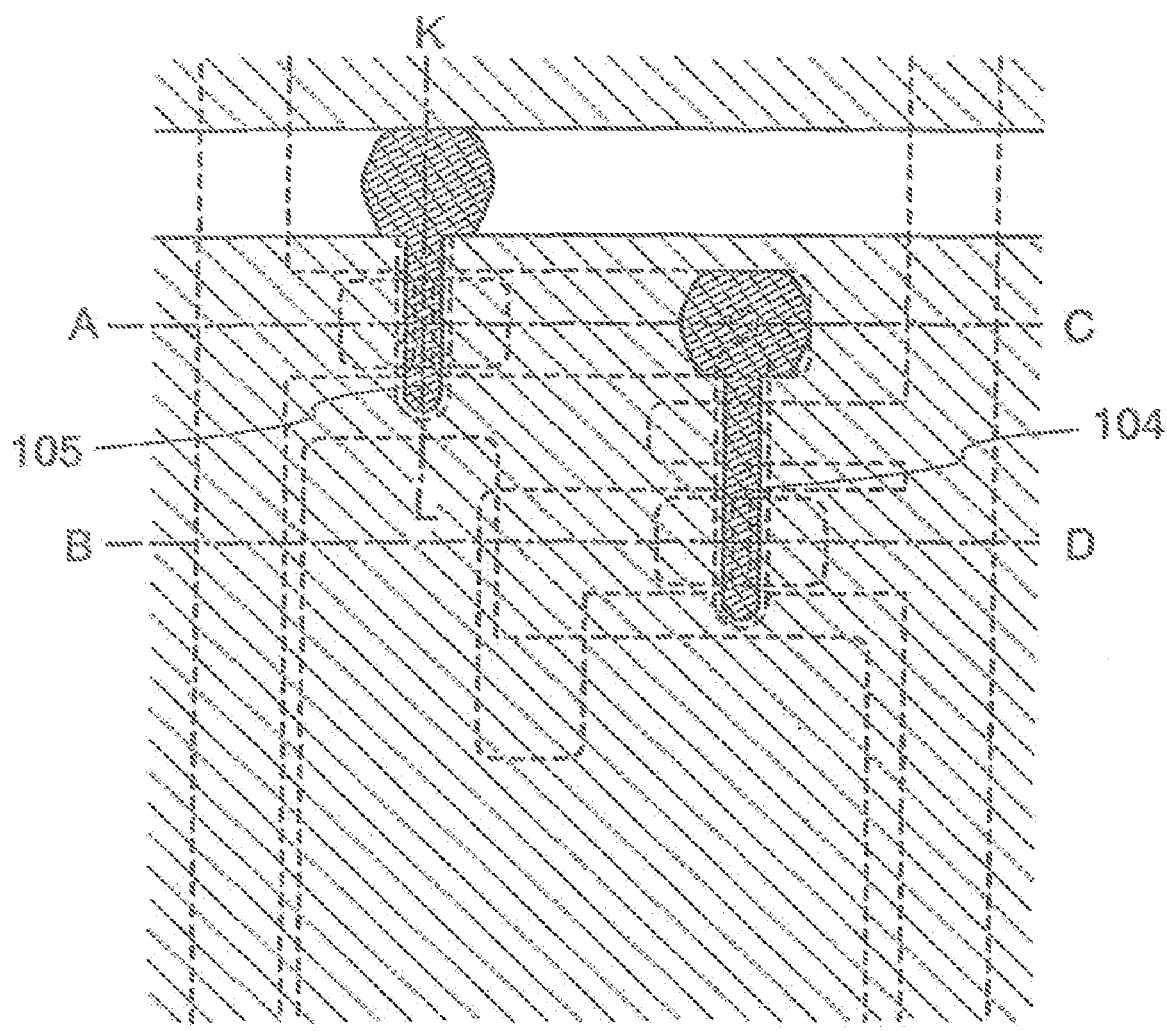
FIG. 6 is an explanatory view for a method for manufacturing a display device according to the present invention.

When the pattern 57 is removed, the left low wettability substance 52 exists at the top surface of a substrate as a low wettability region 58. A contact angle of a composition containing a material for a pattern to be formed on the high wettability region 65 is smaller than that of the low wettability region 58. The difference in the contact angles is preferably 40° or more. The low wettability region 58 has a form of a fine line since it is formed by using the pattern 57 that is formed into a fine line as a mask (FIGS. 2B and 2F). A composition containing a pattern formation material is discharged as a droplet 61 having fluidity discharged from a nozzle so as to cross the low wettability region 58 and to straddle the peripheral high wettability region 65. Accordingly, a pattern 59 is formed. In this embodiment, the composition containing a pattern formation material has low wettability with respect to the low wettability 65 and has a small contact angle as is the case with Embodiment 1.

Immediately after discharging the composition, the pattern formation material formed into the form of the pattern 59 does not settle over the low wettability region 58 due to the difference in wettability of the subject formation region, and flows from the boundary between the high wettability region 65 and the low wettability region 58 to the high wettability region 65. This arises from the fact that the composition containing a pattern formation material cannot sufficiently get wet in the low wettability region 58 that has low wettability with respect to the composition containing a pattern formation material, and so the composition is difficult to be solidified and flows to the high wettability region 65 that has higher stability than that of the low wettability region 58. As a result, due to the difference in fluidity and wettability with respect to the subject formation region, the composition containing a pattern formation material that is formed into the form of the pattern 59 immediately after discharging is changed its form into a pattern 62 and a pattern 63 to be stabilized. Therefore, the pattern 62 and the pattern 63 can be formed finely spaced apart with good controllability. In the case that the pattern 62 and the pattern 63 are electrode layers, deteriorations such as short-circuiting can be prevented. According to the present invention, wirings and the like designed to be closely-spaced and complicated by reducing in a size and a thickness can be formed with good controllability, and so a high definition display device having high reliability can be manufactured with high yields.

Embodiment 3

This embodiment is explained with reference to FIGS. 38A to 38D. FIGS. 38A to 38D illustrates a top view of a pattern.

This embodiment shows an example of forming a pattern formed to be a fine line in Embodiment 1 is formed further longer to form a fine and long pattern.

Figure 38A:
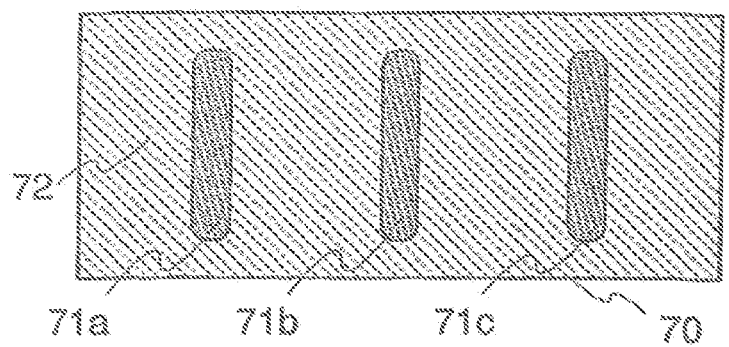
FIGS. 38A to 38D are explanatory views for the present invention.
Figure 38B:
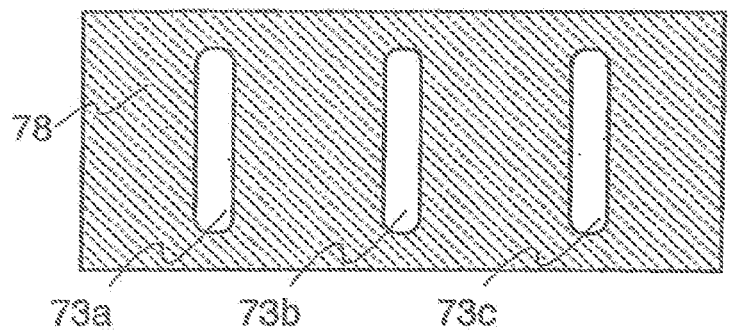

A plurality of masks 71a, 71b, and 71c are provided spaced apart over a substrate 70. Thereafter, a low wettability substance 72 is formed by using the masks 71a, 71b, and 71c (FIG. 38A). Then, the masks 71a, 71b, and 71c are removed by etching. A low wettability region 78, and high wettability regions 73a, 73b, and 73c are selectively formed over the substrate 70 (FIG. 38B).

Figure 38C:
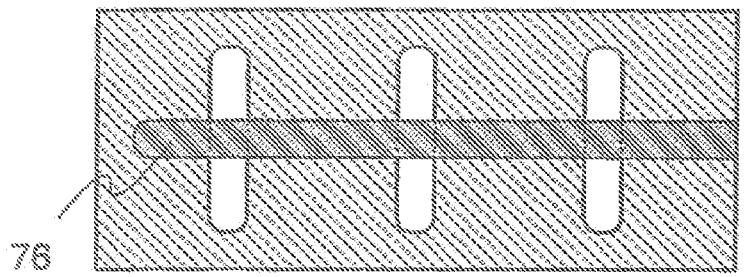
Figure 38D:
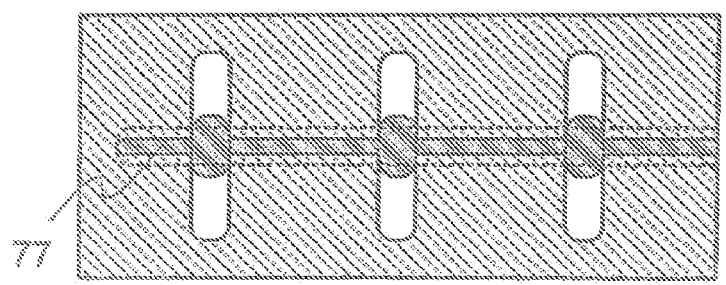

A droplet of a composition containing a pattern formation material having fluidity is discharged so as to be crossed the high wettability regions 73a, 73b, and 73c and to be straddled the low wettability region by droplet discharging. The composition containing a pattern formation material is discharged from a nozzle as a droplet to form a pattern 76 (FIG. 38C).

Immediately after discharging the composition, the pattern formation material formed in the pattern 76 does not settle in the low wettability region 78 due to the difference in wettability of the subject formation region, and flows partly from the boundary between the low wettability region 78, and the high wettability regions 73a to 73c to the respective adjacent high wettability regions 73a, 73b, and 73c. This arises from the fact that the composition containing a pattern formation material cannot sufficiently get wet in the low wettability region 78 that has low wettability with respect to the composition containing a pattern formation material, and so the composition is difficult to be solidified and flows to the high wettability regions 73a, 73b, and 73c that have higher stability than that of the low wettability region 78. As a result, due to the difference in fluidity and wettability with respect to the subject formation region, the composition containing a pattern formation material that is formed into the form of the pattern 76 immediately after discharging is changed its form into a pattern 77 to be stabilized. The pattern 77 formed over the low wettability region 78 is formed to be finer than the pattern 76 since a part of the pattern 77 flows to the high wettability regions 73a, 73b, and 73c. An amount of the composition that flows to the high wettability regions can be controlled by areas of the high wettability regions, a level of wettability of the high wettability regions, a difference in a contact angle, or viscosity or an amount of the discharged composition containing a pattern formation material. In the case of using a conductive material as the pattern material, a long and fine wiring can be formed with good controllability. By forming the high wettability region at a region that does not correspond to an opening portion such as a cross section of bus lines using wide width wirings, a display device can be manufactured without reducing an opening ratio of a pixel.

According to the present invention, it becomes possible to form a pattern to be fine and thin, and to determine freely the length of the pattern. Accordingly, design freedom of a pattern form can be improved. Wirings designed to be closely-spaced and complicated by reducing in a size and a thickness can be formed with good controllability, and so a high definition display device having high reliability can be manufactured with high yields.

Embodiment 4

An embodiment of the present invention is explained with reference to FIGS. 3 to 18C. Specifically, a method for manufacturing a display device according to the present invention is explained. First, a method for manufacturing a display device having a channel etch type thin film transistor is explained. FIGS. 3 to 10 are top views of a pixel portion of a display device. FIGS. 11A to 18C are cross-sectional views taken along line K-L, A-C, and B-D of FIGS. 3 to 10, respectively.

As a substrate 100, a glass substrate made of barium borosilicate glass alumino-borosilicate glass, a quartz substrate, a silicon substrate, a metal substrate, a stainless substrate, or a plastic substrate that offers resistance to process temperature of this manufacturing process is used. The surface of the substrate 100 may be polished by a CMP method so as to be planarized. An insulating layer may be formed over the substrate 100. The insulating layer is a single layer or a laminated layer by using an oxide material containing silicon or a nitride material containing silicon by a known method such as CVD, plasma CVD, sputtering, or spin coating. The insulating layer is not always required to be formed, but the insulating layer has an effect of shielding a contamination substance from the substrate 100. In the case that a base layer is formed in order to prevent contamination due to the glass substrate, a plurality regions having different levels of wettability (high wettability region and low wettability region) are formed on the base layer.

In this embodiment, in order to make difference in wettability to form each of the high wettability region and the low wettability region, the high wettability region is covered by a mask and a low wettability substance is formed to a region that is not covered by the mask to reduce wettability of the region. Further, the difference in wettability can be confirmed by a contact angle. The difference of the contact angles is preferably 40° or more. However, the present invention is not limited thereto, various methods as explained in Embodiment 1 can be used. According to this embodiment, a mask 101 and a mask 125 are formed in a region that is provided with a gate wiring layer afterward.

The masks 101 and 125 can be formed by dip coating of sol-gel, spin coating, droplet discharging, ion plating, ion beam, chemical vapor deposition (CVD), sputtering, RF magnetron sputtering, or plasma spraying. The masks 101 and 125 may be baked or dried when it is necessary to remove solvent in the case of forming the mask by a coating method such as dip coating or spin coating methods. In the case of using a method of forming a pattern directly to a subject formation region such as droplet discharging, a patterning process is not always required, and so a manufacturing process can be simplified.

As a material for forming the masks 101 and 125, a resin material such as epoxy resin, acrylic resin, phenol resin, novolac resin, melamine resin, or urethane resin is used. In addition, the mask can be formed by droplet discharging using an organic material such as benzocyclobutene, parylene, flare, or polyimide having permeability; a compound material formed by polymerization of siloxane-based polymer or the like; a composition material containing water-soluble homopolymer and water-soluble copolymer; or the like. Alternatively, a commercial resist material including a photosensitizer, for example, a typical positive type resist such as a novolac resin, a naphthoquinonediazide compound that is a photosensitizer, base resin that is negative type resist, diphenylsilanediol, an acid generating agent, or the like may be used. In any case of using the material, surface tension and viscosity are appropriately adjusted by adjusting concentration of solvent or adding a surface-active agent or the like.

In this embodiment, the masks 101 and 125 are made from polyimide by droplet discharging. The masks 101 and 125 are required to be masks to prevent a low wettability substance from being formed. The masks 101 and 125 are removed eventually, and so a thickness or a shape may be appropriately designed. A low wettability substance is formed by using the masks 101 and 125 to form low wettability regions 102a and 102b (FIGS. 3 and 11A to 11C).

As an example of a composition of solution for forming the low wettability region, a silane-coupling agent, which is represented by a chemical formula: $R_n$—Si—$X_{(4-n)}$ (n=1, 2, 3), is used. In the foregoing formula, R includes a group that is comparatively inactive, for example, an alkyl group; and X includes a hydrolytic group capable of coupling by means of shrinking with a hydroxyl group such as a methoxy group, a ethoxy group, or an acetoxy group over the surface of a substrate or adsorption water.

Wettability can be further enhanced by using fluorite silane coupling agent (fluoroalkylsilane (FAS)) having a fluoroalkyl group as R, which is a typical example of the silane-coupling agent. The fluoroalkyl group R of FAS has a structure of $(CF_3)(CF_2)_x(CH_2)_y$, wherein x is 0 or more and 10 or less and y is 0 or more and 4 or less. When a plurality of R or X is coupled with Si, all of the R or X may be the same or different. As a typical example of the FAS, fluoroalkylsilane (hereinafter, FAS) such as heptadefluorotetrahydrodecyl-triethoxysilane; heptadecafluorotetrahydrodecyltrichlorosilane, tridecafluorotetrahydrooctyltrichlorosilane, and trifluoropropyltrimethoxysilane can be used.

As solvent of solution for forming the low wettability region, hydrocarbon-based solvent such as n-pentane, n-hexane, n-heptane, n-octane, n-decane, dicyclopentane, benzene, toluene, xylene, durene, indene, tetrahydronaphthalene, decahydronaphthalene, and squalene; or tetrahydrofuran can be used.

As an example of a composition of solution for forming the low wettability region, a substance having a fluorocarbon chain (fluorinated resin) can be used. As the fluorinated resin, polytetrafluoroethylene (PTFE; 4-fluorinated ethylene resin), perfluoroalkoxy alkane (PFA; 4-fluorinated ethylene perfluoroalkylvinylether copolymer resin), perfluoroethylenepropene copolymer (PFEP; 4-fluorinated ethylene 6-fluorinated propylene copolymer resin) ethylene-tetrafluoroethylene copolymer (ETFE; 4-fluorinated ethylene-ethylene copolymer resin), polyvinylidene fluoride (PVDF; fluorinated vinylidene resin), polychlorotrifluoroethylene (PCTFE; 3-fluorinated ethylene chloride resin), ethylene-chlorotrifluoroethylene copolymer (ECTFE; 3-fluorinated ethylene chloride-ethylene copolymer resin), polytetrafluoroethylene-perfluorodioxole copolymer (TFE/PDD), polyvinyl fluoride (PVF; fluorinated vinyl resin), or the like can be used.

A low wettability region may be formed by using an organic material that does not form a low wettability region (that is, the organic material forming a high wettability region) and performing treatment by $CF_4$ plasma and so on. For example, a material formed by mixing water-soluble resin such as polyvinyl alcohol (PVA) into solvent such as $H_2O$ can be used. Alternatively, the PVA may be used with another water-soluble resin in combination. An organic material (polyimide, acryl, or a material, which has a skeleton formed by the bond of silicon (Si) and oxygen (O), which includes at least hydrogen, and which may include one selected from the group consisting of fluoride, alkyl group, and aromatic hydrocarbon as a substituent can be used. Even if a material having low wettability is used, the wettability can be further lessened by plasma treatment or the like.

In this embodiment, FAS is used as a low wettability substance. In this embodiment, the FAS is coated whole over a surface. However, the FAS can be coated selectively by droplet discharging. In this instance, the masks 101 and 125 are not always required. Thereafter, the masks 101 and 125 are removed. Since regions provided with the masks 101 and 125 are not provided with a low wettability substance, the regions become high wettability regions 130 and 126 having comparative high wettability (FIGS. 4 and 12A to 12C).

A composition containing a conductive material is discharged from a nozzle 180a to form a gate electrode layer 103 so as to be crossed over the low wettability region 102b and the high wettability region 130. Similarly, a composition containing a conductive material is discharged from a nozzle 180b to form a gate electrode layer 103 so as to be crossed over the low wettability region 102b and the high wettability region 126 (FIGS. 5 and 13A to 13C). Immediately after discharging the composition, the pattern formation materials forming the gate electrode layer 103 and the gate electrode layer 127 do not settle in the low wettability region 102b due to the difference in wettability of the subject formation region, and flow partly from the boundary between the low wettability region 102b and the high wettability region 130, and the boundary between the low wettability region 102b and the high wettability region 126 to the high wettability regions 130 and 126, respectively. This arises from the fact that the composition containing a pattern formation material cannot sufficiently get wet in the low wettability region 102b that has low wettability with respect to the composition containing a pattern formation material, and so the composition is difficult to be solidified and flows to the high wettability regions 130 and 126 that have higher stability than that of the low wettability region 102b. As a result, due to the difference in fluidity and wettability with respect to the subject formation region, the composition containing a pattern formation material that is formed in the gate electrode layer 103 and the gate electrode layer 127 immediately after discharging is changed its form into a gate electrode layer 105 and a gate electrode layer 104 to be stabilized. The gate electrode layer 105 and the gate electrode layer 104 formed over the low wettability region 102b is formed to be finer than the gate electrode layer 103 and the gate electrode layer 127 since a part of the gate electrode layer 105 and the gate electrode layer 104 flows to the high wettability regions 130 and 126. Therefore, the gate electrode layers 105 and 104 that are formed into fine lines having desired finess can be freely formed by droplet discharging (FIGS. 6 and 14A to 14C).

The shape into which a composition flowed from a low wettability region to a high wettability region formed to be stabilized is differed depending on a contact angle, surface tension, a discharge rate, viscosity, an evaporation rate of solvent, and the like. A film thickness distribution is also determined by the foregoing various factors. Therefore, the shape is not limited to that explained in this embodiment. The gate electrode layer formed into a fine line is preferably formed to have a length in a channel direction of 10 μm or less, more preferably, 5 μm or less.

According to the present invention, a fine wiring or electrode can be formed with well controllability; and so reliability can be improved, loss of material can be prevented, manufacturing yields can be improved, and costs can be reduced.

As a base pretreatment, an organic based substance that serves as adhesive agent can be formed to improve adhesiveness of a pattern formed by droplet discharging. As the adhesive agent, an organic material (organic resin material); or a material, which has a skeleton formed by the bond of silicon (Si) and oxygen (O), which includes at least hydrogen, and which may include one selected from the group consisting of fluoride, alkyl group, and aromatic hydrocarbon as a substituent can be used.

Figure 7:
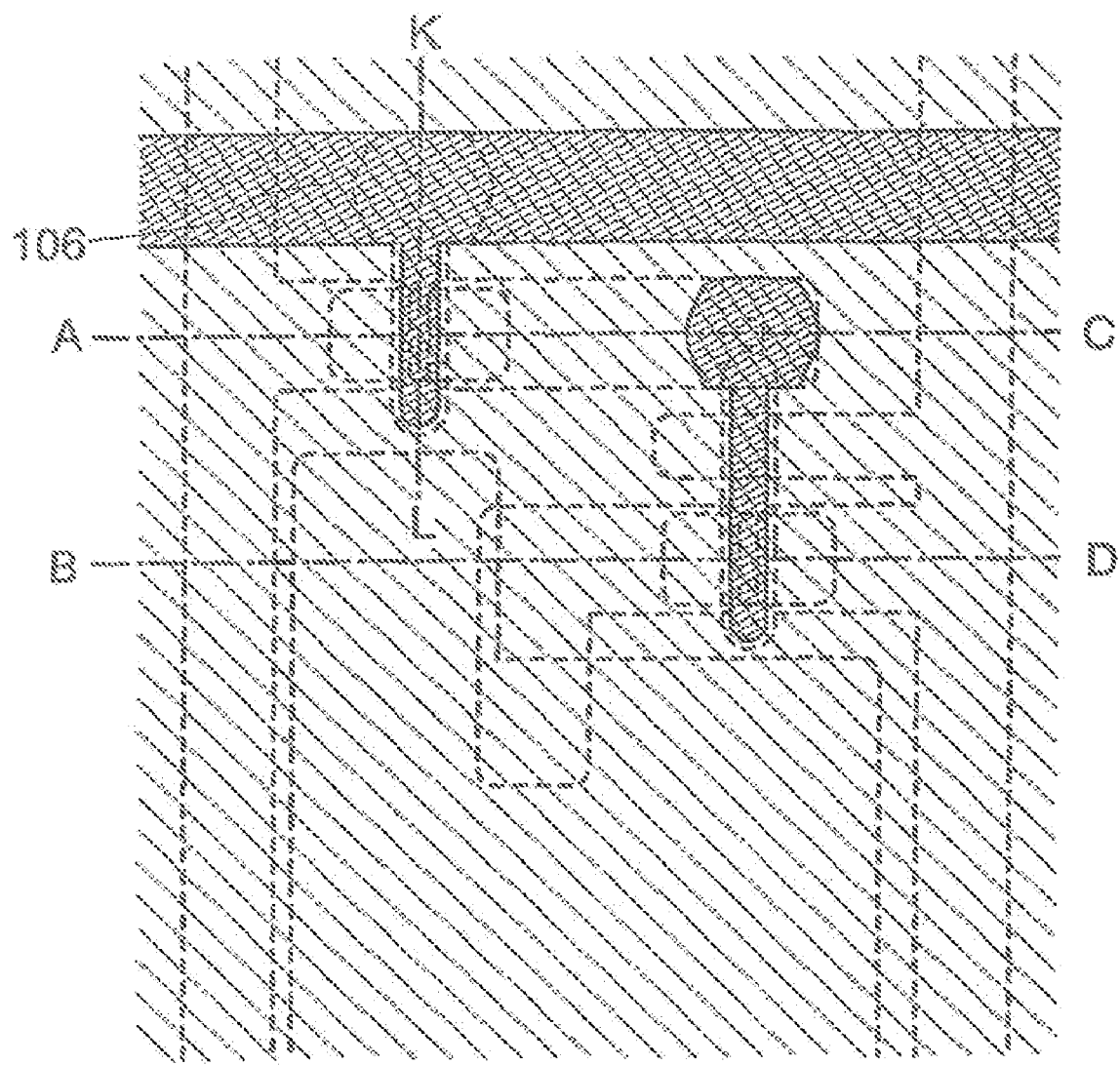
FIG. 7 is an explanatory view for a method for manufacturing a display device according to, the present invention.
Figure 8:
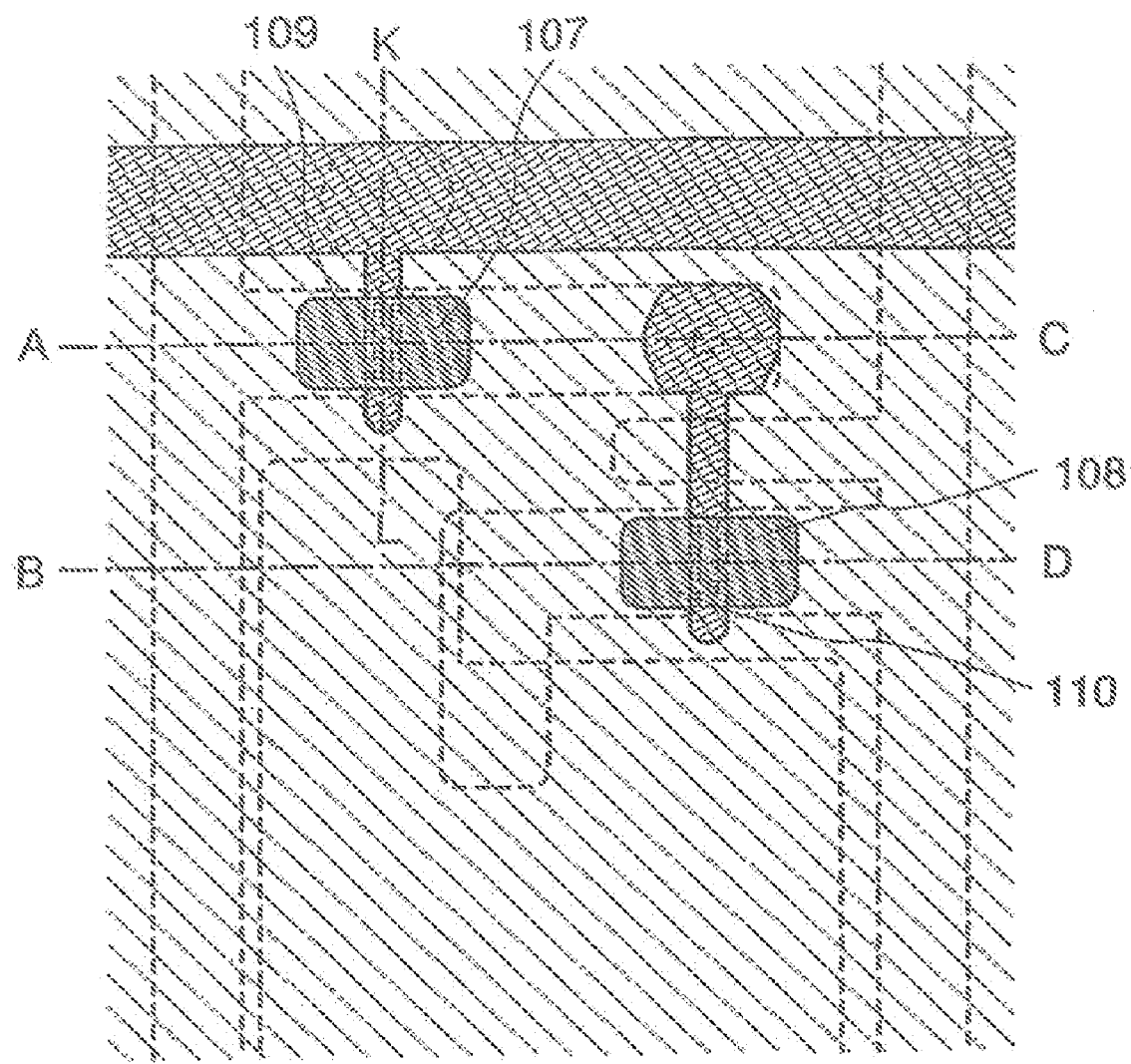
FIG. 8 is an explanatory view for a method for manufacturing a display device according to the present invention.

A gate wiring layer 106 is formed over a high wettability region 130 (FIG. 7). The gate wiring layer 106 is formed to connect electrically to a part of the gate electrode layer 105 that is formed previously. In this embodiment, the gate electrode layer 106 is formed by discharging a composition having conducting properties by droplet discharging. Since the gate wiring layer 106 is formed over the high wettability region 130 to be in contact with the gate electrode layer 105, a low wettability region that surrounds the high wettability region 130 serves as a bank and the gate wiring layer 106 can be exclusively formed over the high wettability region. Accordingly, the gate wiring layer 106 can be formed only over the high wettability region with good controllability. This arises from the fact that the low wettability region repels the composition even if the composition has fluidity. Therefore, a width and a thickness of a wiring can be increased since a composition containing a pattern formation material having fluidity is stayed in a high wettability region.

The gate electrode layers 104 and 105, and the gate wiring layer 106 are formed by using a droplet discharging means. As used herein, the term "droplet discharging means" is a generic term referring to a means for discharging a droplet such as a nozzle having a discharge opening for a composition, or a head provided with one or a plurality of nozzles. A diameter of the nozzle provided with the droplet discharging means is set to be from 0.02 to 100 μm (preferably, 30 μm or less), and a discharge amount for one dot of the composition discharged from the nozzle is set to be from 0.001 pl to 100 pl (preferably, 0.1 pl or more to 40 pl or less, more preferably, 10 pl or less). The discharge amount for one dot increases in proportion to the diameter of the nozzle. In addition, the distance between a subject and the discharge opening is preferably as close as possible in order to discharge a droplet at a desired place. The distance is preferably set from 0.1 to 3 mm (more preferably, 1 mm or less).

As the composition discharged from the discharge opening, a solvent dissolved or dispersed with a conductive material is used. The conductive material corresponds to fine particles or dispersion nanoparticles of metal such as Ag, Au, Cu, Ni, Pt, Pd, Ir, Rh, W, and Al; a metal sulfide of Cd and Zn; an oxide such as Fe, Ti, Si, Ge, Si, Zr, Ba; and a silver halide. Moreover, the conductive material corresponds to indium tin oxide (ITO) used as a transparent conductive film, ITSO formed by an indium tin oxide and a silicon oxide, organic indium, organic tin, zinc oxide, titanium nitride, or the like. However, as the composition discharged from the discharge opening, solvent dissolved or dispersed with any one of Au, Ag, and Cu is preferably used in consideration of a specific resistance value, and more preferably, Ag and Cu having low resistance is used. However, in the case of using Ag or Cu, a barrier film is preferably provided to prevent impurities. As the barrier film, a silicon nitride film or nickel boron (NiB) can be used.

Further, a particle having a laminated structure in which a conductive material is coated by another conductive material can be used. For example, a particle having a three-laminated structure in which copper coated by nickel boron (NiB) and the nickel boron is coated by silver can be used. As the solvent, esters such as butyl acetate or ethyl acetate; alcohols such as isopropyl alcohol or ethyl alcohol; organic solvent such as methyl ethyl ketone or acetone; or the like is used. Viscosity of the composition is preferably set to 20 Pa·s or less to prevent the composition from drying and discharge the composition smoothly from the discharge opening. Further, surface tension of the composition is preferably set to 40 mN/m or less. The viscosity and the like of the composition may be appropriately adjusted depending on solvent or application. As an examples, viscosity of a composition formed by dissolving or dispersing ITO, organic indium, and organic tin into solvent is preferably set to 5 to 20 mPa·s, viscosity of a composition formed by dissolving or dispersing silver into solvent is preferably set to 5 to 20 mPa·s, and viscosity of a composition formed by dissolving or dispersing gold into solvent is preferably set to 5 to 20 mPa·s.

Further, a conductive layer may be formed by stacking a plurality of conductive materials. In addition, plating can be performed by using copper after forming the conductive layer by droplet discharging using silver as the conductive material. As the plating, electroplating or electroless plating can be performed. The plating may be performed by soaking a substrate in a container filled with solution containing a material for plating. Alternatively, the substrate is kept to be tilted (or upright), and solution containing a material for plating is coated fluently to a surface of the substrate. In the case of performing plating by coating solution fluently to the substrate kept up, there is an advantage that a processing device is reduced its size.

The diameter of the conductor particles is preferably small as possible, preferably, a grain diameter of 0.1 µm or less, depending on a diameter of each nozzle or a desirable pattern shape, in order to prevent each clogging of a nozzle or to make fine patterns. Each composition may be formed by a known method such as an electrolytic method, an atomization method or a wet reduction method to have generally a grain diameter of approximately 0.01 to 10 µm. Note that, in the case of forming the composition by a gas evaporation method, the nanoparticles protected by dispersant have fine grain diameters of approximately 7 nm. In addition, in the case that the nanoparticles are each protected by a cladding material, the nanoparticles are dispersed stably at room temperature without aggregation in solution and behave similarly to liquid. Therefore, the cladding material is preferably used.

According to the present invention, a composition is required to have fluidity even when it is discharged to a subject since a composite having fluidity is processed into a desired pattern while the composite can keep fluidity. A process of discharging a composition may be performed under a reduced pressure if the fluidity is continued in the composition. By discharging the composition under a reduced pressure, there is an advantage that an oxide film or the like is not formed over a conductor. After discharging a composition, either or both of a drying process and/or a baking process is performed. The drying and baking processes are both heating processes. For example, the drying process is performed at 100° C. for 3 minutes, whereas the baking process is performed at 200 to 350° C. for 15 to 30 minutes. These two processes are performed for different purposes at different temperatures for different times. The drying and baking processes are performed at a normal pressure or under a reduced pressure by laser irradiation, rapid thermal annealing, heating furnace, or the like. The timing for performing the heating processes is not especially limited. To perform well the drying and baking processes, a substrate may be heated generally at temperature of 100 to 800° C. (preferably, 200 to 350° C.), which depends on a material of the substrate. Solvent in a composition is vaporized, dispersing agent is removed chemically, and peripheral resin is hardened and contracted by this process, which leads to nanoparticles become contact with each other. Accordingly, fusion and welding are accelerated. Therefore, an obtained conductive layer may include resin that protects nanoparticles as a cladding material.

As laser irradiation, a gas laser or a solid laser, each of which is a continuous oscillation or pulse oscillation may be used. As the gas laser, an excimer laser, a YAG laser, and the like can be used. As the solid laser, a YAG laser doped with Cr, Nd, or the like; a laser using a crystal such as $YVO_4$ or $GdVO_4$; and the like can be used. From the standpoint of absorptance of laser light, a continuous oscillated laser is preferably used. Alternatively, so-called hybrid laser irradiation method composed of a pulse oscillation laser and a continuous oscillation laser may be used. Depending on resistance of a substrate 100, a heat treatment of laser light irradiation is preferably performed for several micro seconds to several ten seconds to prevent the substrate 100 from being broken. A rapid thermal annealing (RTA) method is a treatment that applies heat for several minutes to several micro minutes by producing rapidly an increase in temperature under an inert gas using an infrared lamp or halogen lamp, each of which emits ultraviolet light or infrared light. Since this treatment is performed instantly, only a top thin layer can be substantially heated, and a layer at the bottom is not affected by the treatment. That is, even a substrate having low heat resistance such as a plastic film is not affected by the treatment.

After discharging a composition by droplet discharging to form the gate electrode layer 105, the gate electrode layer 104, and the gate wiring layer 106, the surfaces of these layers may be pressed to be planarized by pressure to increase flatness of these layers. As a method for the pressing, a roller for scanning the surface to reduce irregularities on the surface, or a flat plate pressing against the surface may be used. When pressing the surface, a heating process may be performed. Alternatively, the surface may be softened or melted by solvent and irregularities may be removed by an air knife. Further alternatively, the surface may be polished by a chemical mechanical polishing method. The process can be applied in the case that irregularities are produced on a surface by droplet discharging and the surface is required to be planarized.

Figure 15A:
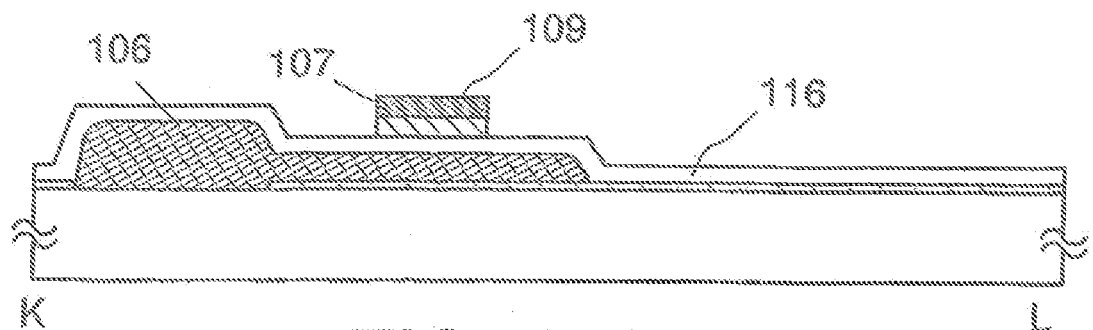
FIGS. 15A to 15C are explanatory views for a method for manufacturing a display device according to the present invention.
Figure 15B:
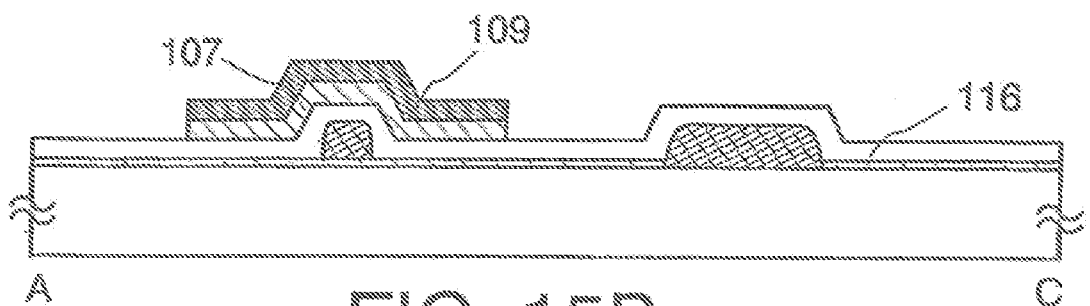
Figure 15C:
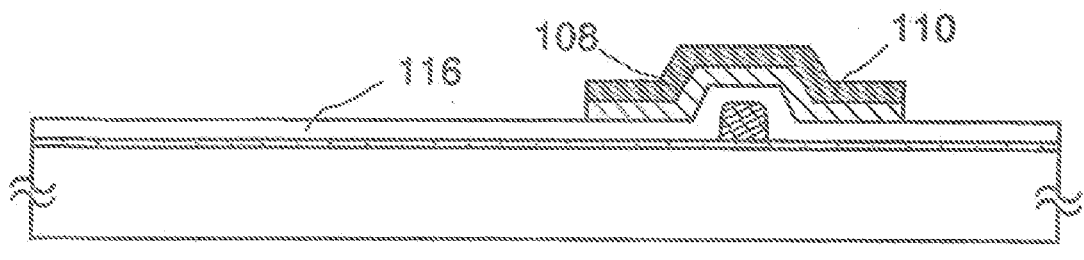

A gate insulating layer 116 is formed over the gate electrode layer 105, the gate electrode layer 104, and the gate wiring layer 106 (FIGS. 15A to 15C). As a material for the gate insulating layer 116, a known material such as oxides of silicon or nitrides of silicon can be used. The gate insulating layer 106 can be formed by a single layer or a laminated layer. In this embodiment, a three-laminated layer of a silicon nitride film, a silicon oxide film, and a silicon nitride film is used. Alternatively, a single layer of the forgoing layers, a single layer of a silicon oxynitride film, or a two-laminated layer can be used. Preferably, a silicon nitride film that is a fine membrane material is used. In the case of using silver or copper as a conductive layer formed by droplet discharging, forming a silicon nitride film or a NiB film can prevent dispersion of impurities and flat the surface. To form a dense insulating film at low deposition temperature, which yields hardly gate leakage current, a reaction gas including an inert gas element such as argon is used to mix the inert gas element into the insulating film.

A semiconductor film is formed. A semiconductor layer having one conductivity type is formed according to need. In this embodiment, a semiconductor layer 107, a semiconductor layer 108, an n-type semiconductor layer 109 having one conductivity type, and an n-type semiconductor layer 110 having one conductivity type are formed (FIGS. 8 and 15A to 15C). Further, an NMOS structure of an n-channel TFT using an n-type semiconductor film, a PMOS structure of a p-channel TFT using a p-channel semiconductor film; and a CMOS structure using an n-channel TFT and a p-channel TFT can be manufactured. To impart conductivity, an n-channel TFT and a p-channel TFT can be formed by doping an element imparting conductivity to form an impurity region to the semiconductor layer.

The semiconductor layer may be formed by a known method (sputtering, LPCVD, plasma CVD, or the like). It is not limited to a material for the semiconductor layer. Preferably, the semiconductor layer is formed by silicon germanium or silicon germanium alloys.

Amorphous semiconductor (typically, hydrogenated amorphous silicon), crystalline semiconductor (typically, polysilicon), or semiamorphous semiconductor are used as a material of the semiconductor layer. The polysilicon (polycrystalline silicon) comprised so-called high temperature polysilicon using polysilicon formed through a process temperature of 800° C. or more, so-called low temperature polysilicon using polysilicon formed through a process temperature of 600° C. or less, polysilicon doped with an elements for promoting crystallization and crystallized, and the like.

As another substance, semiamorphous semiconductor or the semiconductor layer including a crystal phase in a semiconductor layer can be used.

In the case that a crystalline semiconductor layer is used as the semiconductor layer, a known method (laser crystallization, thermal crystallization, thermal crystallization using an element promoting crystallization such as nickel, or the like) may be used as a method for manufacturing a crystalline semiconductor layer. Microcrystal semiconductor (semiamorphous semiconductor; SAS) can be crystallized by laser irradiation to increase crystallinity. In the case that an element promoting crystallization is not introduced, contained hydrogen in an amorphous silicon film is released so that concentration of the hydrogen is reduced to $1 \times 10^{20}$ atoms/cm$^3$ or less by heating for one hour under nitrogen atmosphere at 500° C. The reason of reducing the hydrogen concentration is that the amorphous semiconductor film containing much hydrogen is broken in the case of being irradiated with laser light.

A method of introducing a metal element into the amorphous semiconductor layer is not especially limited as long as the metal element can exist over the surface or the inside of the amorphous semiconductor layer by the method. For example, a sputtering method, a CVD method, a plasma treatment (including plasma CVD), an absorption method, or a coating method using solution of metal salt can be used. Among the foregoing methods, the coating method using solution is a convenient means and useful in adjusting density of the metal element. To improve wettability of the surface of the amorphous semiconductor layer and coat solution whole over the surface of the amorphous semiconductor layer, an oxide film is preferably formed by UV light irradiation in oxygen atmosphere, thermal oxidation, treatment by ozone water containing hydroxy radical or hydrogen peroxide, or the like.

Crystallization of the amorphous semiconductor layer can be performed by combining thermal treatment and laser light irradiation, or a plurality numbers of times of thermal treatment or laser light irradiation.

Alternatively, a crystalline semiconductor layer may be directly formed on a substrate by linear plasma method. Further alternatively, the crystalline semiconductor layer may be selectively formed over a substrate by linear plasma method.

As the semiconductor, organic semiconductor using an organic material may be used. As the organic semiconductor, a low molecular material, a high molecular material, or the like is used. Further, an organic pigment, a conductive high molecular material, or the like can also be used.

In this embodiment, amorphous semiconductor is used as the semiconductor. A semiconductor layer is formed, and an n-type semiconductor layer as a semiconductor layer having one conductivity type is formed by plasma CVD or the like.

The semiconductor layer and the n-type semiconductor layer are patterned simultaneously by using a mask made from insulator such as resist, polyimide, or the like to form the semiconductor layer 107, the semiconductor layer 108, the n-type semiconductor layer 109, and the n-type semiconductor layer 110 (FIGS. 8 and 15A to 15C). As a material for forming the mask, a resin material such as epoxy resin, acrylic resin, phenol resin, novolac resin, melamine resin, or urethane resin is used. In addition, the mask can be formed by droplet discharging using an organic material such as benzocyclobutene, parylene, flare, or polyimide having permeability; a compound material formed by polymerization of siloxane based polymer or the like; a composition material containing water-soluble homopolymer and water-soluble copolymer; or the like. Alternatively, a commercial resist material including a photosensitizer, for example, a typical positive type resist such as a novolac resin, a naphthoquinonediazide compound that is a photosensitizer, base resin that is negative type resist, diphenylsilanediol, an acid generating agent, or the like may be used. In any case of using any material, surface tension and viscosity are appropriately adjusted by adjusting concentration of solvent or adding a surface-active agent or the like.

In this embodiment, in the case that the gate electrode layer 105 and the gate electrode layer 104 are formed by droplet discharging, treatment of forming regions having different wettability at the periphery of a subject formation region may be performed as pretreatment. In the case that a pattern is formed by discharging a droplet by droplet discharging in the present invention, a shape of the pattern can be controlled by forming a low wettability region and a high wettability region in a subject formation region of the pattern. By performing the treatment to the subject formation region, the subject formation region has different levels of wettability, and so a droplet is only stayed in the subject formation region having high wettability. Accordingly, a pattern can be formed with well controllability. This process can be applied as various kinds of base pretreatment in the case of using a liquid material, which has an effect of simplifying a manufacturing process since a mask becomes not always required.

Then, a mask is formed by droplet discharging using insulator such as resist and polyimide. A contact hole 145 is formed to a part of a gate insulating layer 116 by an etching process using the mask in such a way that a part of the gate electrode layer 104 that is provided at the bottom of the gate insulating layer 116 is exposed. As the etching process, either of plasma etching (dry etching) or wet etching can be used. A plasma etching is preferably used in the case of using a large substrate. A fluorine-based gas or a chlorine-based gas such as $CF_4$, $NF_3$, $Cl_2$, and $BCl_3$ is used as an etching gas, and an inert gas such as He and Ar may be appropriately mixed thereinto. In the case that an etching process of an atmospheric discharge is adopted, a discharge processing locally can be carried out and a mask layer is not required to be formed whole over the substrate.

Figure 9:
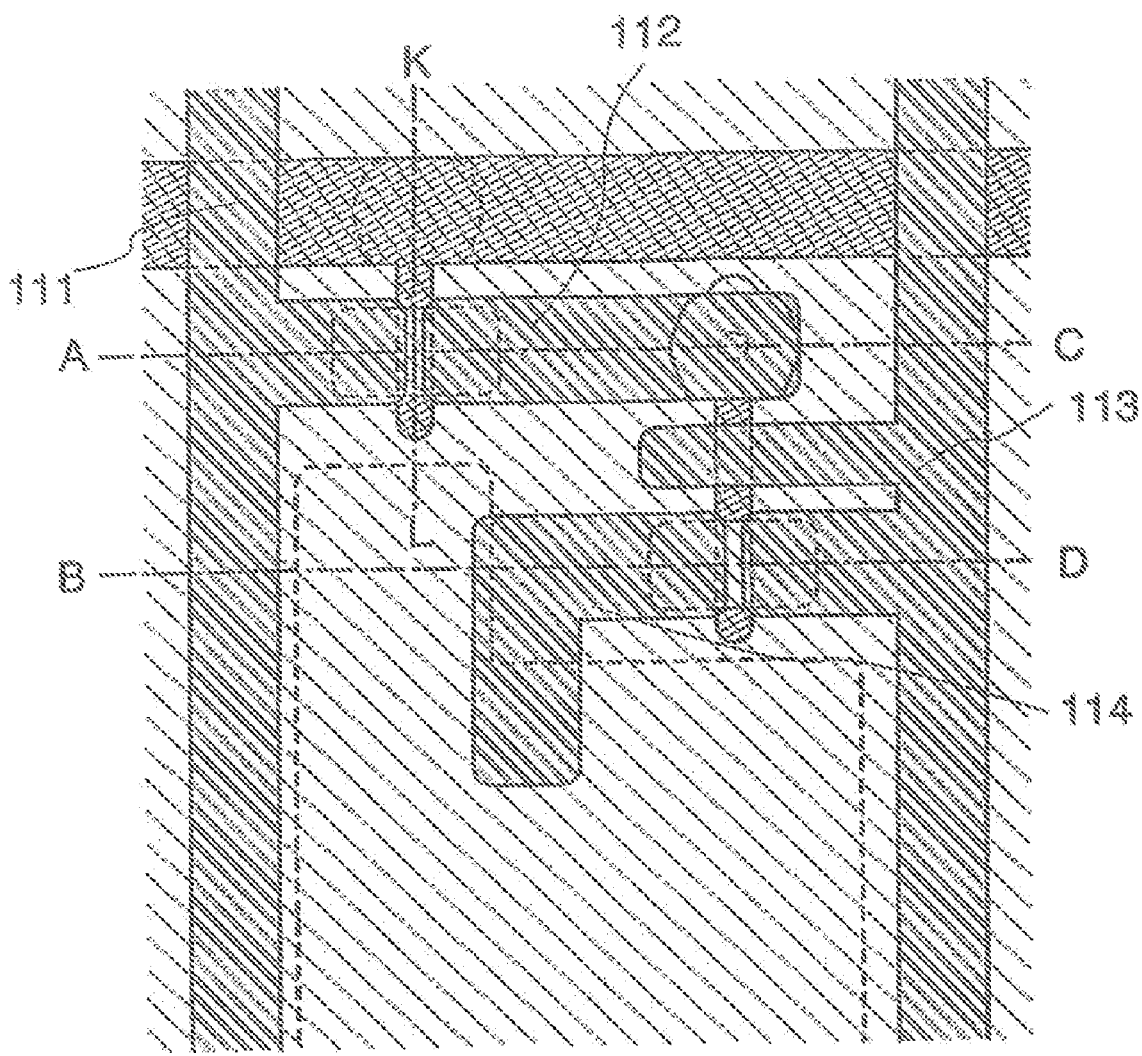
FIG. 9 is an explanatory view for a method for manufacturing a display device according to the present invention.
Figure 10:
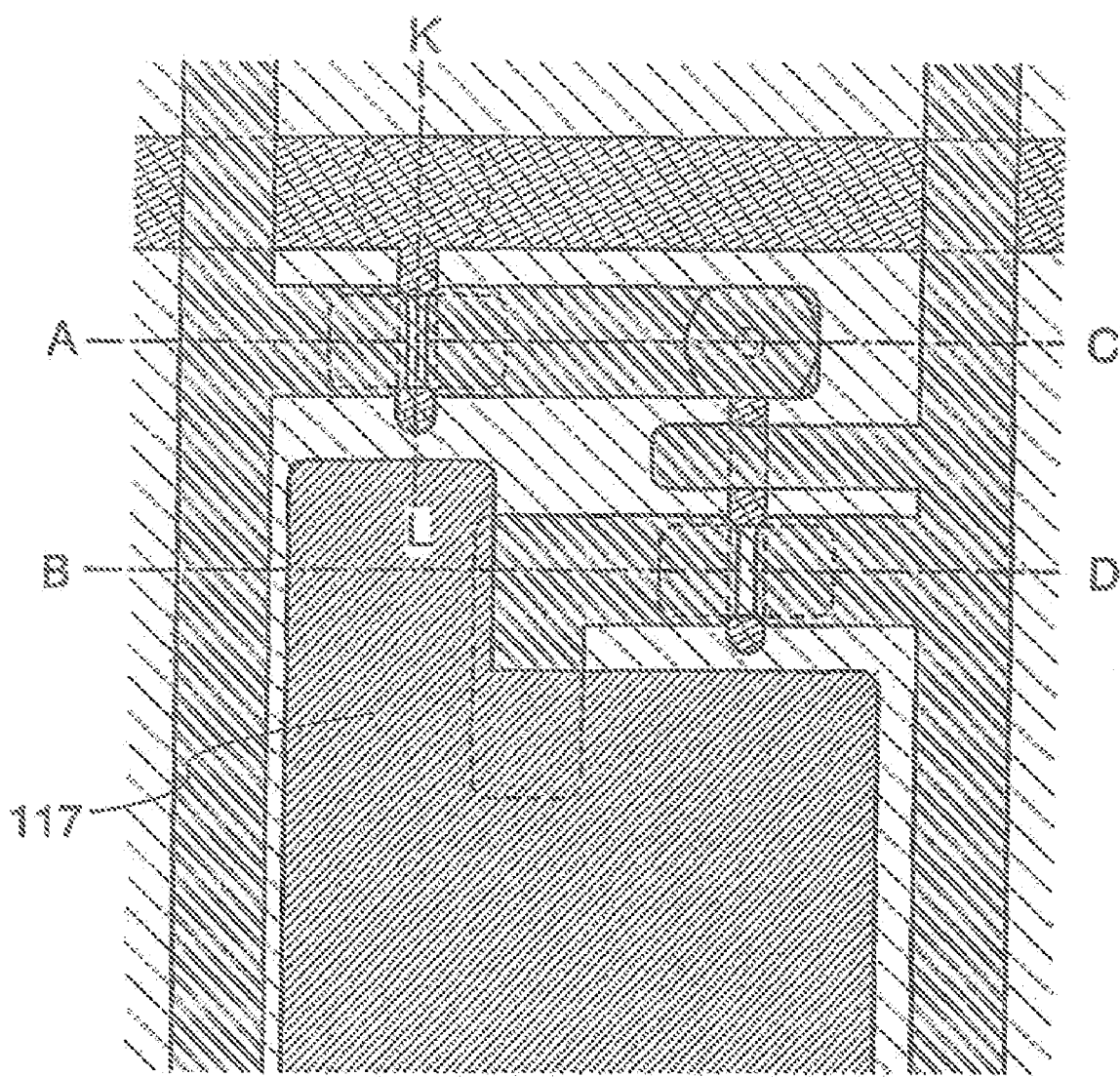
FIG. 10 is an explanatory view for a method for manufacturing a display device according to the present invention.
Figure 11A:
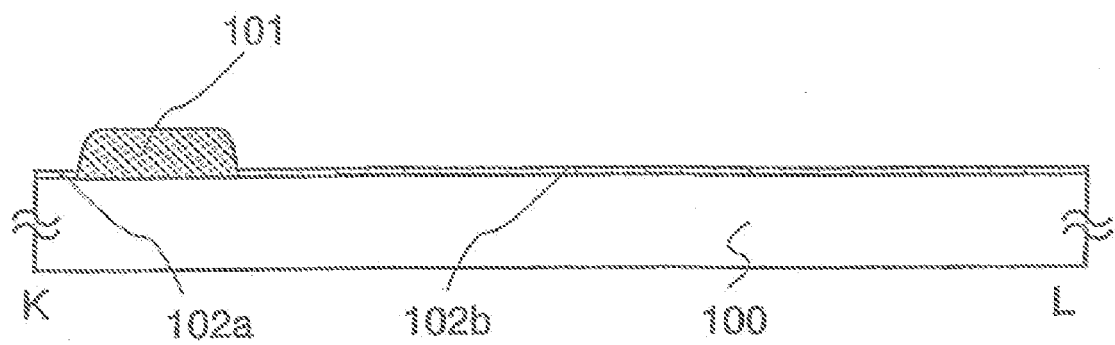
FIGS. 11A to 11C are explanatory views for a method for manufacturing a display device according to the present invention.
Figure 11B:
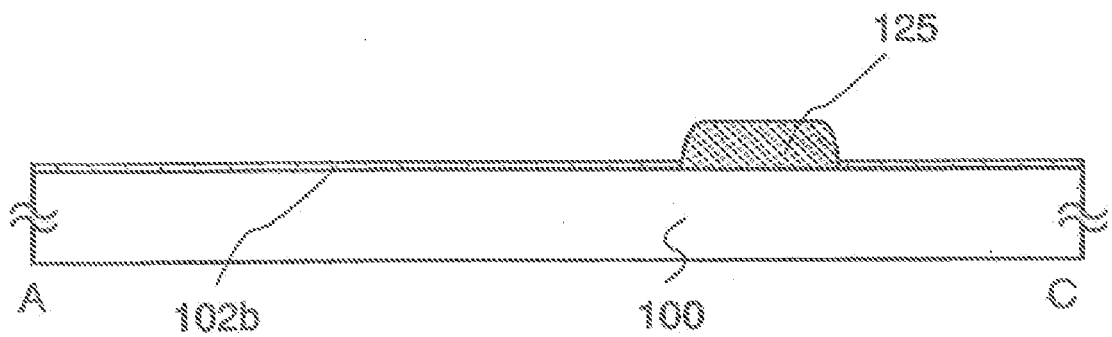
Figure 11C:
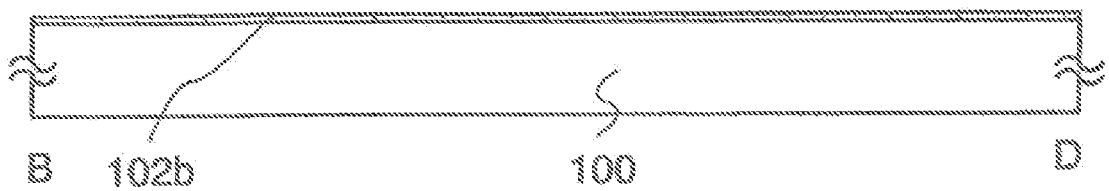
Figure 12A:
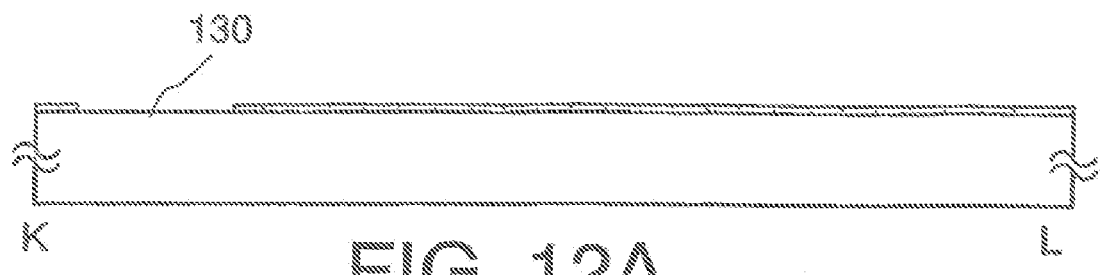
FIGS. 12A to 12C are explanatory views for a method for manufacturing a display device according to the present invention.
Figure 12B:
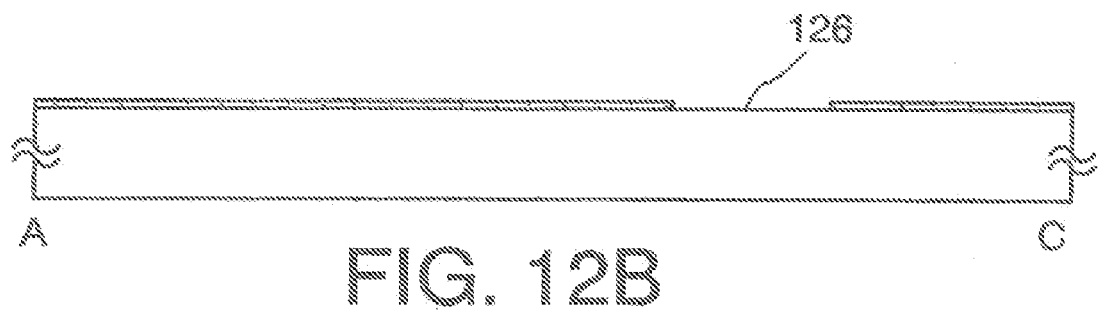
Figure 12C:
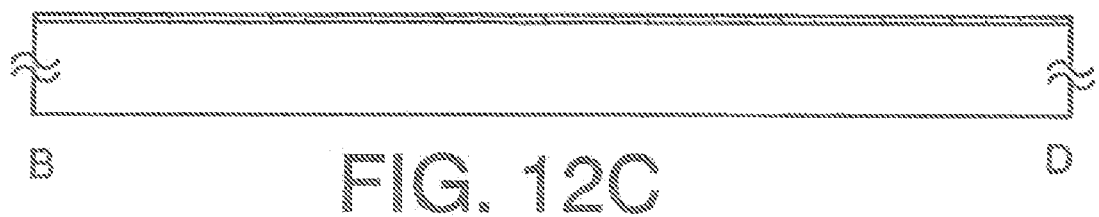
Figure 13A:
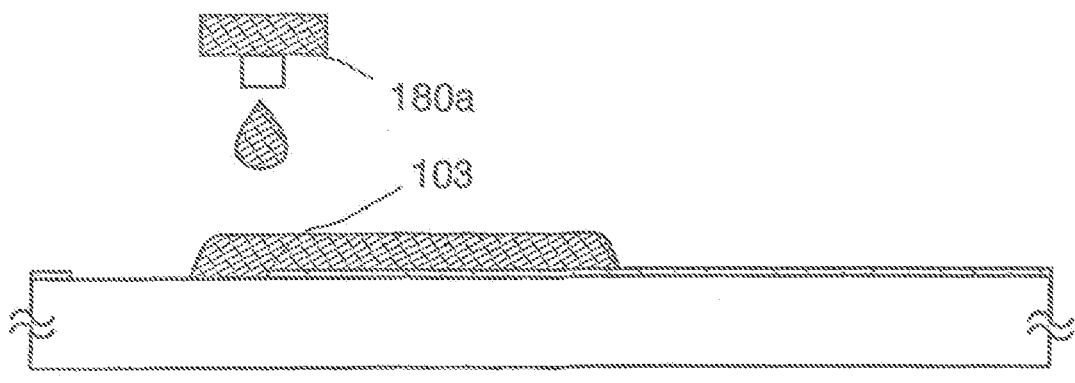
FIGS. 13A to 13C are explanatory views for a method for manufacturing a display device according to the present invention.
Figure 13B:
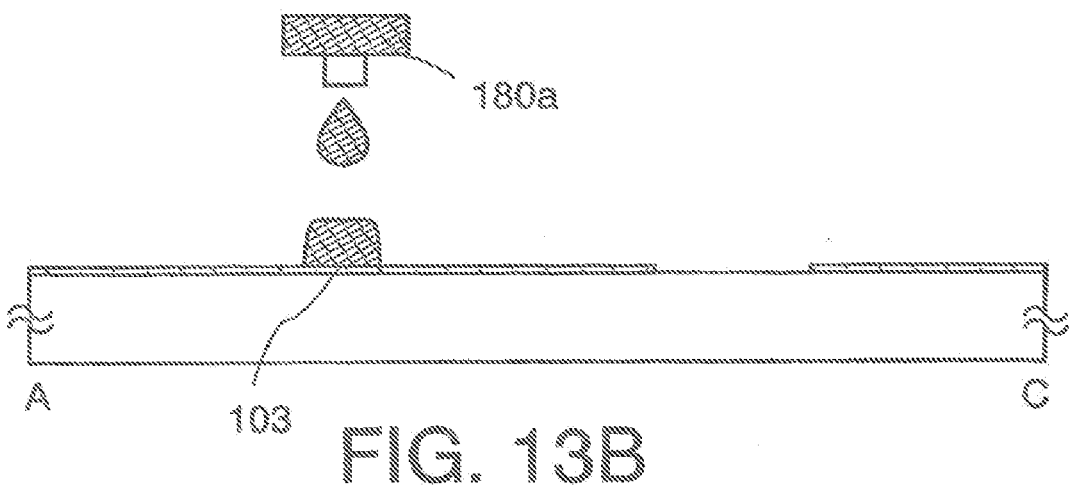
Figure 13C:
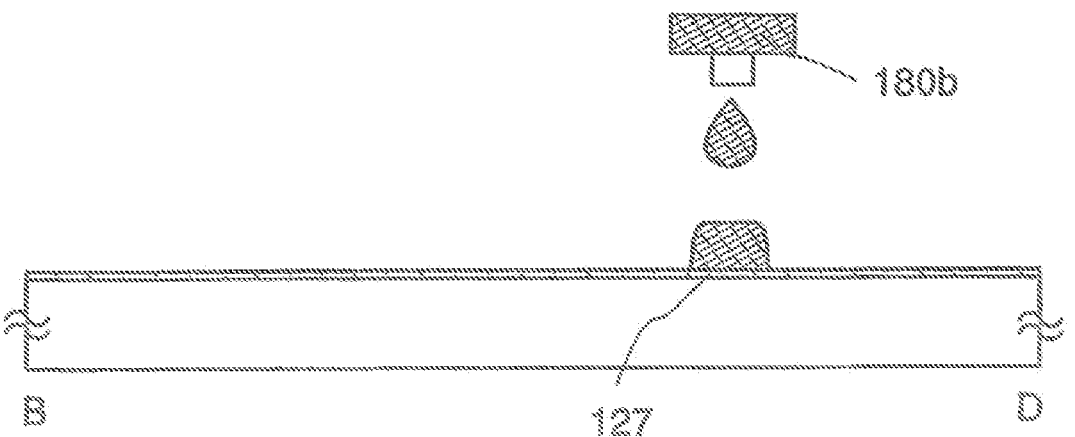
Figure 14A:
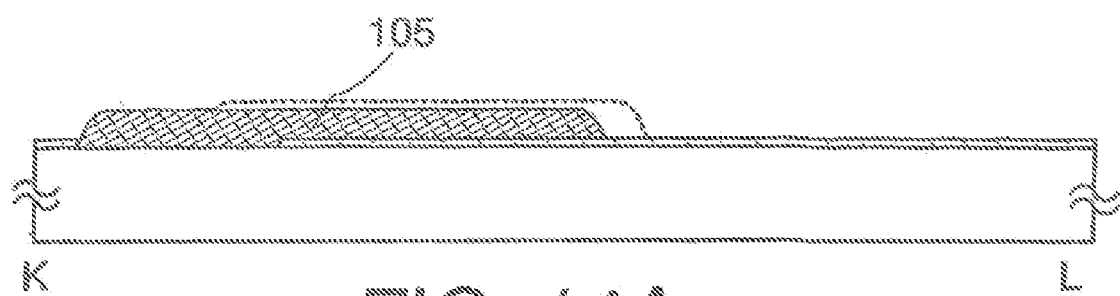
FIGS. 14A to 14C are explanatory views for a method for manufacturing a display device according to the present invention.
Figure 14B:
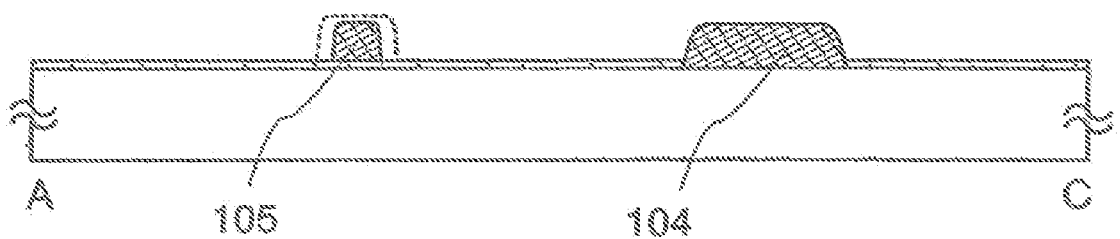
Figure 14C:
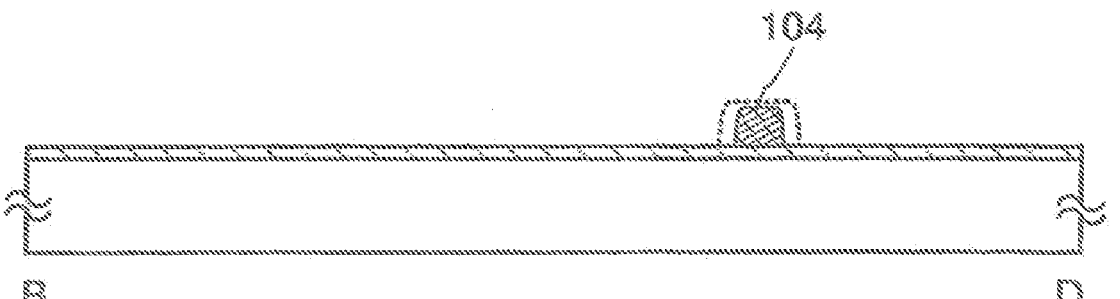
Figure 16A:
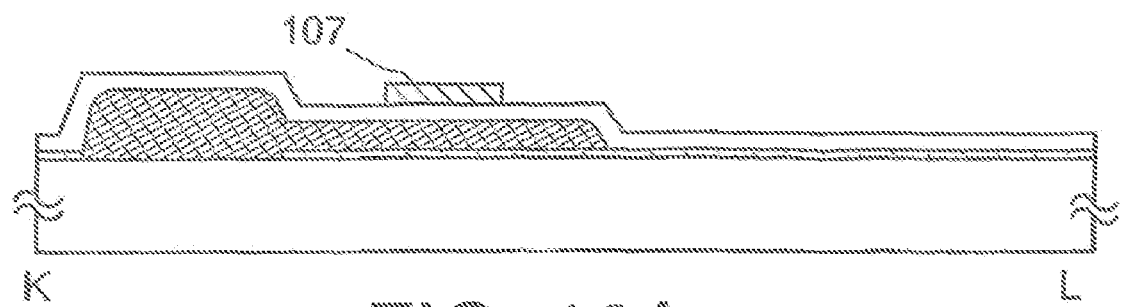
FIGS. 16A to 16C are explanatory views for a method for manufacturing a display device according to the present invention.
Figure 16B:
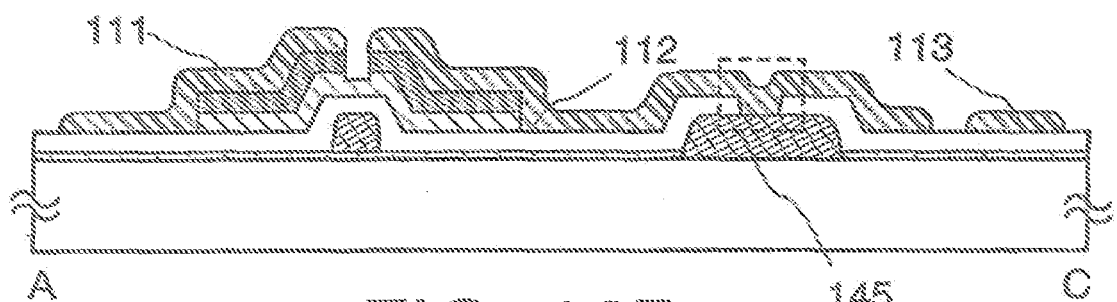
Figure 16C:
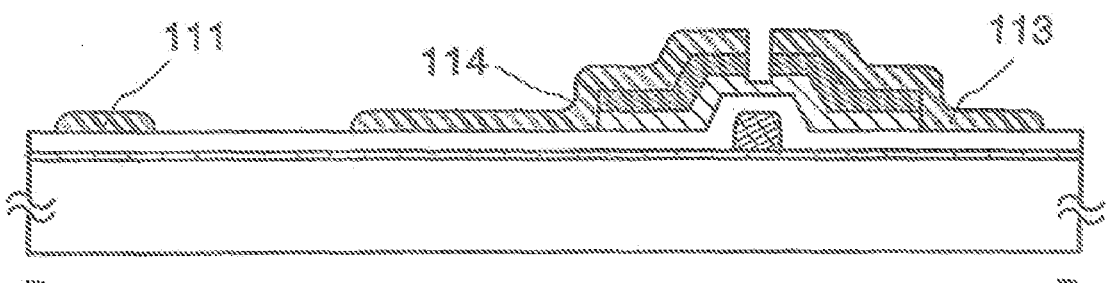
Figure 17A:
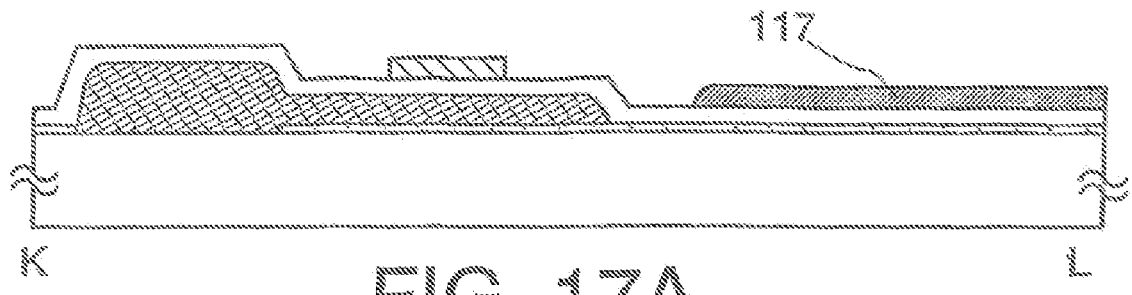
FIGS. 17A to 17C are explanatory views for a method for manufacturing a display device according to the present invention.
Figure 17B:
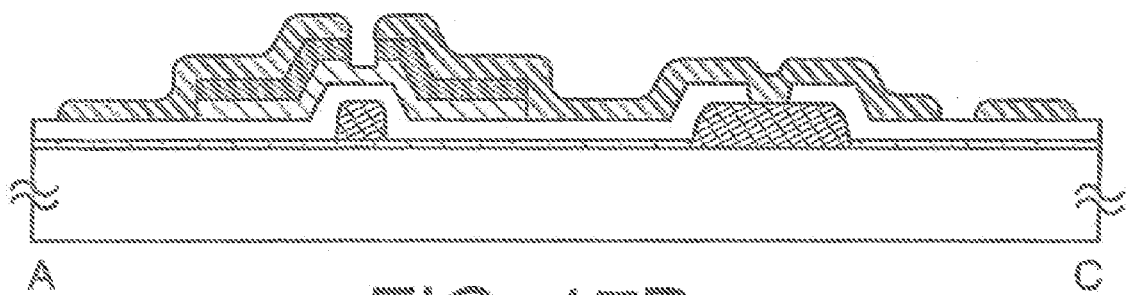
Figure 17C:
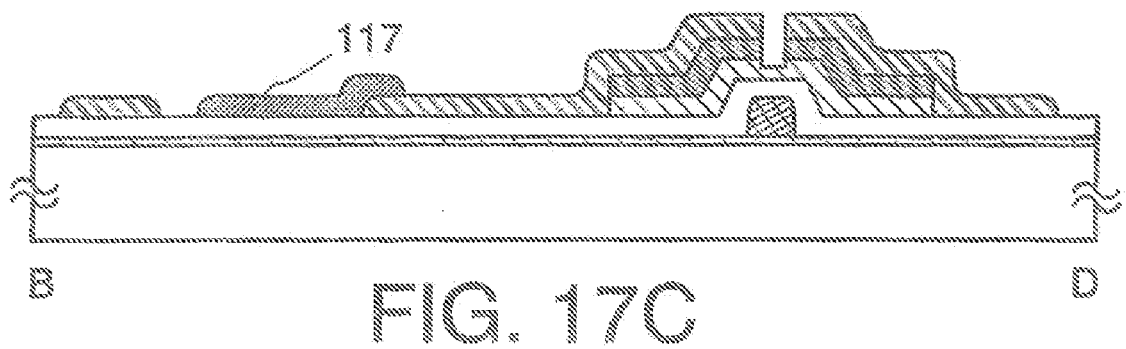

After removing the mask, a source electrode layer or a drain electrode layer 111, a source electrode layer or a drain electrode layer 112, a source electrode layer or a drain electrode layer 113, and a source electrode layer or a drain electrode layer 114 are formed by discharging a composition containing a conductive material. The semiconductor layer 107, the semiconductor layer 108, the n-type semiconductor layer 109, and the n-type semiconductor layer 110 are patterned by using the source electrode layer or the drain electrode layer 111, 112, 113 and 114 as masks to expose the semiconductor layer 107 and the semiconductor layer 108 (FIGS. 9 and 16). The source electrode layer or the drain electrode layer 111 serves as a source wiring layer, whereas the source electrode layer or the drain electrode layer 113 serves as a power wiring.

The source electrode layer or the drain electrode layer 111, the source electrode layer or the drain electrode layer 112, the source electrode layer or the drain electrode layer 113, and the source electrode layer or the drain electrode layer 114 can be formed in accordance with the same procedure as that conducted to form the gate electrode layer 105. In this instance, a region on which a conductive layer having a comparative large width of a source wiring layer and a power wiring would be formed to be a high wettability region, and a composition containing a conductive material is discharged so as to be crossed the boundary between the high wettability region and a low wettability region. A composition over the low wettability region flows partly to the high wettability region, and so a thin and fine wiring is formed. The thin and fine wiring is used as a conductive layer for serving as a source electrode or a drain electrode in a pixel. Thereafter, the source wiring layer and the power wiring are formed over the high wettability region.

As a conductive material for forming the source electrode layer or the drain electrode layer 111, the source electrode layer or the drain electrode layer 112, the source electrode layer or the drain electrode layer 113, and the source electrode layer or the drain electrode layer 114, a composition containing metal particles such as Ag (silver), Au (gold), Cu (copper), W (tungsten), Al (aluminum), or the like as its main component can be used. Alternatively, indium tin oxide (ITO) having transmittance, ITSO composed of indium tin oxide and silicon oxide, organic indium, organic tin, zinc oxide, titanium nitride, and the like can be used together as the conducive material.

As a base pretreatment of a conductive layer formed by droplet discharging, a process for forming the foregoing base film is performed. The process treatment may be formed after forming the conductive layer. By this treatment, reliability of a display device can be improved since adhesiveness between layers is improved.

In the contact hole 145 provided to the gate insulating layer 116, the source electrode layer or the drain electrode layer 112 is electrically connected to the gate electrode layer 104. A part of the source electrode layer or the drain electrode layer forms a capacitor element.

The contact hole 145 may be formed to a part of the gate electrode layer 116 after forming the source electrode layer or the drain electrode layer 111, the source electrode layer or the drain electrode layer 112, the source electrode layer or the drain electrode layer 113, and the source electrode layer or the drain electrode layer 114 using the source electrode layer or the drain electrode layer 111, the source electrode layer or the drain electrode layer 112, the source electrode layer or the drain electrode layer 113, and the source electrode layer or the drain electrode layer 114 as masks. Then, a conductive layer is formed to the contact hole 145, and then, the source electrode layer or the drain electrode layer 112 is electrically connected to the gate electrode layer 104. In this instance, there is an advantage of simplification of a manufacturing process.

A first electrode layer 117 is formed by discharging a composition containing a conductive material selectively over the gate insulating layer 116 (FIGS. 10 and 17A to 17C). Needless to say, pretreatment for forming low and high wettability regions can be performed in forming the first electrode layer 117 as is the case with forming the gate electrode layer 105. The first electrode layer 117 can be formed with further well controllability and selectivity by discharging a composition containing a conductive material to the high wettability region. In the case that light is emitted from the substrate 100, the first electrode layer 117 may be formed by forming a predetermined pattern by a composition containing indium tin oxide (ITO), indium tin oxide containing silicon oxide (ITSO), indium zinc oxide (IZO) containing zinc oxide (ZnO), zinc oxide (ZnO), ZnO doped with gallium (Ga), tin oxide ($SnO_2$) and baking the pattern.

Preferably, the first electrode layer 117 is formed by indium tin oxide (ITO), indium tin oxide containing silicon oxide (ITSO), zinc oxide (ZnO), or the like by sputtering. More preferably, the first electrode layer 117 is formed by a target composed of ITO and 2 to 10 atomic % of silicon oxide by sputtering. Alternatively, a conductive material composed of ZnO doped with gallium (Ga), or indium zinc oxide (IZO) composed of indium tin oxide containing silicon oxide mixed with 2 to 20 atomic % of zinc oxide (ZnO), which is an oxide conductive material, can be used. After forming the first electrode layer 117 by sputtering, a mask layer may be formed by droplet discharging to etch the first electrode layer 117 into a desired pattern. In this embodiment, the first electrode layer 117 is formed by droplet discharging by a conductive material having transmittance, specifically, indium tin oxide or ITSO composed of ITO and silicon oxide.

In this embodiment, an example of the gate insulating layer 116 formed by three layers of a silicon nitride film made from silicon nitride, a silicon oxynitride film (silicon oxide film), and silicon nitride film is described. As a preferable structure, the first electrode layer 117 made from indium tin oxide containing silicon oxide is formed so as to be located to be too close to an insulating layer made form silicon nitride contained in the gate insulating layer 116. Accordingly, an effect of increasing a rate of emitting light generated in an electroluminescent layer to the outside can be developed. The gate insulating layer can be interposed between the gate electrode layer and the first electrode layer to serve as a capacitor element.

The first electrode layer 117 can be formed selectively over the gate insulating layer 116 before forming the source electrode layer or the drain electrode layer 114. In this instance, this embodiment provides a connecting structure of the source electrode layer or the drain electrode layer 114 and the first electrode layer is formed by stacking the source electrode layer or the drain electrode layer 114 over the first electrode layer. In the case that the first electrode layer 117 is formed in advance of the source electrode layer or the drain electrode layer 114, the first electrode layer 117 can be formed over a plane region. Accordingly, the first electrode layer 117 can be formed with a good cladding property and deposition property, moreover, a good flatness property since polishing treatment such as CMP can be sufficiently performed.

Alternatively, a structure in which an insulating layer serving as an interlayer insulating layer is formed over the source electrode layer or the drain electrode layer 114, and the source electrode layer or the drain electrode layer 114 is electrically connected to the first electrode layer 117 by a wiring layer can be formed. In this instance, an opening portion (contact hole) is not formed by removing an insulating layer, but a low wettability substance with respect to the insulating layer is formed over the source electrode layer or the drain electrode layer 114. Thereafter, a composition including an insulating layer is coated by a coating method, and an insulating layer is formed over a region except a region with the low wettability substance.

After forming an insulating layer by fixation by heating, drying, or the like, the low wettability substance is removed to form an opening portion. A wiring layer is formed to fill the opening portion, and the first electrode layer 117 is formed to be contact with the wiring layer. By using this method, there is an effect of simplification of a manufacturing process since formation of an opening portion by etching is not required.

In the case that a structure in which light is emitted to an opposite direction to the substrate 100 (top emission EL display panel) is formed is formed, a composition containing metal particles such as Ag (silver), Au (gold), Cu (copper), W (tungsten), Al (aluminum), or the like as its main component can be used. As another method, a transparent conductive film or a light reflectivity conductive film may be formed by sputtering, and a mask pattern may be formed by droplet discharging, then the first electrode layer 117 may be formed by combining with an etching process.

The first electrode layer 117 may be polished by CMP or wiping and cleaning by a porous body of polyvinyl alcohols in order the surface of the first electrode layer 117 to be planarized. After polishing by CMP, the surface of the first electrode layer 117 may be irradiated with ultraviolet rays or treated in oxygen plasma.

According to the foregoing processes, a TFT substrate for a display panel in which a bottom gate (reverse staggered) TFT and a first electrode are connected each other over a substrate 100 is completed. The TFT in this embodiment is a channel etch type TFT.

Then, an insulating layer 121 (also referred to as a bank) is selectively formed. The insulating layer 121 is formed to have an opening portion over the first electrode layer 117. In this embodiment, the insulating layer 121 is formed whole over a surface to be etched and patterned by using a mask such as resist. In the case that the insulating layer 121 is formed by droplet discharging or printing, each of which can form the insulating layer 121 directly and selectively, a patterning process by etching is not always required. The insulating layer 121 can also be formed into a desired shape by pretreatment according to the present invention.

The insulating layer 121 can be formed by using an inorganic insulating material such as silicon oxide, silicon nitride, silicon oxynitride, aluminum oxide, aluminum nitride, or aluminum oxynitride; acrylic acid; methacrylic acid; a derivative of the acrylic acid or the methacrylic acid; a heat-resistant high molecular weight material such as polyimide, aromatic polyamide, or polybenzimidazole; or inorganic siloxane including the bond of Si—O—Si, or organic siloxane in which hydrogen on silicon is substituted by an organic group such as methyl or phenyl, among a compound composed of silicon, oxygen, and hydrogen formed by siloxane based material as a starting material. They may be formed by using a photosensitive or non-photosensitive material such as acrylic or polyimide. When a photosensitive material is used, patterning can be performed without using a resist mask. In this embodiment mode, a photosensitive organic resin material is used. The insulating layer 121 is preferably formed to have a shape with a radius of curvature that varies continuously, since a cladding property of an electroluminescent layer 122 and a second electrode layer 123 is improved, each of which is formed thereover is improved.

After discharging a composition to form the insulating layer 121 by droplet discharging, the surface may be pressed to be planarized by pressure to increase flatness of these layers. As a method for the pressing, a roller scanning the surface to reduce irregularities on the surface; or a flat plate pressing against the surface may be used. Alternatively, the surface may be softened or melted by solvent and irregularities may be removed by an air knife. Further alternatively, the surface may be polished by a chemical mechanical polishing method. The process can be applied in the case that irregularities are produced on a surface by droplet discharging and the surface is required to be planarized. When the flatness is improved, display unevenness can be prevented and a high-definition image can be displayed.

Figure 18A:
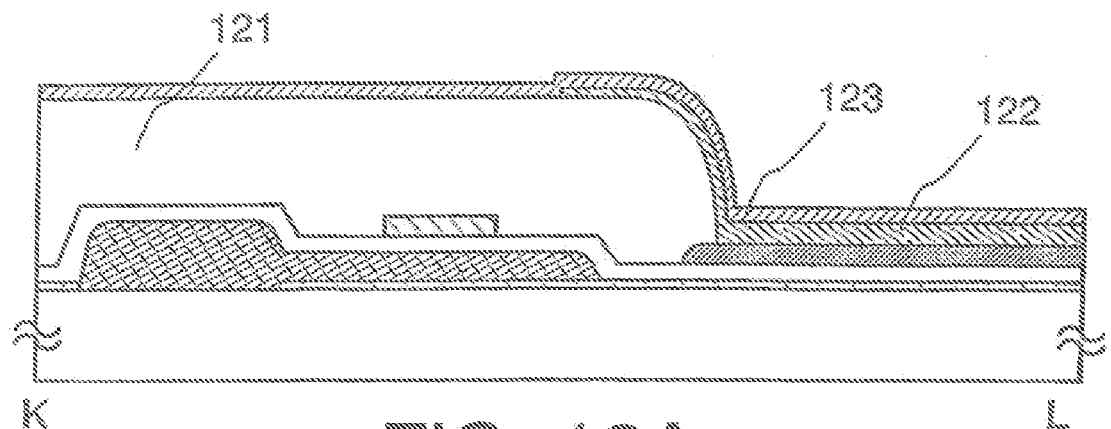
FIGS. 18A to 18C are explanatory views for a method for manufacturing a display device according to the present invention.
Figure 18B:
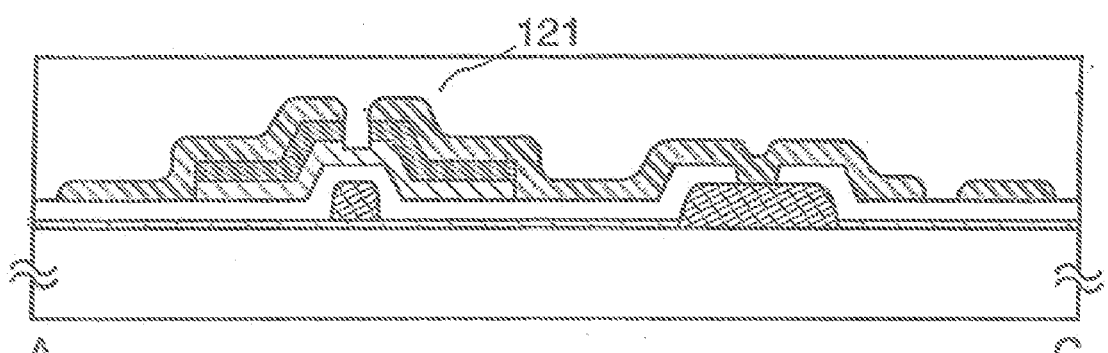
Figure 18C:
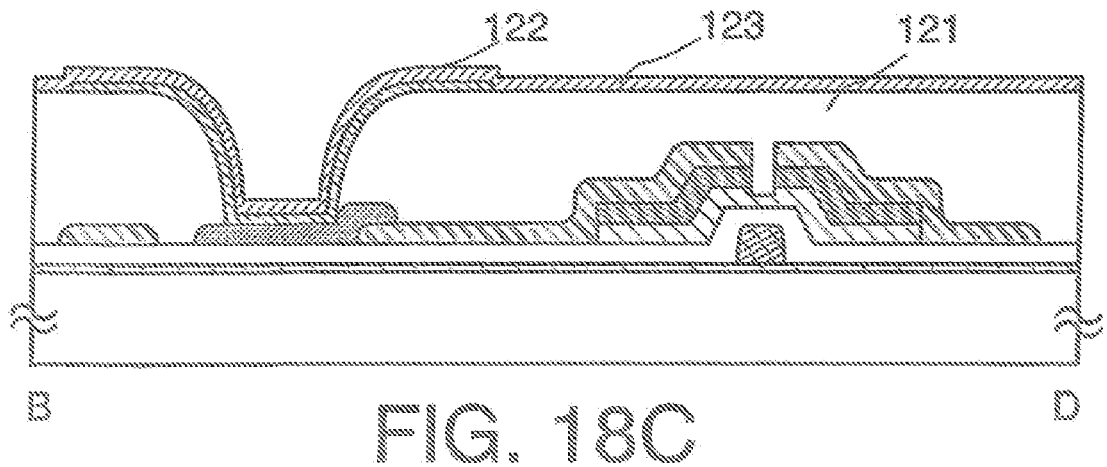

A light-emitting element is formed over the substrate 100 that is a TFT substrate for a display panel (FIGS. 18A to 18C).

Before forming the electroluminescent layer 122, moisture absorbed to the surface or the inside of the first electrode layer 117 and the insulating layer 121 is removed by heat treatment at 200° C. at atmospheric pressure. Preferably, heat treatment is performed under reduced pressure at 200 to 400° C., preferably, 250 to 350° C., and the electroluminescent layer 122 is formed by vacuum vapor deposition or droplet discharging under reduced pressure.

As the electroluminescent layer 122, a material that exhibits red (R), green (G), and blue (B) is selectively formed by vapor deposition using an evaporation mask, respectively. The material that exhibits red (R), green (G), and blue (B) can be formed by droplet discharging (low molecular or high molecular) as is the case with a color filter. Using droplet discharging is preferably since RGB patterning can be carried without using a mask. Then, a display device with a display function using a light-emitting element by stacking the second electrode layer 123 over the electroluminescent layer 122.

Although not shown, it is effective to provide a passivation film so as to cover the second electrode layer 123. A protective film provided in manufacturing a display device may have either of a single layered structure or a layered structure. As the passivation film, a single layer of an insulating film containing silicon nitride (SiN), silicon oxide (SiO$_2$), silicon oxynitride (SiON), silicon nitride oxide (SiNO) aluminum oxynitride (AlN), aluminum oxynitride (AlON), aluminum nitride oxide (AlNO) which has more nitrogen content than oxygen content, aluminum oxide, diamond like carbon (DLC) or a nitrogen-containing carbon film (CN$_x$), or a laminated layer in which the insulating films are combined can be used. For example, a layered layer such as a nitrogen-containing carbon film (CN$_x$) and silicon nitride (SiN) or an organic material can be used, or a laminated layer of a polymer such as a styrene polymer may be used. Alternatively, a material, which has a skeleton formed by the bond of silicon (Si) and oxygen (O), which includes at least hydrogen, and which may include one selected from the group consisting of fluoride, alkyl group, and aromatic hydrocarbon as a substituent may be also used.

At this time, a film having preferable coverage is preferably used as the passivation film, and a carbon film, particularly; a DLC film is effective to be used. A DLC film can be formed within the temperatures ranging from a room temperature to 100° C. or less; therefore, a DLC film can be easily formed over an electroluminescent layer having low heat resistance. A DLC film can be formed by a plasma CVD method (typically, an RF plasma CVD method, a microwave CVD method, an electron cyclotron resonance (ECR) CVD method, a heat filament CVD method or the like), a combustion flame method, a sputtering method, an ion beam evaporation method, a laser evaporation method or the like. A hydrogen gas and a hydrocarbon system gas (for example CH$_4$, C$_2$H$_2$, C$_6$H$_6$ or the like) are used as a reactive gas which is used for forming the film. The reaction gas is ionized by glow discharge. The ions are accelerated to collide with a cathode applied with negative self bias. A Cl$_x$ film may be formed by using a C$_2$H$_2$ gas and an N$_2$ gas as a reactive gas. The DLC film has high blocking effect on oxygen and can suppress the oxidation of the electroluminescent layer. Accordingly, the electroluminescent layer can be prevented from being oxidized during a subsequent sealing process.

Then, a sealant is formed to perform a sealing process by using a sealing substrate. Thereafter, a flexible wiring substrate is connected to the gate wiring layer 106 to make electrical connection to the outside. Much the same is true on the source electrode layer or the drain electrode layer 111 serving as a source wiring layer.

Figure 33A:
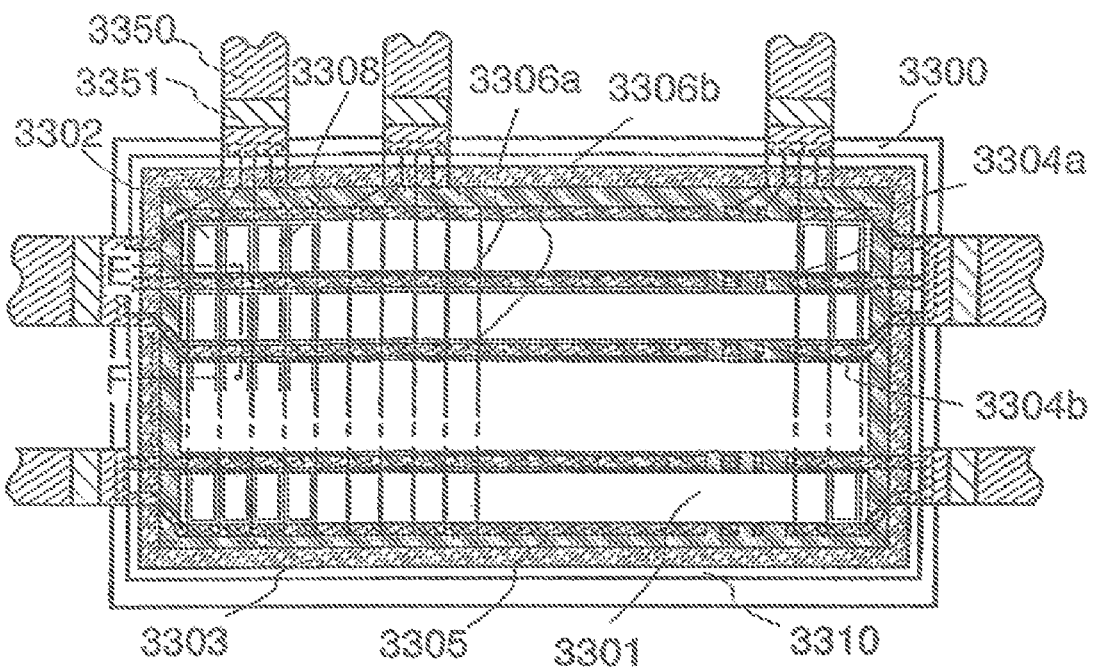
FIGS. 33A and 33B are explanatory top and cross-sectional views for a display panel according to the present invention.
Figure 33B:
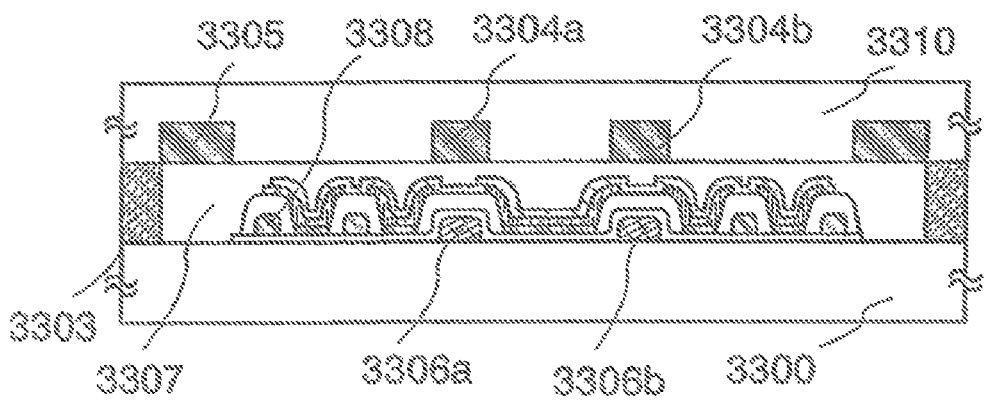

FIGS. 33A and 33B are views for showing a completed EL display panel manufactured by the present invention. FIG. 33A is a top view of the EL display panel. FIG. 33B is a cross-sectional view taken along line of E-F of FIG. 33A. In FIGS. 33A and 333, a pixel portion 3301 formed over a device substrate 3300 comprises a pixel 3302, a gate wiring layer 3306a, a gate wiring layer 3306b, and a source wiring layer 3308. The pixel portion 3301 is sealed by a sealing substrate 3310 and sealant 3303 to be fixed to the device substrate 3300. In this embodiment, a driver IC 3351 is mounted to a FPC 3350 by TAB technique.

As shown in FIGS. 33A and 33B, drying agents 3305, 3304a and 3304b are provided in the display panel to prevent deterioration of the light-emitting element due to moisture. The drying agent 3305 is formed to surround the pixel portion; and the drying agent 3304a and the drying agent 3304b are formed at a region corresponding to the gate wiring layer 3306a and the gate wiring layer 3306b. In this embodiment, drying agent is provided to a concave portion formed over the sealing substrate as shown in FIG. 33B so as not to prevent to reduce a thickness of the display panel. Drying agent is provided to a region corresponding to the gate wiring layer, and so a water absorbing area can be kept largely and a water-absorbing effect can be improved. Light extraction efficiency is not deteriorated since drying agent is provided over the gate wiring layer that does not directly emits light. In this embodiment, the display panel is filled with filler 3307. A substance having a hygroscopic property is preferably used as the filler 3307, since further better water absorbing effect can be obtained and deterioration of the light-emitting element can be prevented.

In this embodiment, an example of sealing a light-emitting element by a glass substrate is explained. Sealing treatment is treatment for protecting a light-emitting element against moisture. As a method for sealing treatment, any one of a method of sealing mechanically using a cover member, a method of sealing using thermo-setting resin or ultraviolet curing resin, or a method of sealing using a thin film having a high barrier property such as metal oxides or nitrides is used. As the cover member, glass, ceramics, plastic, or metals can be used. In the case that light is emitted through the cover member, the cover member is required to be transparent to light. The cover member and a substrate provided with the foregoing light-emitting element are pasted to each other by sealant such as thermo-setting resin or ultraviolet curing resin. It is also effective to provide absorbent as typified by barium oxide in enclosed space formed by the cover member and the substrate. The absorbent may be provided on sealant, or over a bank or the periphery thereof so as not to prevent light from the light-emitting element. The space formed by the cover member and the substrate can be filled with thermo-setting resin or ultraviolet curing resin. In this instance, it is effective to dope absorbent as typified by barium oxide into thermo-setting resin or ultraviolet curing resin.

In this embodiment, a switching TFT has a single gate structure. Alternatively, the switching TFT may have a multi gate structure such as a double gate structure. In the case that semiconductor is manufactured by SAS or crystalline semiconductor, an impurity region can be formed by doping an impurity imparting one conductivity type. In this instance, a semiconductor layer may have an impurity region having different concentration. For example, a region that is overlapped with the vicinity of a channel forming region of the semiconductor layer and the gate electrode layer may be formed to be a low concentration impurity region, whereas the outer region of the foregoing region may be formed to be a high concentration impurity region.

As noted above, a manufacturing process can be simplified by not using a light exposure process utilizing a photomask in this embodiment. In addition, even in the case of using a glass substrate of the fifth generation or later having a side of 1000 mm or more, a light-emitting device can be easily manufactured by forming various patterns directly on a substrate by droplet discharging.

According to the present invention, a desired pattern can be formed with well controllability; and loss of material can be reduced, and costs can be reduced. Therefore, a display device having high performance and high reliability can be manufactured.

Embodiment 5

This embodiment of the present invention is explained with reference to FIG. 36A to FIG. 37B. In this embodiment, a display device is manufactured by using at top gate type (forward staggered type) thin film transistor. An example of a liquid crystal display device using a liquid crystal material as a display element is explained. Through the drawing of the embodiments, same components are denoted by same numerals, and will not be further explained. FIG. 36A to FIG. 37B are cross-sectional views of the display device.

A pattern 350 formed into a fine line is formed over a substrate 300 as is the case with Embodiment 1. The pattern 350 corresponds to the pattern 57 in FIGS. 2A and 2E in Embodiment 1. The pattern 350 is formed on a low wettability region having a low wettability substance 351. The pattern 350 is crossed over the low wettability region having a low wettability substance 351 and a high wettability region (not shown) and is discharged as a composition containing a pattern formation materiel by droplet discharging. The composition having fluidity does not settle in the low wettability region due to the difference in wettability of a subject formation region, and flows partly from the boundary between the high wettability region and the low wettability region to the high wettability region. This arises from the fact that the composition containing a pattern formation material cannot sufficiently get wet in the low wettability region that has low wettability with respect to the composition containing a pattern formation material, and so the composition is difficult to be solidified and flows to the high wettability region that has higher stability than that of the low wettability region. As a result, due to the difference in fluidity and wettability with respect to the subject formation region, the composition containing a pattern formation material is changed its form into a pattern 350 to be stabilized. The pattern 350 formed on the low wettability region becomes to be a fine line since a part of the pattern 350 flows to the high wettability region.

Figure 36A:
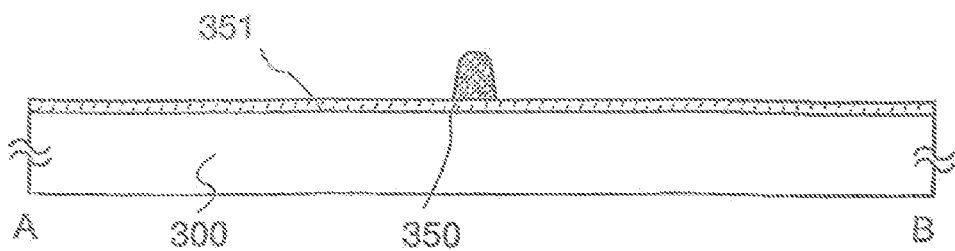
FIGS. 36A to 36E are explanatory views for a method for manufacturing a display device according to the present invention.
Figure 36B:
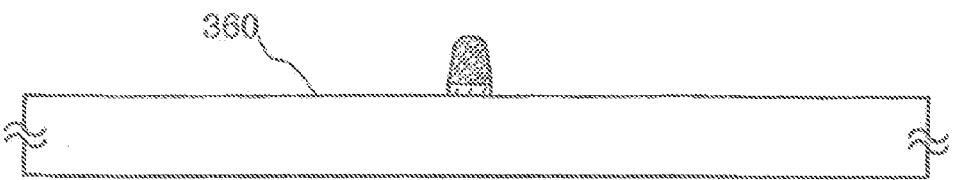
Figure 36C:
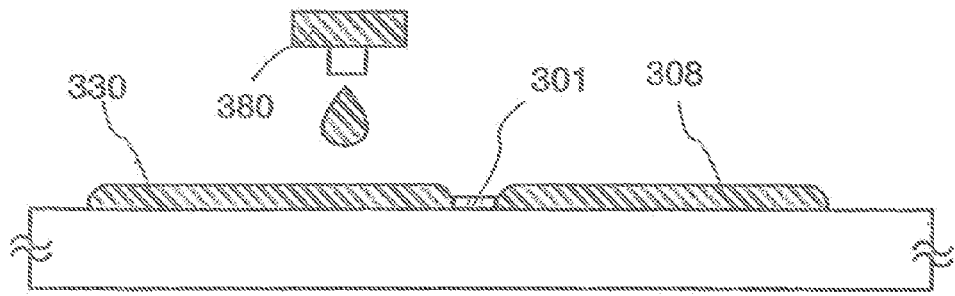

The low wettability substance 351 is removed by using the pattern 350 as a mask. As illustrated in FIG. 36B, only the low wettability substance 351 is left below the pattern 350 and the periphery thereof is a high wettability region 360. The high wettability region has high wettability and a low contact angle since it has not the low wettability substance 351. Then, only the pattern 350 is removed by etching having a high selective ratio to the low wettability substance 351. As the etching method, either dry etching or wet etching may be used. Alternatively, ashing or the like can be used as the etching method. In this instance, an etching gas or etchant, each of which has a high selective ratio to the low wettability substance and a pattern formation material is preferably used. When the pattern 350 is removed, the left low wettability substance 351 exists at the top surface of a substrate as a low wettability region 301. The low wettability region 301 has a form of a fine line since it is formed by using the pattern 350 that is formed into a fine line as a mask. A composition containing a pattern formation material is discharged as a droplet having fluidity is discharged from a nozzle 380 so as to cross the low wettability region 301 and to straddle the peripheral high wettability region 380.

The discharged composition containing a conductive material having fluidity does not settle in the low wettability region 301 due to the difference in wettability of the subject formation region, and flows from the boundary between the high wettability region 360 and the low wettability region 301 to the high wettability region 360. This arises from the fact that the composition containing a conductive material is repelled by the low wettability region 301 that has low wettability with respect to the composition containing a pattern formation material, and so the composition is difficult to be solidified and flows to the high wettability region 360 that has higher stability than that of the low wettability region 301. As a result, due to the difference in fluidity and wettability with respect to the subject formation region, the composition containing a conductive material is changed its form into such as a source electrode layer or a drain electrode 330, and a source electrode layer or a drain electrode 308 to be stabilized. Therefore, the source electrode layer or the drain electrode 330, and the source electrode layer or the drain electrode 308 can be formed finely spaced apart with good controllability, and so the source electrode layer or the drain electrode 330, and the source electrode layer or the drain electrode 308 are not in contact with each other. Accordingly, resistance between source-drain regions is reduced and the current value passing the transistor of theses layers is increased since a channel length of the semiconductor is short, and these layers are formed with good controllability. Therefore, deteriorations such as short-circuiting can be prevented. According to the present invention, wirings designed to be closely-spaced and complicated by reducing in a size and a thickness can be formed with good controllability, and so a high definition display device having high reliability can be manufactured with high yields.

An n-type semiconductor layer is formed on the source electrode layer or the drain electrode 330, and the source electrode layer or the drain electrode 308, and etched using a mask such as resist. The resist may be formed by droplet discharging. A semiconductor layer is formed over the n-type semiconductor layer and patterned by using a mask or the like. Accordingly, n-type semiconductor layers 307 and 306 are formed.

Figure 36D:
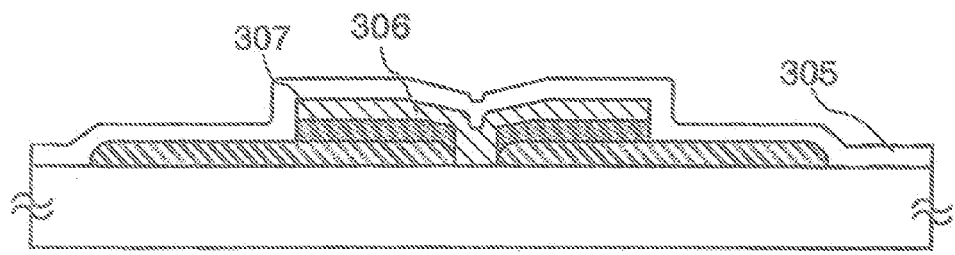

A gate insulating layer 305 is formed to have a single layered structure or a layered structure by plasma CVD or sputtering (FIG. 36D). As especially preferable mode, a three layered lamination body of an insulating layer made from silicon nitride, an insulating layer made from silicon oxide, and an insulating layer made from silicon nitride.

Figure 36E:
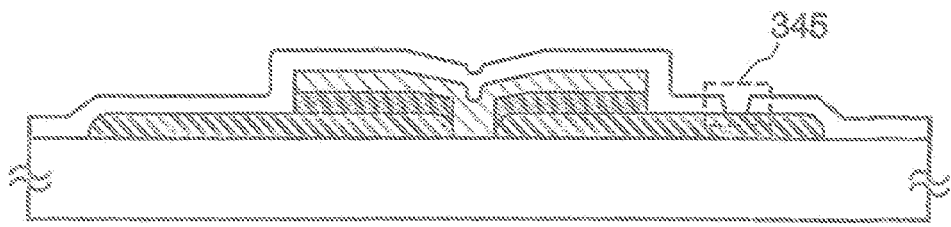

Then, a mask made from resist and the like is formed over the gate insulating layer 305, and an contact hole 345 is formed by etching the gate insulating layer 305 (FIG. 36E). In this embodiment, a mask for forming the contact hole 345 is selectively formed by droplet discharging.

A gate electrode layer 303 is formed by discharging a composition containing a conductive material from a nozzle 381 over the gate insulating layer 305. As with Embodiment 1, the gate electrode layer can be formed to be a desired shaped fine line by using the present invention. According to the present invention, resistance between source-drain regions can be further reduced and the current value passing the transistor can be further improved since a length in a channel direction of the gate electrode layer 303 can be small.

A pixel electrode layer 311 is formed by droplet discharging. The pixel electrode layer 311 and the source or drain electrode layer 308 are electrically connected to each other in the previously formed contact hole 345. The pixel electrode layer 311 can be formed by the same material as that of the first electrode layer 117. In the case that a transparent liquid crystal display panel is manufactured, a predetermined pattern is formed by using and baking a composition containing indium tin oxide (ITO), indium tin oxide containing silicon oxide (ITSO), zinc oxide (ZnO), zinc oxide ($SnO_2$), and the like.

An insulating film 312 referred to as an orientation film is formed so as to cover the pixel electrode layer 311 by printing or spin coating. The insulating layer 312 can be selectively formed by screen printing or offset printing. Thereafter, rubbing treatment is performed. Then, sealant is provided by droplet discharging to the periphery of the region provided to the pixel (not shown).

Figure 37A:
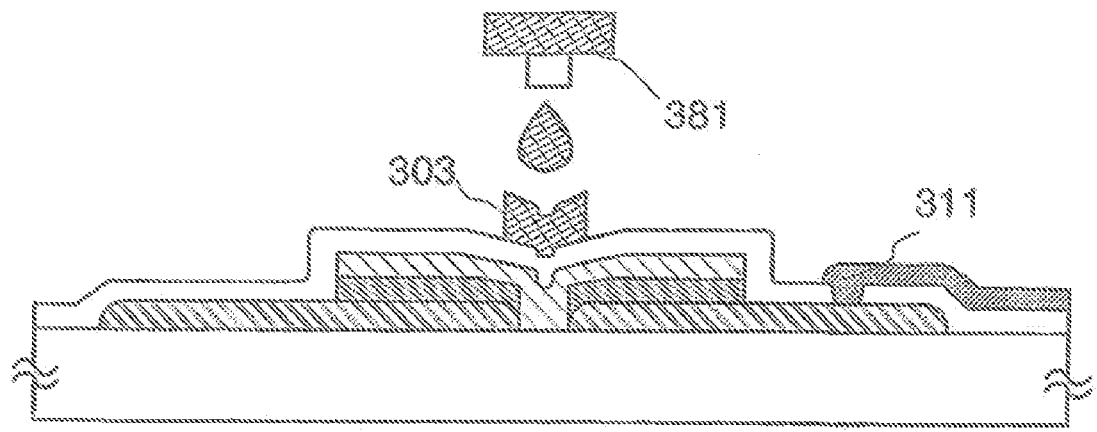
FIGS. 37A and 37B are explanatory views for a method for manufacturing a liquid crystal display device according to the present invention.
Figure 37B:
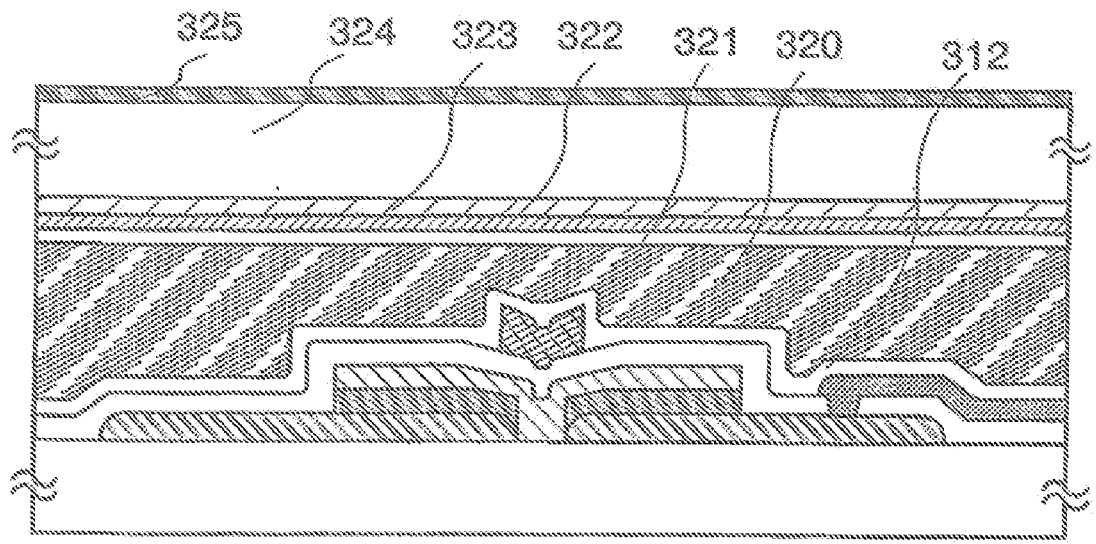

Thereafter, a liquid crystal display panel can be manufactured in accordance with the procedure, that is, an opposing substrate 324 provided with an insulating layer 321 serving as an orientation film, a colored layer 322 serving as a color filter, a conductive layer 323 serving as an opposing electrode, and a polarizing plate 325 are pasted onto the substrate 300 that is a TFT substrate via a spacer; and a liquid crystal layer 320 is provided into the space between the opposing substrate 324 and the TFT substrate 300 (FIG. 37B). The sealant may be mixed with filler, and the opposing substrate 324 may be provided with a shielding film (black matrix) and the like. Further, dispenser technique (dropping technique) or dip technique (pumping technique) by which a liquid crystal is injected by utilizing a capillary phenomenon after pasting the opposing substrate 324 can be used as a method for forming the liquid crystal layer.

Figure 39:
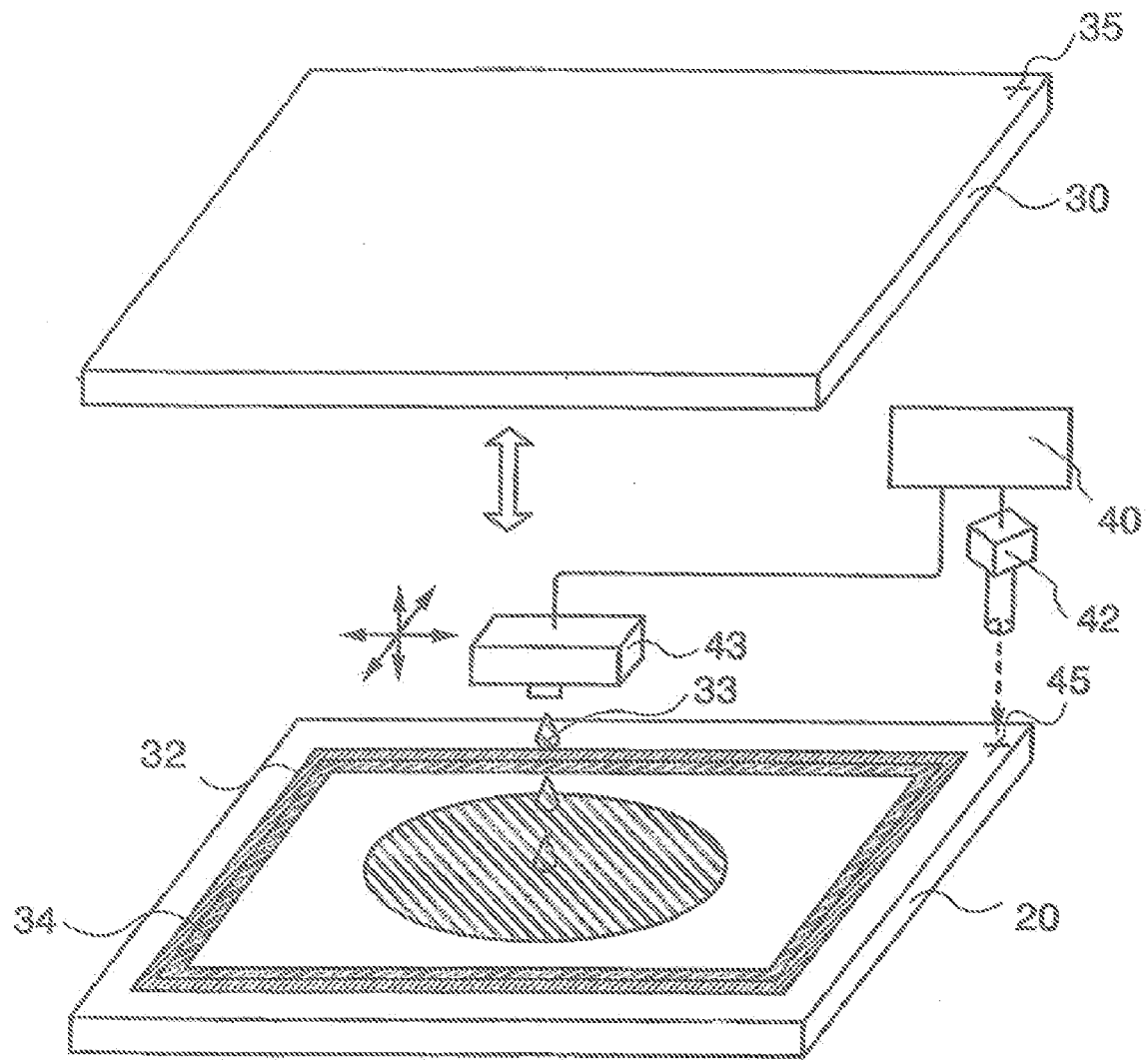
FIG. 39 is an explanatory view for a liquid crystal droplet injecting method that can be applied to the present invention.

A liquid crystal dropping and injecting method employing dispenser technique is described with reference to FIG. 39. In FIG. 39, reference numeral 40, a controller; 42, an imaging means; 43, a head; 33, liquid crystal; 35 and 45, markers; 34, a barrier layer; 32, a sealant; 30, a TFT substrate; and 20, an opposing substrate. A closed loop is formed with the sealant 32, and the liquid crystal 33 is dropped once or plural times therein from the head 43. In the case that the liquid crystal material has high viscosity, the liquid crystal material is discharged continuously and adhered to the surface in the form of a kind of ribbon. On the other hand, in the case that the liquid crystal material has low viscosity, the liquid crystal material is discharged intermittently as illustrated in FIG. 39. At this time, the barrier layer 34 is provided to prevent the sealant 32 and the liquid crystal 33 from reacting with each other. Subsequently, the substrates are attached in vacuum, and, the space between the substrate is filled with liquid crystal, then, ultraviolet curing is performed.

A connection portion is formed to connect the pixel portion formed according to the foregoing processes and an external wiring board. The insulating layer in the connection portion is removed by ashing treatment using an oxygen gas under the atmospheric pressure or pressure in proximity of the atmospheric pressure. This treatment is performed by using an oxygen gas and one or more gases of hydrogen, $CF_4$, $NF_3$, $H_2O$, and $CHF_3$. In this step, ashing treatment is performed after sealing by the opposing substrate to prevent damage or destruction due to static; however, ashing treatment may be performed at any timing when there are few effects of static. A connection wiring board is provided to make electrically connection of the wring layer via an anisotropic conductive layer therebetween. The wiring board has a function of transmitting a signal and electric potential from outside. Through the above processes, a liquid crystal display panel having a display function can be manufactured.

In this embodiment, a switching TFT has a single gate structure. Alternatively, the switching TFT may have a multi gate structure such as a double gate structure. In the case that semiconductor is manufactured by SAS or crystalline semiconductor, an impurity region can be formed by doping an impurity imparting one conductivity type. In this instance, a semiconductor layer may have an impurity region having different concentration. For example, a region that is overlapped with the vicinity of a channel forming region of the semiconductor layer and the gate electrode layer may be formed to be a low concentration impurity region, whereas the outer region of the foregoing region may be formed to be a high concentration impurity region.

As noted above, a manufacturing process can be simplified by not using a light exposure process utilizing a photomask in this embodiment. In addition, even in the case of using a glass substrate of the fifth generation or later having a side of 1000 mm or more, a light-emitting device can be easily manufactured by forming various patterns directly on a substrate by droplet discharging.

According to the present invention, a fine and fine wiring or electrode can be formed with well controllability; and so reliability can be improved, loss of material can be prevented, manufacturing yields can be improved, and costs can be reduced.

Embodiment 6

A thin film transistor is formed according to the present invention, and a display device can be manufactured by using the thin film transistor. In the case of using a light-emitting element and an n-type transistor as a transistor for driving the light-emitting element, light generated in the light-emitting element is emitted in a direction of bottom, top, or both bottom and top. A layered structure of a light-emitting element that can be applied to any of the directions is explained with reference to FIGS. 19A to 19C.

In this embodiment, a channel protective type thin film transistor 481 is used in the present invention. A channel protective film is formed by discharging polyimide, polyvinyl alcohol, or the like. As a result, an exposure process can be eliminated. As the channel protective film, a single film or a laminated film made from one kind or a plurality kinds material selected from the group consisting of an inorganic material (silicon oxide, silicon nitride, silicon oxynitride, silicon nitride oxide, and the like); a photosensitive or non-photosensitive organic material (organic resin material) (polyimide, acrylic, polyamide, polyimideamide, resist, benzocyclobutene, and the like); and a Low k material that has low dielectric constant. Alternatively, a material, which has a skeleton formed by the bond of silicon (Si) and oxygen (O), which includes at least hydrogen, and which may include one selected from the group consisting of fluoride, alkyl group, and aromatic hydrocarbon as a substituent can be used. As a manufacturing method, a vapor growth method such as a plasma CVD method or a thermal CVD method; or a sputtering method can be used. Alternatively, droplet discharging or printing (a method such as screen printing or offset printing by which a pattern can be formed) can be used. A TOF film or a SOG film obtained by coating can also be used.

Firstly, the case that light is emitted from a substrate 480, that is, bottom emission, is explained with reference to FIG. 19A. In this instance, a source or drain electrode 482, a first electrode 484, an electroluminescent layer 485, and a second electrode 486 are sequentially stacked in order to be electrically connected to a thin film transistor 481. Secondly, the case that light is emitted to the opposite side to the substrate 480, that is, top emission, is explained with reference to FIG. 19B. In this instance, a source or drain electrode 462, a first electrode 463, an electroluminescent layer 464, and a second electrode 465 are sequentially stacked in order to be electrically connected to a thin film transistor 481. In the top emission structure, even if light passes through the first electrode 463, the light is reflected by the source or drain electrode 462 and is emitted to the opposite side of the substrate 480. Lastly, the case that light is emitted to both of the substrate 480 side and the opposite side of the substrate 480, that is, dual emission, is explained with reference to FIG. 19C. In this instance, a source or drain electrode 471, a first electrode 472, an electroluminescent layer 473, and a second electrode 474 are sequentially stacked in order to be electrically connected to a thin film transistor 481. In this instance, dual emission can be realized in the case that both of the first electrode 472 and the second electrode 474 are made from a material transparent to light or formed to have thicknesses capable of transmitting light.

A light-emitting element has a structure in which the electroluminescent layer is interposed between the first electrode and the second electrode. The first electrode and the second electrode are required to be made from a selected material in consideration of a work function. In addition, each of the first electrode and the second electrode may serve as an anode or a cathode depending on a pixel structure. In this embodiment, the first electrode preferably serves as a cathode, and the second electrode preferably serves as an anode since a drive TFT has n-channel type polarity. In the case that the polarity of the drive TFT is a p-channel type, the first electrode preferably serves as an anode, and the second electrode preferably serves as a cathode.

In the case that the first electrode serves as an anode, the electroluminescent layer is preferably formed by stacking sequentially a HIL (hole injecting layer), a HTL (hole transporting layer), an EML (light-emitting layer), an ETL (electron transporting layer), and an EIL (electron injecting layer) over the anode. On the contrary, in the case that the first electrode serves as a cathode, the electroluminescent layer is preferably formed by stacking sequentially an EIL (electron injecting layer), an ETL (electron transporting layer), an EML (light-emitting layer), a HTL (hole transporting layer), a HIL (hole injecting layer), and an anode that is the second electrode over the cathode. The electroluminescent layer can be formed to have a single layered structure, or a mixed structure, in addition to a layered structure.

Each material that exhibits red (R), green (G) or blue (B) light is selectively deposited as the electroluminescence layer by vapor deposition using an evaporation mask. The material that exhibits red (R), green (G) and blue (B) can be formed by droplet discharging (low or high molecular weight material or the like) as with a color filter. The droplet discharging is preferably used since RGB patterning can be carried out without a mask.

In the case of using ITO transparent to light or ITSO transparent to light as the second electrode in the top emission structure, BzOS—Li or the like that is formed by doping Li into benzoxazole derivatives can be used. Further, $Alq_3$ doped with dopant (DCM or the like in the case of R, DMQD in the case of G, or the like) that corresponds to each emission color of R, G, and B can be used as the electroluminescent layer (EML). A material of the electroluminescent layer (EML) is not limited to the foregoing materials. For example, a hole injecting property can be improved by co-evaporation of oxides such as molybdenum oxide (MoOx: x=2 to 3) or the like, instead of using CuPc or PEDOT, and α-NPD or rubrene. In such a way, an organic material (containing low molecular weight or high molecular weight material) or a composite material of an organic material and an inorganic material can be used as the electroluminescent material. Hereinafter, a material for forming a light-emitting element is explained in detail.

Among charge injecting transporting substances, as a material having especially a high carrier transporting property, especially, a material having a high electron transporting property, for example, a metal complex or the like having a quinoline skeleton or a benzoquinoline skeleton such as tris (8-quinolinolate) aluminum (abbreviated $Alq_3$), tris(5-methyl-8-quinolinolate) aluminum (abbreviated $Almq_3$), bis(10-hydroxybenzo[h]-quinolinato) beryllium (abbreviated $BeBq_2$), or bis(2-methyl-8-quinolinolato)-4-phenylphenolato-aluminum (abbreviated BAlq). As a material having a high hole transporting property, for example, aromatic amine (that is, the one having a benzene ring-nitrogen bond) based compounds such as 4,4'-bis[N-(1-naphthyl)-N-phenyl-amino]-biphenyl (abbreviated α-NPD), 4,4-bis[N-(3-methylphenyl)-N-phenyl-amino]-biphenyl (abbreviated TPD), 4,4',4"-tris(N,N-diphenyl-amino)-triphenyl amine (abbreviated TDATA), and 4,4',4"-tris[N-(3-methylphenyl)-N-phenyl-amino]-triphenylamine (abbreviated MTDATA).

Among charge injecting transporting substances, as a material having a high carrier injecting property, especially, a material having a high electron injecting property, a compound of an alkali metal or an alkali earth metal such as lithium fluoride (LIF), cesium fluoride (CsF), calcium fluoride ($caF_2$), or the like can be used. Besides, a mixture of a material having a high electron transportation property such as $Alq_3$ and an alkali earth metal such as magnesium (Mg). Among charge injecting transporting substances, as a material having a high hole injecting property, for example, metal oxide such as molybdenum oxide (MoOx), vanadium oxide (VOx), ruthenium oxide (RuOx), tungsten oxide (WOx), manganese oxide (MnOx), or the like can be used. Besides, a phthalocyanine compound such as phthalocyanine (abbreviated $H_2PC$) or copper phthalocyanine (CuPc) can be used.

A light-emitting layer may have the structure in which each of light-emitting layers having different emission wavelength bands is respectively provided to each pixel for color display. Typically, light-emitting layers corresponding to color of R (red), G (green), and B (blue) are formed. In this instance, color purity can be improved and a pixel portion can be prevented from being a mirror surface (reflection) by providing a filter (colored layer) transparent to light in each emission wavelength region at the light emission side of the pixel. By providing the filter (colored layer), a circularly-polarized light plate or the like that is conventionally required becomes not required, further, light can be emitted from the light-emitting layer without loss of light. Moreover, color changes occurred in the case of viewing obliquely the pixel portion (display screen) can be further reduced.

There are various light-emitting materials. As a low molecular based organic light-emitting material. 4-dicyanomethyl-ene-2-methyl-6-(1,1,7,7-tetramethyljulolidyl-9-enyl)-4H-pyran (abbreviated DCJT), 4-dicyanomethylene-2-t-butyl-6-(1,1,7,7-tetramethyljulolidyl-9-enyl)-4H-pyran (abbreviated DPA), periflanthene, 2,5-dicyano-1,4-bis(10-metoxy-1,1,7,7-tetramethyljulolidyl-9-enyl)benzene, N,N'-dimethylquina-cridone (abbreviated DMQd), coumarin 6, coumarin 545T, tris(8-quinolinolato)aluminum (abbreviated $Alq_3$), 9,9'-biantrile, 9,10-diphenylantracene (abbreviated DPA), 9,10-bis (2-naphtyl)anthracene (abbreviated DNA), or the like can be used. Another material may be used.

A high molecular organic light-emitting material has higher physical strength than that of a low molecular organic light-emitting material, and so a light-emitting element can be manufactured to have high durability. A light-emitting element can be comparatively readily manufactured since a light-emitting layer can be formed by coating. A structure of a light-emitting element using a high molecular based organic light-emitting material is basically same as that of a light-emitting element using a low molecular organic light-emitting material. The structure is formed by stacking sequentially a cathode, an organic light-emitting layer, and an anode. However, it is difficult to form a layered structure, which is formed when using a high molecular organic light-emitting material, in the case of using a low molecular organic light-emitting material. Specifically, a structure formed by stacking sequentially a cathode, a light-emitting layer, a hole transporting layer, and an anode.

Since emission color is dependent on a material for forming a light-emitting layer. By selecting the material, a light-emitting element that exhibits desired light emission can be formed. As a high molecular based electroluminescent material, a polyparaphenylene vinylene based material, a polyparaphenylene based material, polythiophene based material, or a polyfluorene based material can be used.

As the polyparaphenylene vinylene material, a derivative of poly(paraphenylene vinylene) [PPV], poly(2,5-dialkoxy-1,4-phenylen vinylene) [RO-PPV], poly(2-(2'-ethyl-hexoxy)-5-methoxy-1,4-phenylene vinylene) [MEH-PPV], poly (2-dialkoxyphenyl)-1,4-phenylenevinylene) [ROPh-PPV], and the like are used. As the polyparaphenylene material, a derivative of polyparaphenylene [PPP], poly(2,5-dialkoxy-1,4-phenylene) [RO-PPP], poly(2,5-dihexoxy-1,4-phenylene), and the like are used. As the polythiophene material, a derivative of polythiophene [PT], poly(3-alkylthiophene) [PAT], poly(3-hexylthiophene) [PHT], poly(3-cyclohexylthiophene) [PCHT], poly(3-cyclohexyl-4-methylthiophene) [PCMHT], poly(3,4-dicyclohexylthiophene) [PDCHT], poly [3-(4-octylphenyl)-thiophene][POPT], poly[3-(4-octylphenyl)-2,2-bithiophene][PTOPT], and the like are used. As the polyfluorene material, a derivative of polyfluorene [PF], poly (9,9-dialkylfluorene) [PDAP], poly(9,9-dioctylfluorene) [PDOF], and the like are used.

An injecting property of holes from the anode can be improved by interposing a high molecular weight organic light-emitting material having a hole transporting property between the anode and a high molecular weight organic light-emitting material having a light-emitting property. Generally, the high molecular weight organic light-emitting material having a hole transporting property and an acceptor material dissolved in water is coated by spin coating. The high molecular weight organic light-emitting material having a hole transporting property is not dissolved in organic solvent, accordingly, the material can be stacked over the organic light-emitting material having a light-emitting property. As the high molecular weight organic light-emitting material having a hole transporting property, mixture of PEDOT and camphoric sulfonic acid (CSA) as an acceptor material, mixture of polyaniline [PANI] and polystyrene sulfonic acid [PSS] as an acceptor material, and the like can be used.

The light-emitting layer can be formed to exhibit mono emission color or white emission color. In the case of using a white emission material, color display can be realized when a color filter that transmits light at a specified wavelength is provided at the side of light emission of a pixel.

To form a light-emitting layer that exhibits white emission, for example, $Alq_3$, $Alq_3$ partly doped with Nile red, p-EtTAZ, TPD (aromatic diamine) are deposited sequentially by vapor deposition. In the case that the light-emitting layer is formed by spin coating, the material is preferably baked by vacuum heating after being coated. For example, poly(ethylene dioxythiophene)/poly(styrene sulfonate) solution (PEDOT/PSS) may be coated over a whole surface, and baked, and polyvinylcarbazole (PVK) doped with pigments (1,1,4,4-tetraphenyl-1,3-butadiene (abbreviated TPB), 4-dicyanomethylene-2-methyl-6-(p-dimethylamino-styryl)-4H-pyran (DCM1), Nile red, coumarin 6, or the like) may be coated over a whole surface and baked.

The light-emitting layer may be formed by a single layer besides a multilayer as mentioned above. In this instance, the light-emitting layer may be made from polyvinylcarbazole (PVK) dispersed with a 1,3,4-oxadiazole derivative (PBD). Further, white emission can be obtained by dispersing PBD of 30 weight % and dispersing an appropriate amount of four kinds of pigments (TPB, coumarin 6, DCM1, and Nile red). In addition to the light-emitting element that exhibits white emission as explained in the foregoing, a light-emitting element that can exhibit red emission, green emission, blue emission can be manufactured by selecting approximately a material of a light-emitting layer.

An injecting property of holes from the anode can be improved by interposing a high molecular weight organic light-emitting material having a hole transporting property between the anode and a high molecular weight organic light-emitting material having a light-emitting property. Generally, the high molecular weight organic light-emitting material having a hole transporting property and an acceptor material dissolved in water is coated by spin coating. The high molecular weight organic light-emitting material having a hole transporting property is not dissolved in organic solvent, accordingly, the material can be stacked over the organic light-emitting material having a light-emitting property. As the high molecular weight organic light-emitting material having a hole transporting property, mixture of PEDOT and camphoric sulfonic acid (CSA) as an acceptor material, mixture of polyaniline [PANI] and polystyrene sulfonic acid [PSS] as an acceptor material, and the like can be used.

Besides the foregoing singlet excited light-emitting material, a triplet excited material containing a metal complex or the like can be used for the light-emitting layer. For example, among a red emitting pixel, a green emitting pixel, and a blue emitting pixel; a red emitting pixel having comparative short half-brightness life is formed by a triplet excited light-emitting material and the other are formed by singlet excited light-emitting materials. The triplet excited light-emitting material has a characteristic that it requires lower power consumption than that of the singlet excited light-emitting material to obtain a certain level of luminance since the triplet excited light-emitting material has high luminous efficiency. In the case that the triplet excited light-emitting material is used for forming the red emitting pixel, the reliability can be improved since the light-emitting element requires a small amount of current. To reduce power consumption, the red emitting pixel and the green emitting pixel may be formed by the triplet excited light-emitting material, and the blue emitting pixel may be formed by a single excited light-emitting material. The power consumption of a green light-emitting element that has high visibility for human can be reduced by using the triplet excited light-emitting material for forming the green light-emitting element.

As an example for the triplet excited light-emitting material, a material using a metal complex as a dopant such as a metal complex including platinum that is the third transition element as a central metal or a metal complex including iridium as a central metal is well known. The triplet excited light-emitting material is not limited to these compounds. A compound that has the foregoing structure and that has an element belonging 8 to 10 groups in the periodic table as a central metal can be used.

Above mentioned materials for forming the light-emitting layer are illustrative only. The light-emitting element can be formed by stacking each functional layer such as a hole injecting-transporting layer, a hole transporting layer, a charge injecting-transporting layer, an electron transporting layer, a light-emitting layer, an electron blocking layer, and a hole blocking layer. A mixed layer or mixed junction of the foregoing layers may be formed. The structure of the light-emitting layer is capable of being varied. Therefore, instead of providing a specified electron injecting region or light emitting region, modifications of the structure such as providing an electrode in order to be used for the electron injecting region or the light emitting region, or providing a dispersed light-emitting material can be allowed unless otherwise such modifications depart from the scope of the present invention.

The light-emitting element formed by the foregoing materials emits light under forward bias. A pixel of a display device formed by using the light-emitting element can be driven by either a passive matrix driving technique or an active matrix driving technique. At any rate, each pixel is emitted by applying forward bias at a specified timing. Further, the respective pixels are in non-emission state for a certain period. The reliability of the light-emitting element can be improved by applying reverse bias in the non-emission state. The light-emitting element may be in a deterioration mode of lowering emission intensity under a regular driving condition or may be in a deterioration mode of lowering apparently luminance due to the expansion of a non-emission region within the pixel. The deterioration progression can be delayed by AC driving to apply forward bias and reverse bias, which leads to the improvement of the reliability of the light-emitting device.

Figure 19A:
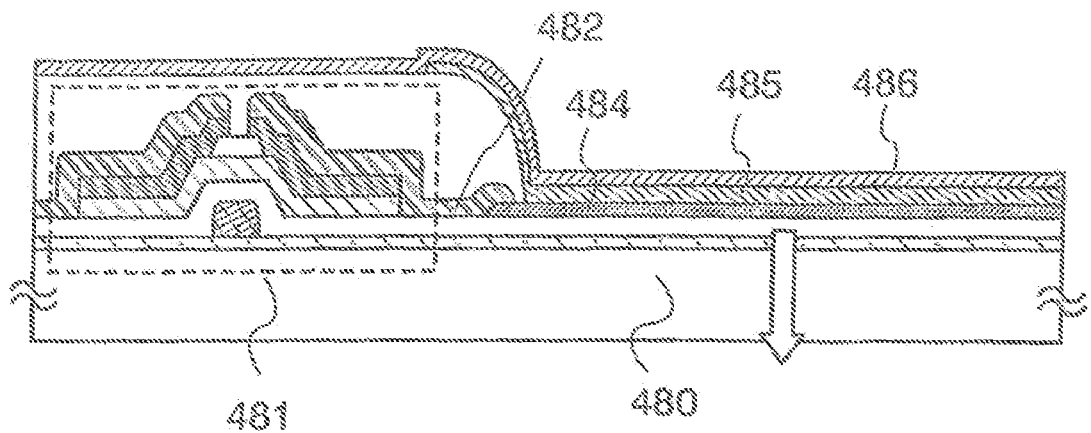
FIGS. 19A to 19C are cross-sectional views of a display device according to the present invention.
Figure 19B:
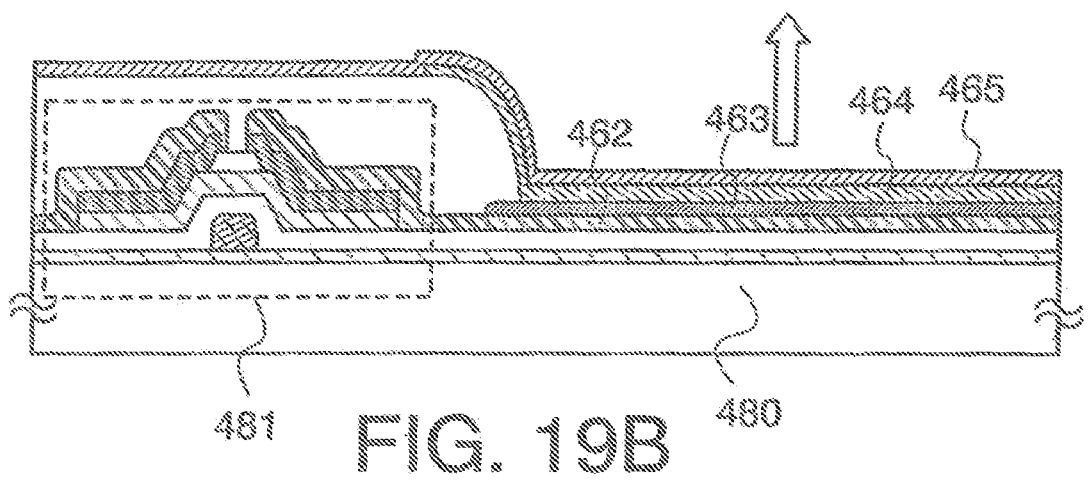
Figure 19C:
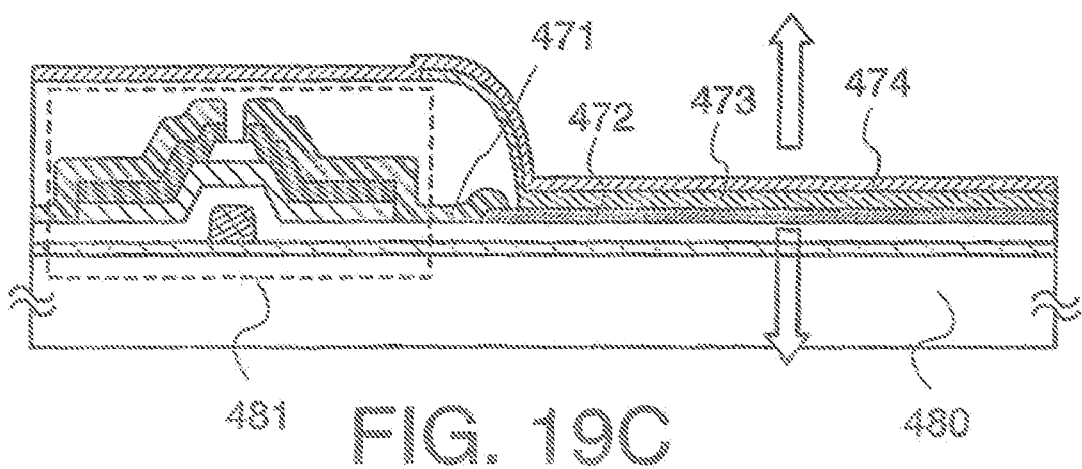

Although not shown in FIGS. 19A to 19C, a filter (colored layer) may be provided to the opposing substrate of the substrate 480. The filter (colored layer) can be formed by droplet discharging. In this instance, laser light irradiation treatment or the like can be applied as the foregoing base pretreatment. By the base film according to the present invention, the filter can be formed with good adhesiveness into a desired pattern. By using a filter (colored layer), high definition display can be realized, since a broad peak in an emission spectrum of each RGB can be corrected into a sharp peak by the filter (colored layer).

As noted above, the formation of a material that exhibits RGB is explained. Full color display can be realized by forming a material that exhibits mono emission color to be combined with a color filter or a color conversion layer. The color filter (colored layer) or the color conversion layer may be formed, for example, over a second substrate (sealing substrate) and pasted onto another substrate. Further, as mentioned above, all of the material exhibiting monochromatic emission, the color filter (colored layer), and the color conversion layer can be formed by droplet discharging.

Needless to say, monochromatic emission display can be performed. For example, a light-emitting display device can be formed by utilizing monochromatic emission. A passive matrix type display portion is suitable for the display device utilizing monochromatic emission. The display device can display mainly texts or symbols.

In the foregoing structure, a material having a small work function can be used to form the cathode. For example, Ca, Al, CaF, MgAg, AlLi, and the like are preferably used. Further, the light-emitting layer may be formed by a singlet material, a triplet material, combined material of the two materials, or a charge injecting-transporting material containing an organic compound and an inorganic compound; and a light-emitting material. The light-emitting layer may include a layer made from one kind or a plurality kinds selected based on its molecularity from the group consisting of a low molecular weight organic compound, an intermediate molecular weight organic compound (that can be defined that an aggregate of an organic compound which does not have subliming property or dissolving property (preferably, an aggregate which has molecularity of 20 or less), or an organic compound which has a molecular chain length of 10 µm of less), and a high molecular weight organic compound, and an inorganic compound having a charge injecting-transporting property or a hole injecting transporting property can be combined with the light-emitting layer. The first electrode 484, the first electrode 463, and the first electrode 472 are formed by a transparent conductive film that transmits light. For example, ITO, ITSO, or a transparent conductive film formed by mixing indium oxide to 2 to weight 20% of zinc oxide (ZnO) is used. Before forming the first electrode 484, the first electrode 463, and the first electrode 472, plasma treatment in the presence of oxygen or heat treatment under vacuum atmosphere is preferably performed. A partition wall (also referred to as a bank) is made from a material containing silicon, an organic material, and a compound material. Further, a porous film can also be used for the bank. The bank is preferably formed by a photosensitive material or non-photosensitive material such as acrylic or polyimide, since the bank 34 is formed to have a curved edge portion having a radius of curvature varying continuously, and an upper thin film of the bank can be formed without step cut. This embodiment can be freely combined with the foregoing embodiments.

Embodiment 7

In a display panel manufactured according to Embodiments 4 to 6, a driver circuit at the side of a scanning line can be formed over a substrate 3700 by forming a semiconductor layer by semiamorphous semiconductor (SAS) as explained with reference to FIG. 29B.

Figure 25:
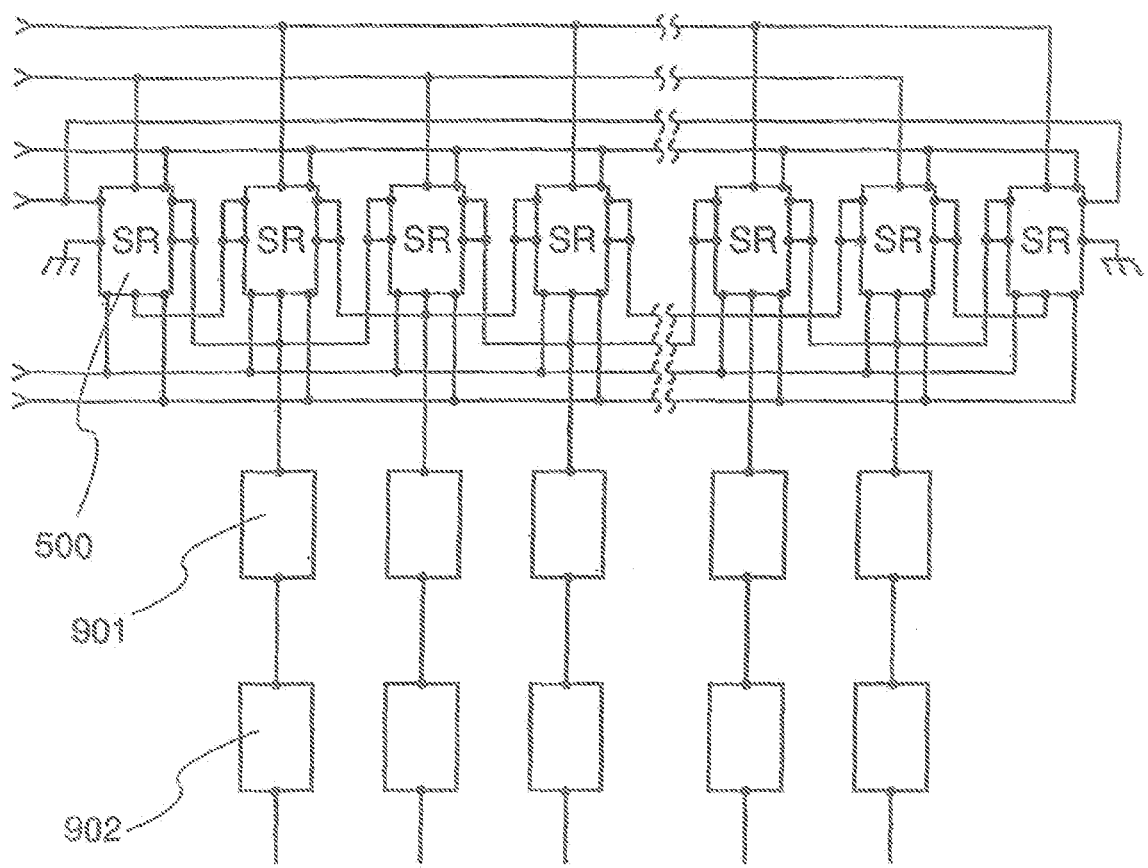
FIG. 25 is an explanatory view for a circuit structure in the case that a scanning line side driver circuit is formed using a TFT in a display panel according to the present invention.

FIG. 25 is a block diagram of a scanning line driver circuit composed of n-channel TFTs using semiamorphous silicon (SAS) from which electric field effective mobility of from 1 to 15 cm$^2$/Vsec can be obtained.

In FIG. 25, a block denoted by reference numeral 500 corresponds to a pulse output circuit that outputs one stage of a sampling pulse. A shift resister is composed of n numbers of pulse output circuits. Reference numeral 901 denotes a buffer circuit. A pixel 902 is connected to the tip of the buffer circuit.

Figure 26:
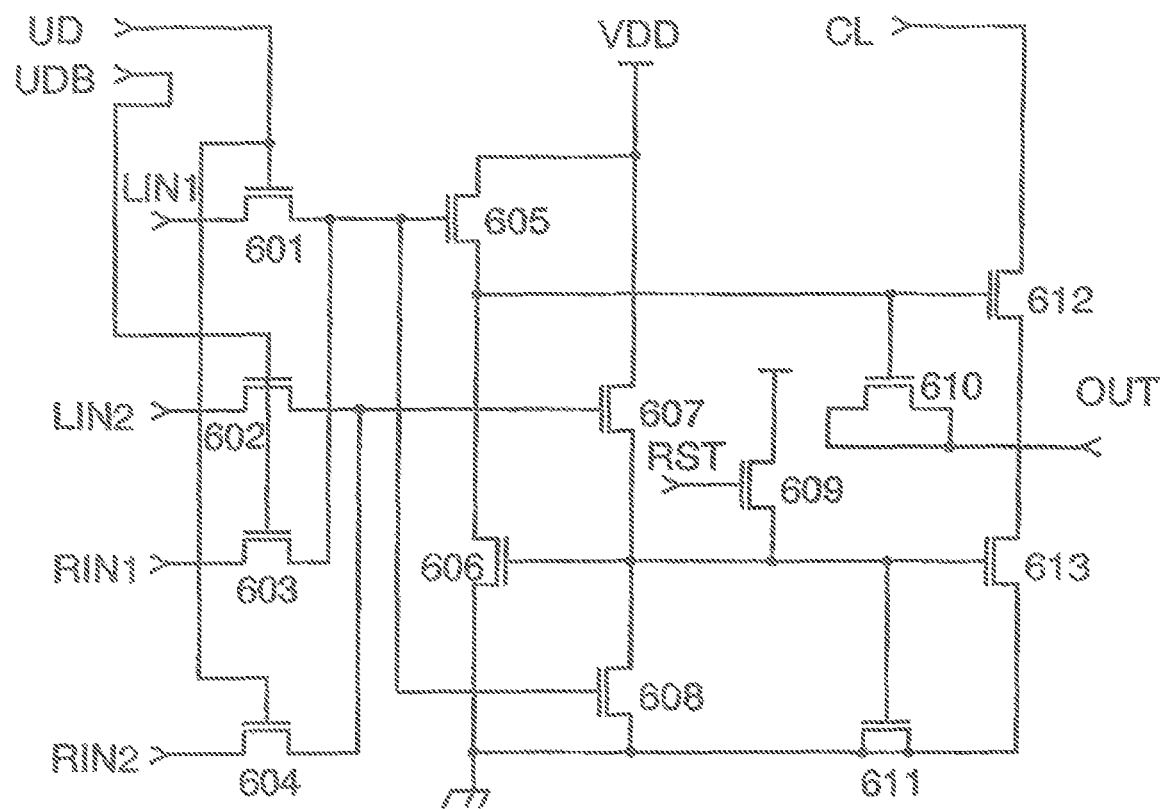
FIG. 26 is an explanatory view for a circuit structure in the case that a scanning line side driver circuit is formed by a TFT in a display panel according to the present invention (shift resistor circuit)

FIG. 26 illustrates a specific configuration of the pulse output circuit corresponding to a block 500, which is composed of n-channel TFTs 601 to 613. The sizes of the TFTs may be determined in consideration of operating characteristics of the n-channel TFTs using semiamorphous semiconductor (SAS). For example, if the channel length is 8 µm, the channel width can be set in the range of 10 to 80 µm.

Figure 27:
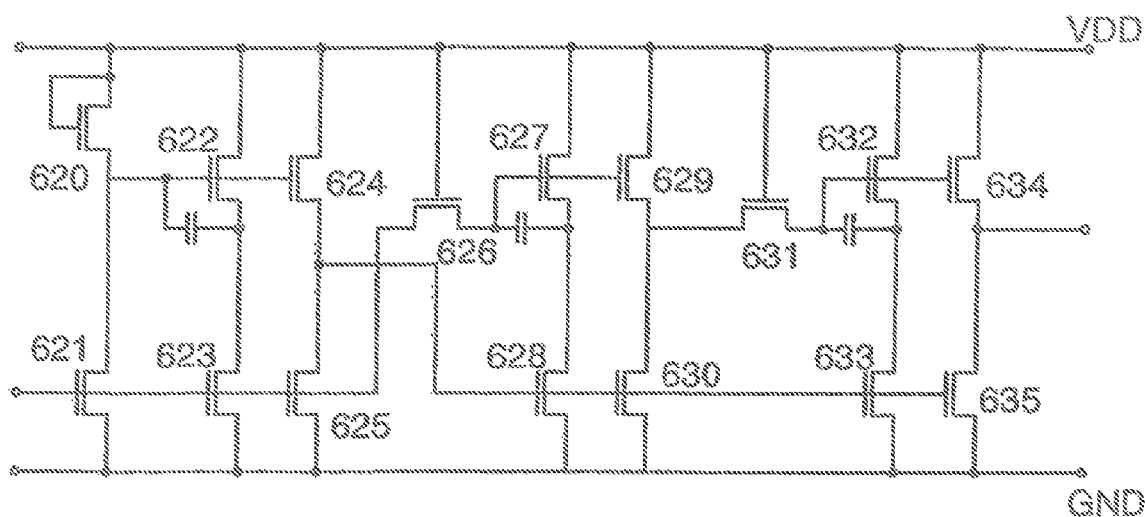
FIG. 27 is an explanatory view for a circuit structure in the case that a scanning line side driver circuit is formed by a TFT in a display panel according to the present invention (buffer circuit)

FIG. 27 illustrates a specific configuration of the buffer circuit 901. The buffer circuit is also composed of n-channel TFTs 620 to 635. The sizes of the TFTs may be determined in consideration of operating characteristics of the n-channel TFTs using semiamorphous semiconductor (SAS). For example, if the channel length is 10 µm, the channel width can be set in the range of 10 to 1800 µm. According to the present invention, a pattern can be formed into a desired shape with good controllability, such a fine wiring having a channel width of 10 µm can be stably formed without breaking.

Figure 31:
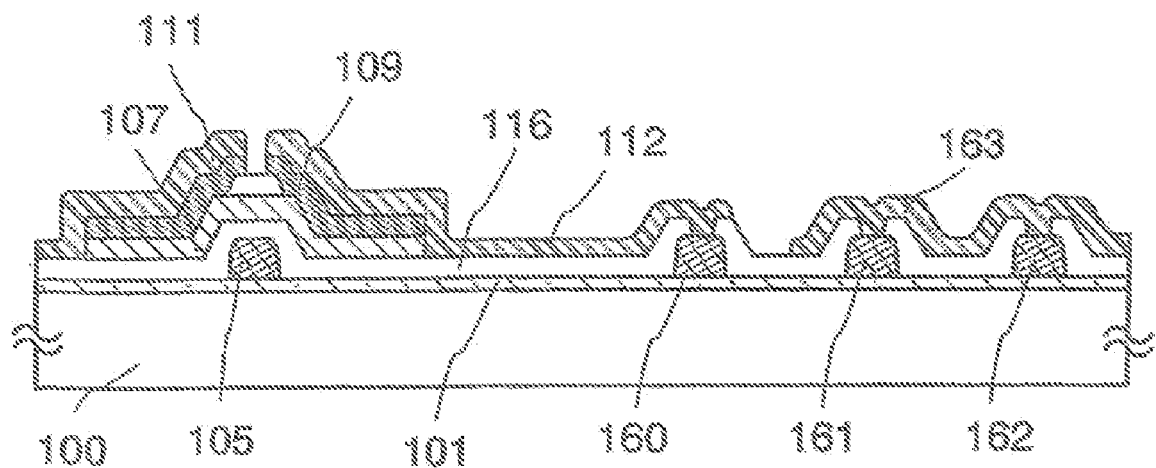
FIG. 31 is an explanatory view for a method for manufacturing a display device according to the present invention.

To realize such the circuit, it is required that TFTs are connected to each other by wirings. FIG. 31 illustrates an example of the structure of the wirings in that case. FIG. 31 illustrates, as with Embodiment 4, that a gate electrode layer 105, a gate insulating layer 116 (a laminated body composed of an insulating layer made from silicon nitride, an insulating layer made from silicon oxide, and an insulating layer made from silicon nitride), a semiconductor layer 107 made from SAS, an n-type semiconductor layer 109 for forming a source region and a drain region, source and drain electrode layers 111, and source and drain electrode layers 112 are formed. In this instance, a connecting wiring layer 160, a connecting wiring layer 161, and a connecting wiring layer 162 are formed in accordance with the same procedure as that of a gate electrode layer 105 over a substrate 100. Then, a part of the gate insulating layer 116 is etched to expose the connecting wiring layers 160 to 162. TFTs are connected using source and the electrode layers 111 and 112 and a connecting wiring layer 163 formed by the same process as the electrode layers 111 and 112, and various circuits are formed by connecting the TFTs appropriately.

Embodiment 8

An example of mounting a driver circuit to an EL display panel that is manufactured according to Embodiments 4 to 7 is explained in this example.

A display device adopting COG technique is explained with reference to FIG. 30A. A pixel portion 2701 for displaying information such as texts or images is provided over a substrate 2700. A substrate provided with a plurality of driver circuits is divided into a rectangular shape. The divided driver circuits also referred as a driver IC or an IC chip (hereinafter, driver IC) 2751 are mounted over the substrate 2700. FIG. 30A shows a mode of mounting an FPC 2750 each on tip of a plurality of the driver ICs 2751. Alternatively, the substrate provided with a plurality of driver circuits is divided to have the same sizes as that of a length of the signal line side of the pixel portion, and the FPC may be mounted on a tip of a single driver IC.

TAB technique may be used. In this instance, a plurality of tapes are pasted to be mounted with a driver IC as illustrated in FIG. 30B. As is the case with COG technique, a single driver IC may be mounted to a single tape. In this instance, a piece of metal for securing the driver IC is preferably pasted to the driver IC in consideration of intensity.

A plurality of the driver ICs to be mounted on display panels is preferably formed over a rectangular substrate having a side of from 300 mm to 1000 mm or more from a viewpoint of improving productivity.

That is, a plurality of circuit patterns respectively having a unit composed of a driver circuit portion and an input output terminal is formed over a substrate and the substrate is divided to be taken out the circuit pattern from the substrate. The driver IC may be formed to have a longer side of 15 to 80 mm and a short side of 1 to 6 mm, or to have a length that corresponds to one side of a pixel region, or a length of adding one side of the pixel portion to one side of each driver circuit.

The number of a driver IC having a longer side of from 15 to 80 mm that is required to be mounted to a pixel portion is less than that using small driver IC, which leads to improve manufacturing yields. In the case of forming a driver IC over a glass substrate, the productivity is not deteriorated since the driver IC is not limited by the substrate shape used as a maternal substrate. This is a great advantage over a driver IC that is taken out from a circular silicon wafer.

In the case that a scanning line driver circuit 3702 is integrally formed over a substrate as illustrated in FIG. 29B, a driver IC provided with a driver circuit at the side of a signal line is mounted to an outside region of a pixel portion 3701. These driver ICs are driver circuits at the side of a signal line. To form a pixel region corresponding to RGB full color, the number of signal line of 3072 is required in an XGA class, whereas the number of signal line of 4800 is required in an UXGA class. Signal lines composed of the number of signal lines are divided into several blocks at the edge of the pixel region 3701 to form lead lines, and gathered along with the pitch of an output terminal of the driver ICs.

The driver IC is preferably formed by crystalline semiconductor formed over a substrate, and the crystalline semiconductor is preferably formed by laser light irradiation of continuous emission. Therefore, a solid or gas laser of continuous emission is used as an oscillator for producing the laser light. In the case of using a laser of continuous emission, a transistor with a few crystal defects can be manufactured by using a polycrystalline semiconductor layer having a large grain size. High speed driving is possible since mobility or response speed is favorable, and high operating frequency can be more improved than that of the conventional device, moreover, high reliability can be obtained since variations of characteristics are less. In order to further improve the operating frequency, the channel length direction of the transistor is preferably conformed to the scanning direction of the laser light. This is due to the fact that the highest mobility can be obtained when the channel length direction of the transistor and the scanning direction of the laser light are almost in parallel with each other (preferably −30° to 30°) in a process of laser crystallization using a continuous emission laser. Further, the term as used herein "channel length direction" refers to a direction of flowing current, that is, a direction of moving charges in a channel formation region. The transistor manufactured in this way has an active layer composed of a polycrystalline semiconductor layer, which means that a crystal grain boundary is formed almost along with the channel direction.

To perform laser crystallization, laser light is preferably narrow down drastically to have a beam spot width of approximately 1 to 3 mm that is the same as the width of a shorter side of a driver IC. Further, to secure sufficient and efficient energy density, the irradiation region of laser light is preferably a linear shape. As used herein, the term "linear shape" does not refer to line in a strict sense, but an oblong shape or prolate ellipsoid shape having a large aspect ratio such as 2 or more aspect ratio (preferably 10 to 10000). A method for manufacturing a display device with improved productivity can be provided by forming the beam spot width of laser light to have the same length of a shorter side of a driver IC.

As both the scanning line driver circuit and the signal line driver circuit, driver ICs can be mounted as illustrated in FIGS. 30A and 30B. In this instance, the specification of the drive ICs used at the side of the scanning line is preferably different from that of the drive ICs used at the side of the signal line.

In the pixel region, signal lines and scanning lines are crossed with each other to from a matrix configuration, and transistors are provided corresponding to each the crossing portion. According to the present invention, as a transistor provided to the pixel region, a TFT having a channel portion of amorphous semiconductor or semiamorphous semiconductor is used. The amorphous semiconductor is formed by plasma CVD, sputtering, or the like. The semiamorphous semiconductor can be formed at temperature of 300° C. or less by plasma CVD. The semiamorphous semiconductor has an advantage of being formed to have a thickness required to form a transistor in a small amount of time even if a non alkali glass substrate having outside dimension of 550×650 mm is used. Such manufacturing technique is effective to manufacture a large screen display device. By forming the channel formation region by semiamorphous semiconductor, the semiamorphous TFT can obtain electron field effect mobility of 1 to 15 $cm^2$/Vsec. According to the present invention, a pattern can be formed into a desired shape with good controllability, and a wiring having a short channel length can be stably formed without breaking. In addition, a TFT having an electric property capable of functioning pixels sufficiently can be formed. Accordingly, the TFT can be used as a switching element or an element for composing a driver circuit at the side of a scanning line. Therefore, a display panel that realizes system on panel can be manufactured.

The scanning line driver circuit is integrally formed over the substrate by using a TFT that is formed by a semiconductor layer made from semiamorphous semiconductor. In the case of using a TFT having a semiconductor layer made from semiamorphous semiconductor, both of the scanning line driver circuit and the signal line driver circuit are mounted to the driver IC.

In this instance, the specifications of the driver ICs used at a scanning line and a signal line are preferably different with each other. The operating frequency is 100 kHz or less and high speed operation is comparatively not required despite the fact that the transistor composing the driver IC at the scanning line side is required to have, for example, withstand pressure of approximately 30 V. Therefore, the channel length (L) of the transistor composing a driver at the scanning line side is preferably set sufficiently large. On the other hand, although withstand pressure of approximately 12 V is sufficient for the transistor of a driver IC, it is required to operate at high speed since the operating frequency is approximately 65 MHz at 3 V. Accordingly, the channel length and the like of the transistor composing a driver are preferably set by a micron rule.

A method for mounting a driver IC is not especially limited, and a known COG method, a wire bonding method, or a TAB method can be used.

By forming the driver IC to have the same thickness as that of an opposing substrate, the height of them becomes almost the same, which leads to reduce the thickness of the display device. By manufacturing the respective substrates by the same materials, heat stress is not occurred even if variation in temperature is arisen in the display device and the characteristics of a circuit formed by a TFT are not damaged. Besides, the number of driver ICs mounted to one pixel region can be reduced by mounting a driver circuit with a drive IC that is longer than an IC chip.

As noted above, a driver circuit can be installed in a display panel.

Embodiment 9

The structure of a pixel of a display panel is explained with reference to equivalent circuits illustrated in FIGS. 32A to 32F in this embodiment.

Figure 32A:
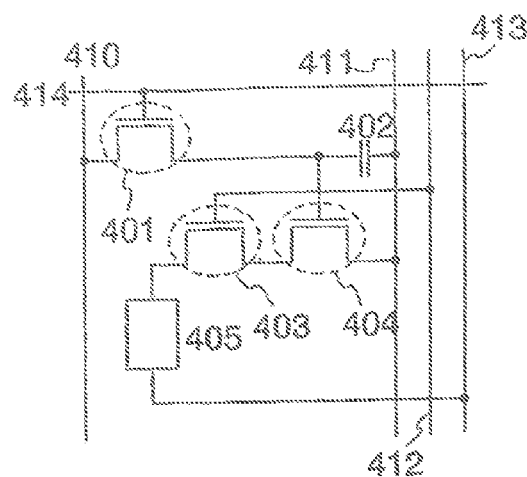
FIGS. 32A to 32F are explanatory circuit diagrams for structures of pixels that can be applied to EL display panels according to the present invention.

A pixel illustrated in FIG. 32A is provided with a signal line 410 and power line 411 in row direction, and a scanning line 414 in column direction. The pixel includes a TFT 401 serving as a switching TFT, a TFT 403 serving as a drive TFT, a TFT 404 serving as a current control TFT, a capacitor element 402, and a light-emitting element 405.

Figure 32B:
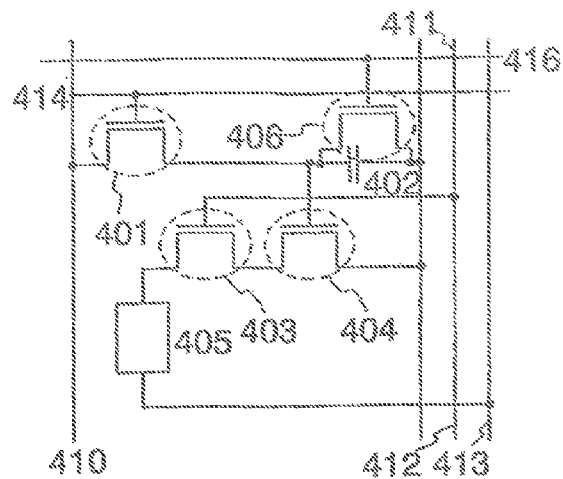
Figure 32C:
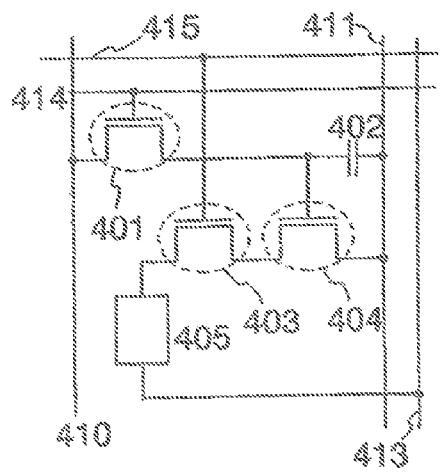
Figure 32D:
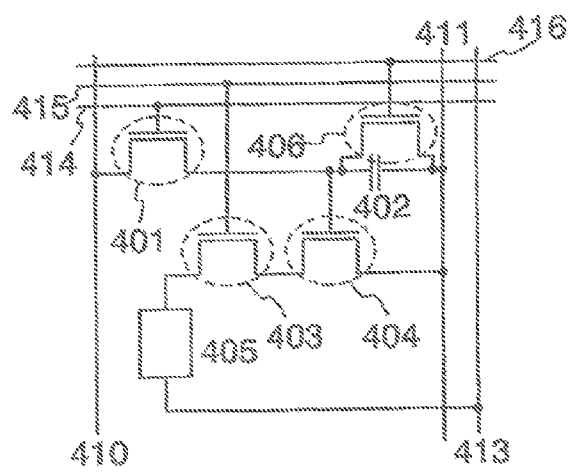

A pixel illustrated in FIG. 32C has the same structure as that of the pixel illustrated in FIG. 32A except the point that a gate electrode of a TFT 403 is connected to a power line 415 arranged in row direction. That is, both pixels illustrated in FIGS. 32A and 32C show the same equivalent circuit diagrams. However, in the case of arranging the power line 412 in row direction (FIG. 32A) and in the case of arranging the power line 412 in column direction (FIG. 32C), each of the power line is formed by a conductive layer of a different layer. Here, wirings connected with the gate electrode of the TFT 403 are focused and illustrated in both FIGS. 32A and 32C to show that the wirings are formed by different layers.

As characteristics of pixels illustrated in FIGS. 32A and 32C, the points that the TFTs 403 and 404 are connected with each other in series, and a channel length $L_3$ and a channel width $W_3$ of the TFT 403; and a channel width $W_4$ and a channel length $L_4$ of a TFT 404 are set to meet $L_3/W_3:L_4/W_4=5$ to 6000:1. As an example in the case that lengths and widths meet 6000:1, $L_3$ may be 500 μm; $W_3$, 3 μm; $L_4$, 3 μm; and $W_4$, 100 μm. By using the present invention, a pattern can be formed with good controllability to have a desired shape, and such a fine wiring having $W_3$ of 3 μm can be stably formed without breaking. Therefore, a TFT having an electric property capable of functioning pixels sufficiently can be formed as illustrated in FIGS. 32A and 32C. Therefore, a display panel with high reliability having high display property can be manufactured.

Further, the TFT 403 operates in a saturation region to control a current value flowing into the light-emitting element 405, whereas the TFT 404 operates in a linear region to control current supply to the light-emitting element 405. The both TFTs have preferably the same conductive types in terms of a manufacturing process. As the TFT 403, not only an enhancement TFT but also a depletion TFT can be used. According to the present invention having the foregoing structure, a slight variation of a source-drain voltage ($V_{GS}$) of the TFT 404 does not affect the current value of the light-emitting element 405. That is, the current value passing the light-emitting element is determined by the TFT 403 operating in a saturation region. According to the present invention having the forgoing structure, a display device in which unevenness of luminance due to variations of characteristics of a TFT is improved and image quality is also improved can be provided.

In pixels illustrated in FIGS. 32A to 32D, the TFT 401 controls input of a video signal to the pixel. When the TFT 401 turning ON and inputting a video signal to the pixel, the video signal is stored in the capacitor element 402. FIGS. 32A and 32C illustrate the structure of having the capacitor element 402, however, the present invention is not limited thereto. In the case that the capacity for storing the video signal can be covered by gate capacitor or the like, the capacity element 402 is not required to be provided.

The light-emitting element 405 has the structure composed of a pair of electrodes and an electroluminescent layer interposed between the pair of electrodes. In order to apply forward bias voltage, an electric potential difference is provided between a pixel electrode and an opposing electrode (between an anode and a cathode). The electroluminescent layer is formed by various materials such as an organic material or an inorganic material. Luminescence generated from the electroluminescent layer is light emission (fluorescence) produced in returning excited molecules from the singlet excited state to the ground state, and light emission (phosphorescence) produced in returning excited molecules from the triplet excited state to the ground state.

A pixel illustrated in FIG. 32B has the same structure as that of the pixel illustrated in FIG. 32B except the point that a TFT 406 and the scanning line 416 are provided. Similarly, a pixel illustrated in FIG. 32D has the same structure as that of the pixel illustrated in FIG. 32C except the point that the TFT 406 and the scanning line 416 are provided.

ON/OFF of the TFT 406 is controlled by the scanning line 416 that is newly provided. When the TFT 406 turning ON, charges stored in the capacitor element 402 are discharged and the TFT 406 is turned OFF. That is, it can be possible to make compellingly the state that current does not flow through the light-emitting element 405 by the arrangement of the TFT 406. Therefore, duty ratio can be improved, since the structures illustrated in FIGS. 32B and 32D can start a light period simultaneously with or soon after the start of a write period without waiting the write of signals into all of pixels.

Figure 32E:
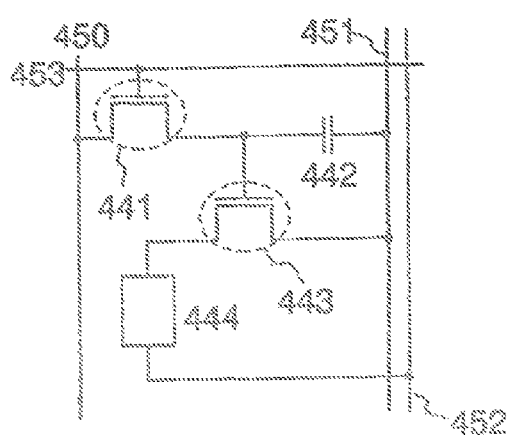
Figure 32F:
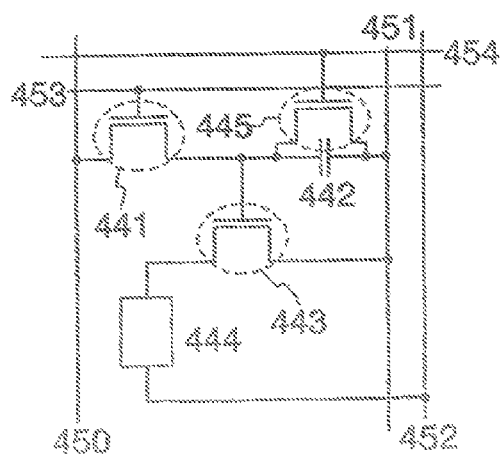

A pixel illustrated in FIG. 32E is provided with a signal line 450, power lines 451, and 452 in row direction, and a scanning line 453 in column direction. The pixel includes a switching TFT 441, a drive TFT 443, a capacitor element 442, and a light-emitting element 444. A pixel illustrated in FIG. 32F has the same structure as that of the pixel illustrated in FIG. 32E except the point that a TFT 445 and a scanning line 454 are provided. Further, the structure of FIG. 32F can improve duty ratio by the arrangement of the TFT 445.

According to the present invention, a pattern such as a wiring can be stably formed with good controllability, and so it can be possible to impart a TFT a high electric property and reliability. Moreover, the present invention can be applied to applied technology for improving a display property of a pixel according to application.

Embodiment 10

Figure 24:
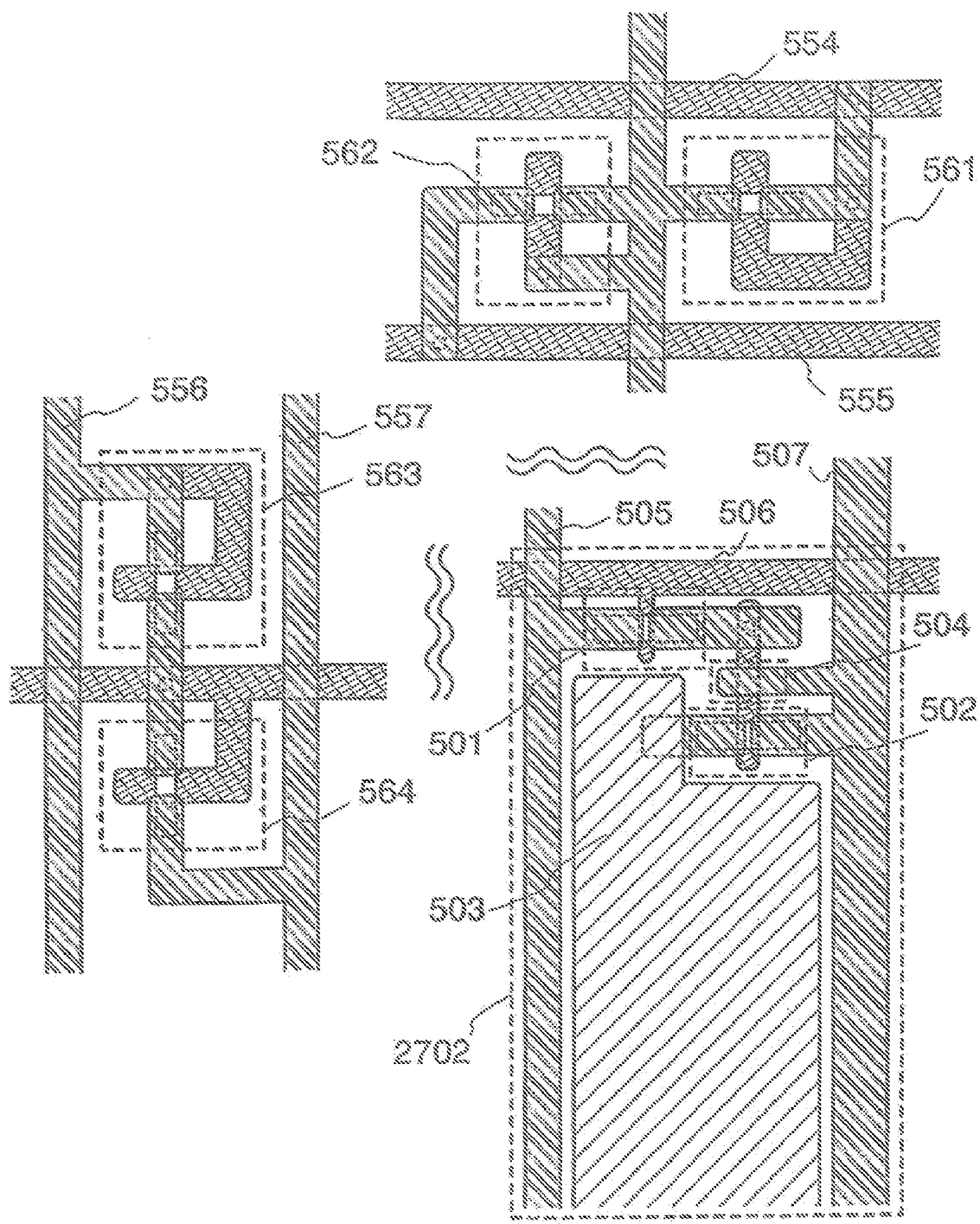
FIG. 24 is an explanatory top view for a display panel according to the present invention.

One mode in which a protective diode is provided to a scanning line side input terminal portion and a signal line side input terminal portion is explained with reference to FIG. 24. In FIG. 24, a pixel 2702 is provided with a TFT 501, a TFT 502, a capacitor element 504, and a light-emitting element 503. The TFT has the same structure as that explained in Embodiment 2.

Figure 23:
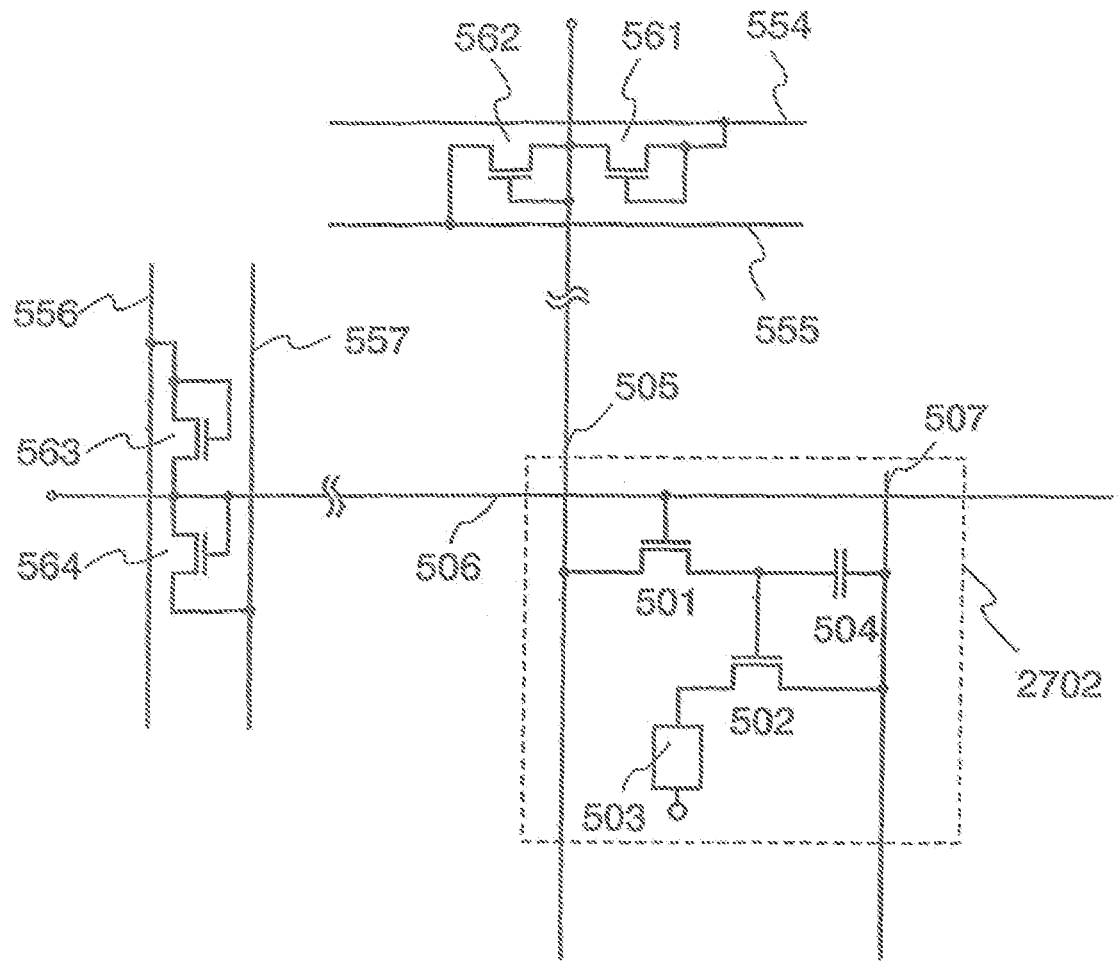
FIG. 23 is an equivalent circuit diagram of a display panel explained with reference to FIG. 24.

A signal line input terminal portion is provided with protective diodes 561 and 562. The protective diode is formed by the same procedure as that of the TFT 501 or TFT 502. The protective diode serves as a diode by connecting a gate electrode to one of drain and source regions. FIG. 23 illustrates an equivalent circuit diagram whose top view is illustrated in FIG. 24.

The protective diode 561 is composed of a gate electrode layer, a semiconductor layer, and a wiring layer. The protective diode 562 has the same structure as the protective 561. Common electric potential lines 554, 555, and the gate electrode layer are formed by one layer. Therefore, in order to electrically connect the protective diode to the wiring layer, a contact hole is required to be provided to the gate insulating layer.

A contact hole in the gate insulating layer may be formed by forming a mask, and performing etching treatment. In this instance, locally discharge processing is possible in the case of applying an etching processing of atmospheric discharge, and so a mask layer is not required to be formed all over the substrate.

A signal line wiring layer and source and drain wiring layer 505 and 507 in the TFTs 501 and 502 are formed by one layer. The signal wiring layer connected to the TFT 501 is connected to the source or the drain side. Besides, numeral 506 denote a gate electrode layer in the TFT 501.

An input terminal portion has the same structure as that of the signal wiring side. A protective diode 563 is composed of a gate electrode layer, a semiconductor layer, and a wiring layer. The protective diode 564 has the same structure as the protective 563. Common electric potential lines 556, 557, each of which is connected to the protective diode, and the source and drain layer are formed by one layer. A protective diode provided to an input stage can be simultaneously formed. The portion in which the protective diode is inserted is not limited to this embodiment, and can be provided between the driver circuit and the pixel.

According to the present invention, a pattern such as a wiring can be stably formed with well controllability and without deteriorations; and short-circuiting and the like even if a wiring and the like becomes complicated by forming a protective circuit. Since it is not required to consider a large margin, the present invention can respond to a downsized or fine-shaped device. Therefore, a display device having a high electric property and high reliability can be manufactured.

Embodiment 11

Figure 22:
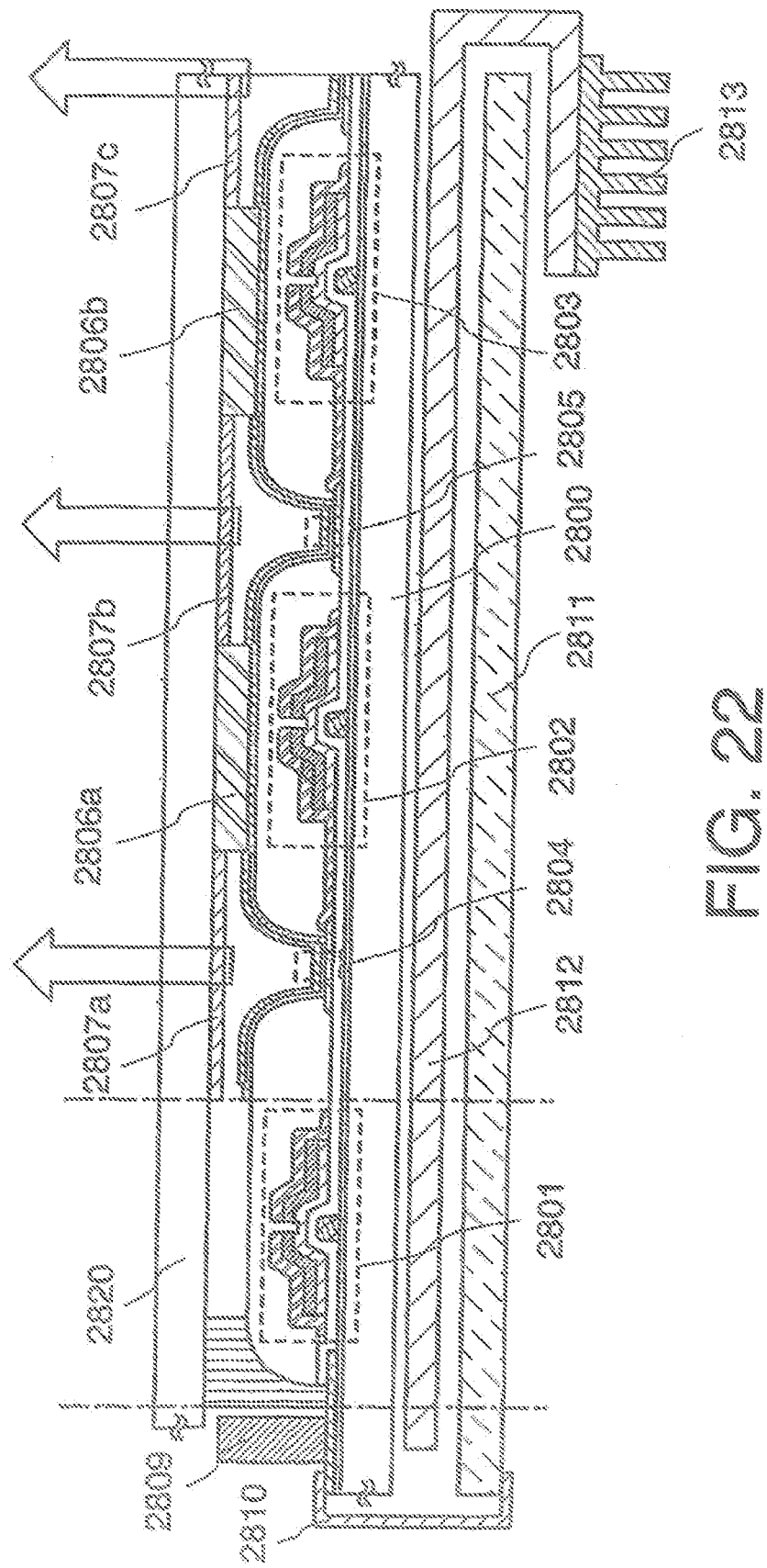
FIG. 22 is an explanatory cross-sectional view for a structure example of an EL display module according to the present invention.

FIG. 22 shows an example constituting an EL display module having a TFT substrate 2800 manufactured by droplet discharging. A pixel portion composed of pixels is formed over the TFT substrate 2800 in FIG. 22.

In FIG. 22, a TFT which is the same as that formed in a pixel, or a protective circuit portion 2801 operated in the same manner as a diode by being connected to a gate and one of a source region or a drain region of the TFT is provided between a driver circuit and the pixel which is outside of the pixel portion. A driver IC formed of a single crystal semiconductor, a stick driver IC formed of a polycrystalline semiconductor film over a glass substrate, or a driver circuit formed of a SAS is used as a driver circuit 2809.

The TFT substrate 2800 is bonded to a sealing substrate 2820 formed by droplet discharging via spacers 2806a and 2806b. The spacers are preferably provided to keep constantly the space between the two substrates even when the thickness of the substrate is thin and an area of a pixel portion becomes enlarged. A space between the TFT substrate 2800 and the sealing substrate 2820 over a light emitting element 2804 connecting with a TFT 2802 and a light emitting element 2805 connecting with a TFT 2803 may be filled with a light-transmitting resin material to be solidified, or may be filled with anhydrous nitrogen or an inert gas.

FIG. 22 shows the case in which the light emitting elements 2804 and 2805 have a structure of a top emission type and has a structure in which light is emitted in the direction of an arrow illustrated in the diagram. Multicolor display can be realized by making each pixel to have different emission colors of red, green, and blue. In this instance, color purity of light emitted to the outside can be improved by forming colored layers 2807a, 2807b and 2807c corresponding to each color of red, green, and blue at the side of the sealing substrate 2820. Moreover, pixels used as white light emitting elements may be combined to the colored layers 2807a, 2807b and 2807c, respectively.

The driver circuit 2809 and a circuit substrate 2811 are connected to a scanning line or signal line connecting terminal provided at one end of the TFT substrate 2800 by a wiring substrate 2810. In addition, a heat pipe 2813 and a radiator plate 2812 may be provided to be in contact with or close to the TFT substrate 2800 to improve a heat radiation effect.

FIG. 22 shows the top emission type EL module; however, it may be a bottom emission structure by changing the structure of the light emitting element or the arrangement of the external circuit substrate. In the case of the top emission structure, an insulating layer serving as a bank may be colored to be used as a black matrix. The bank can be formed by droplet discharging or the like. As a material for the bank, a material formed by mixing black resin of a pigment, carbon black, or the like into a resin material such as polyimide may be used. The bank may be formed to have a layered structure.

Additionally, the TFT substrate 2800 may be formed to have a sealing structure by attaching a resin film to the side provided with the pixel portion by using sealant or adhesive resin. In this embodiment, glass sealing using a glass substrate is explained, but various sealing methods such as resin sealing using reign, plastic sealing using plastic, and film sealing using a film be used. A gas barrier film which prevents moisture from penetrating is preferably provided on the surface of a resin film. By forming the TFT substrate 2800 to have a film sealing structure, a further downsized or thin-shaped module can be obtained.

Embodiment 12

A television device can be completed by a display device formed according to the present invention. A display panel can be formed in any form as follows: a display panel having the structure shown in FIG. 29A in which only a pixel portion is formed, and a scanning line driver circuit and a signal line driver circuit are mounted by a TAB method as shown in FIG. 30B; a display panel having the structure shown in FIG. 29A in which only a pixel portion is formed, and a scanning line driver circuit and a signal line driver circuit are mounted by a COG method as shown in FIG. 30A; a display panel having the structure shown in FIG. 29B in which a TFT is formed by SAS, and a pixel portion and a scanning line driver circuit are integrally formed, then, a signal line drive, circuit is mounted separately as a driver IC; and a display panel having the structure shown in FIG. 29C in which a pixel portion, a scanning line driver circuit and a signal line drive circuit are integrally mounted; or the like.

At the input side of a video signal, another structure of an external circuit is composed of a video signal amplifier circuit which amplifies a video signal received by a tuner; a video signal processing circuit which converts the video signal outputted from the video signal amplifier circuit into a chrominance signal corresponding to each color of red, green, and blue; a control circuit which converts the video signal into an input specification of a driver IC; and the like. The control circuit outputs the signal into the scanning line side and the signal line side, respectively. In the case of digital driving, a structure in which a signal division circuit may be provided on the signal line side to divide and to supply an input digital signal into m numbers of pieces may be formed.

Among signals received from the tuner, an audio signal is transmitted to an audio signal amplifier circuit, and the output of the audio signal is supplied to a speaker through an audio signal processing circuit. A control circuit receives control information such as a receiving station (a receiving frequency) or sound volume from an input portion, and transmits the signal to the tuner or the audio signal processing circuit.

Figure 35:
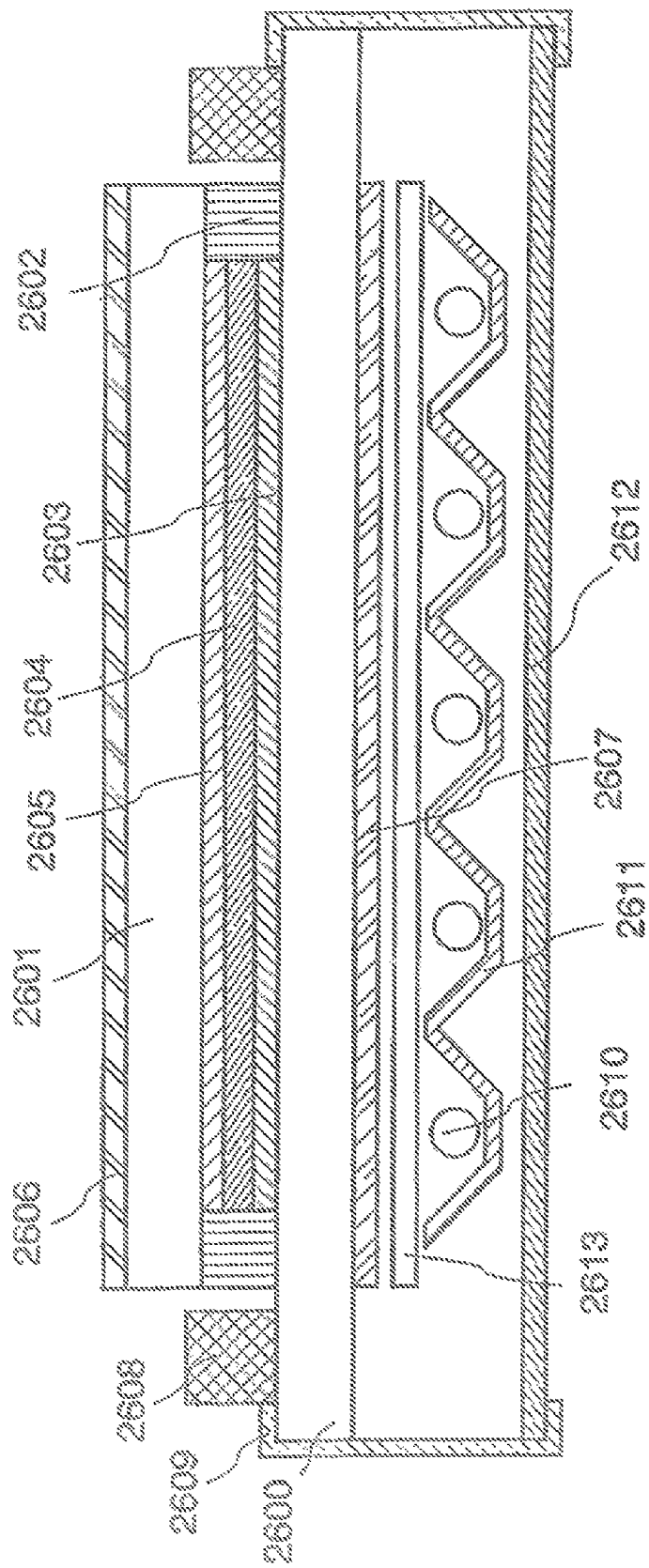
FIG. 35 is an explanatory cross-sectional view for a structure example of an liquid crystal display module according to the present invention.

FIG. 35 illustrates an example of a liquid crystal display module in which a TFT substrate 2600 and an opposing substrate 2601 are fixated by sealant 2602, and a pixel portion 2603 and a liquid crystal layer 2604 are provided therebetween to form a display region. A colored layer 2605 is required to perform color display. In the case of RGB display, each colored layer corresponding to red, green, and blue is provided to each corresponding pixel. Polarizing plates 2606, 2607, and a lens film 2613 are provided at the outside of the TFT substrate 2600 and the opposing substrate 2613. A light source is composed of a cold-cathode tube 2610 and a reflective plate 2611. A circuit substrate 2612 is connected to the TFT substrate 2600 by a driver circuit 2608 and a flexible wiring circuit 2609, and is installed with external circuits such as a control circuit or a power source circuit.

Figure 20:
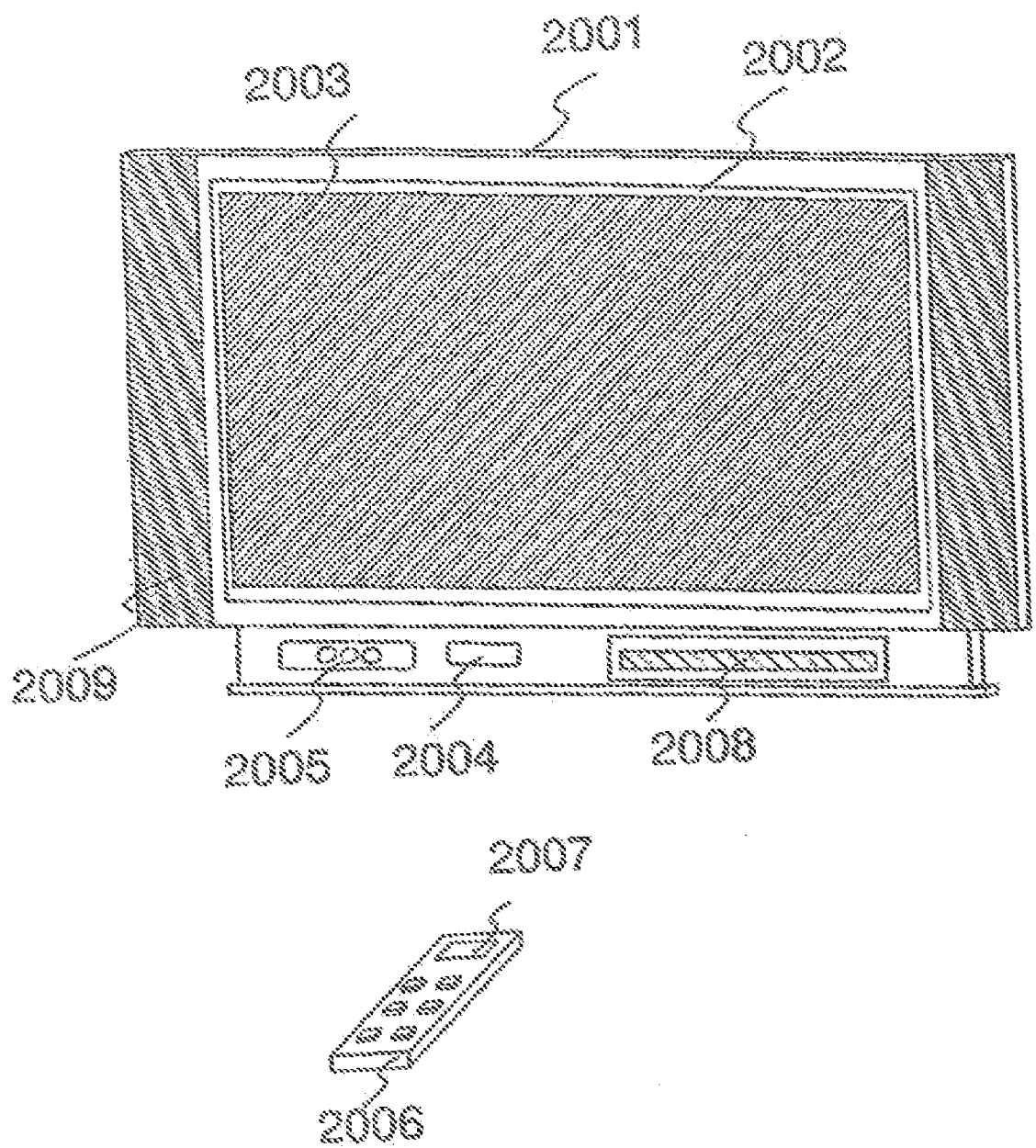
FIG. 20 shows an electronic device applied with the present invention.

As shown in FIG. 20, a television device can be completed by incorporating a display module into a housing 2001. An EL television device can be completed by using such an EL display module like in FIG. 22. A liquid crystal television device can be completed by using such a liquid crystal display module like in FIG. 35. In the television device, a main screen 2003 is formed by using the display module, and a speaker portion 2009, operation switches, and the like are provided as other attached equipments. In such a manner, the television device can be completed according to the invention.

Figure 34:
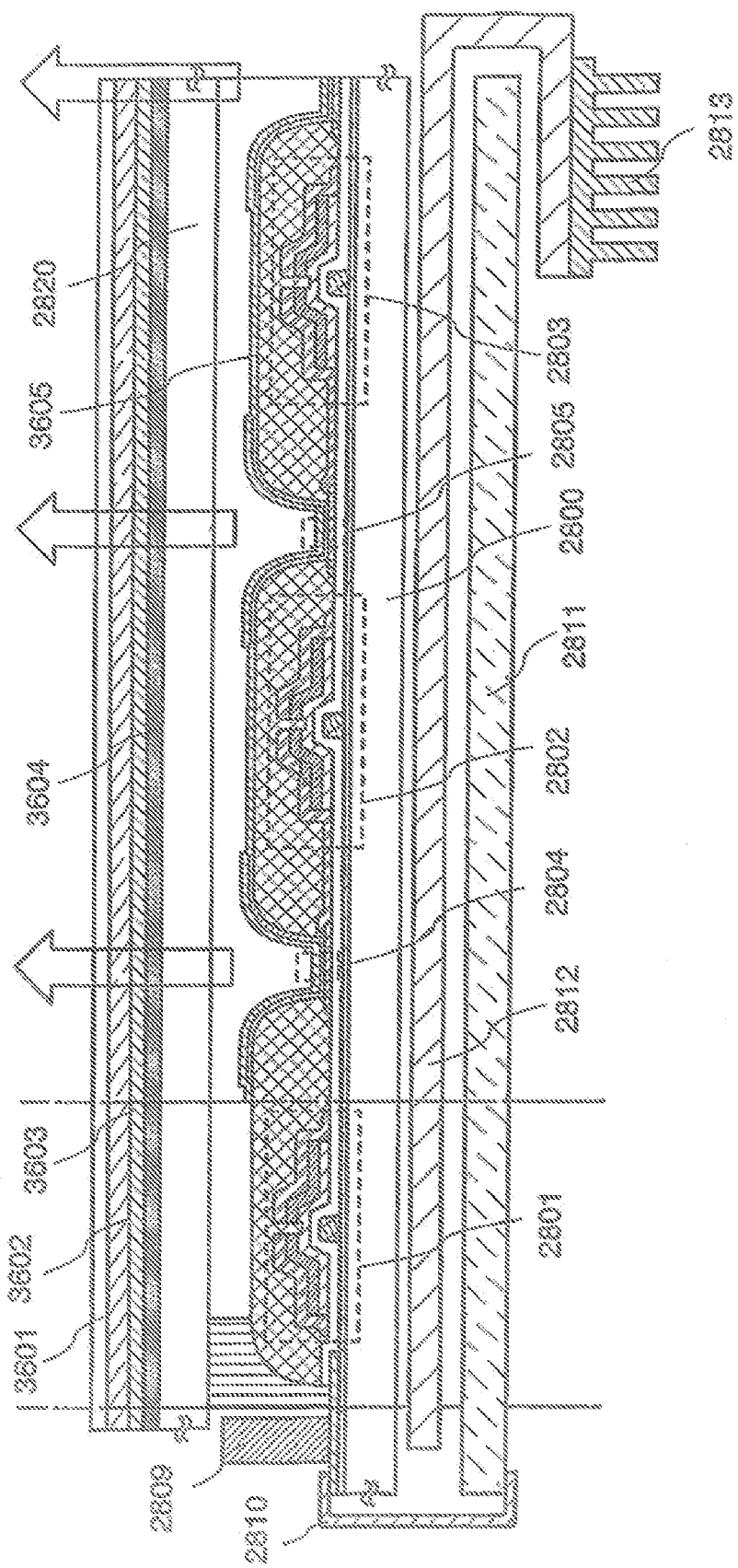
FIG. 34 is an explanatory cross-sectional view for a structure example of an EL display module according to the present invention.

In addition, as illustrated in FIG. 34, reflected light entered from the outside may be shielded by using a retardation film and a polarizing plate. FIG. 34 illustrates a top emission structure in which an insulating layer 3605 serving as a bank is colored to be used as a black matrix. The bank can be formed by droplet discharging or the like of carbon black or the like mixed into a resin material such as polyimide. The bank may be formed to have a layered structure. The bank can be formed by discharging a different material at a plurality of times to a certain area. In this embodiment, black resin of a pigment is used. $\lambda/4$ and $\lambda/2$ may be used as retardation films 3603, 3604 and designed to be able to control light. A structure of the top emission device is composed of a TFT element substrate 2800, a light emitting element 2804, a sealing substrate (sealant) 2820, retardation films 3603, 3604 ($\lambda/4$ and $\lambda/2$), a polarizing plate 3602, in which light emitted from the light emitting element is emitted to the outside through these components from the side of the polarizing plate. The retardation films and polarizing plate may be provided on the side from which light is emitted, or may be provided on the both sides in the case of a dual emission type display device in which light is emitted from the both faces. In addition, an anti-reflective film 3601 may be provided on the outer side of the polarizing plate. Accordingly, a higher definition and more precise image can be displayed.

A display panel 2002 using a display element is incorporated into a housing 2001 as illustrated in FIG. 20. The television device can receive general television broadcasting by a receiver 2005. Moreover, information communication can be carried out in one direction (from a transmitter to a receiver) or in the both directions (between a transmitter and a receiver or between receivers) by connecting to a fixed-line or wireless communication network via a modem 2004. The operation of the television device can be carried out by switches incorporated into the housing or a remote control device 2006, which is prepared separately from the main body. A display portion 2007 that displays information to be outputted may also be provided to this remote control device.

In addition, in the television device, a structure that displays TV channels, sound volume, or the like may be additionally provided by forming a sub-screen 2008 by a second display panel in addition to the main screen 2003. In the structure, the main screen 2003 may be formed by an EL display panel that is superior in a viewing angle and the sub-screen may also be formed by a liquid crystal display panel capable of displaying images at low power consumption. In order to operate at low power consumption, the main screen 2003 may be formed by a liquid crystal display panel, and the sub-screen 2008 may be formed by an EL display panel to be able to blink. According to the present invention, a display device with high reliability can be manufactured even if many TFTs and electronic parts are used by using such a large-sized substrate.

According to the present invention, a manufacturing process is simplified and a light-emitting device can be easily manufactured even in the case of using a glass substrate of the fifth generation or later having a side of 1000 mm or more.

According to the present invention, a desired pattern can be formed with well controllability, loss of material can be prevented, and costs can be reduced. Accordingly, a television device according to the present invention can be manufactured at low costs even if a large screen display portion is used and has hardly deteriorations even if the television becomes thinned or wirings and the like are refined. Therefore, a television device with high performance and high reliability can be manufactured with good yields.

Of course, the invention is not limited to the television device and it can be applied to various usages especially as display mediums having a large area such as an information display board at stations, airports, or the like, or an advertisement display board on the street as well as a monitor of a personal computer.

Embodiment 13

Various display devices can be manufactured by applying the present invention. In other words, the present invention can be applied to various electronic devices in which these display devices are incorporated into display portions.

The electronic devices include a camera such as a video camera or a digital camera, a projector, a head mounted display (goggle type display), a car navigation system, a car stereo, a personal computer, a game machine, a portable information terminal (mobile computer, a cellular phone, an electronic book, or the like), an image reproducing device provided with a recording medium (specifically, a device that is capable of reproducing a recording medium such as a Digital Versatile Disc (DVD) and that has a display device that can display the image) or the like. FIGS. 21A to 21D show the examples thereof.

Figure 21A:
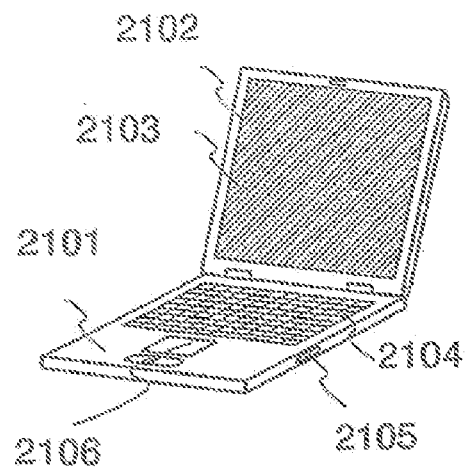
FIGS. 21A to 21D show electronic devices applied with the present invention.

FIG. 21A is a laptop personal computer comprising a main body 2101, a housing 2102, a display portion 2103, a keyboard 2104, an external connection port 2105, a pointing mouse 2106, and the like. The present invention is applied to manufacture the display portion 2103. According to the invention, an image with high reliability and high resolution can be displayed even if the computer is down-sized and wirings and the like are refined.

Figure 21B:
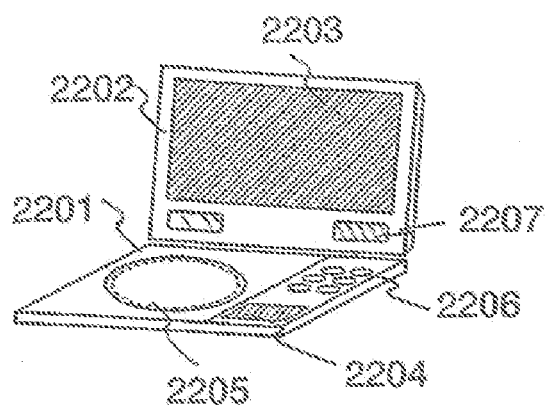

FIG. 21B is an image reproducing device provided with a recording medium (specifically a DVD reproducing device) comprising a main body 2201, a housing 2202, a display portion A 2203, a display portion B 2204, a recording medium (such as a DVD) reading portion 2205, operation keys 2206, a speaker portion 2207 and the like. The display portion A 2203 mainly displays image information and the display portion B 2204 mainly displays character information, and the invention is applied to manufacture these display portions A 2203 and B 2204. According to the invention, an image with high reliability and high resolution can be displayed even if the image reproducing device is down-sized and wirings and the like are refined.

Figure 21C:
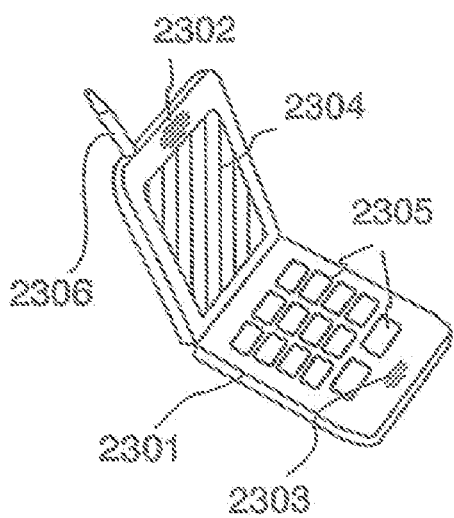

FIG. 21C is a cellular phone comprising a main body 2301, an audio output portion 2302, an audio input portion 2303, a display portion 2304, operation switches 2305, an antenna 2306, and the like. By applying the display device manufactured according to the invention to the display portion 2304, an image with high reliability and high resolution can be displayed even if the cellular phone is down-sized and wirings and the like are refined.

Figure 21D:
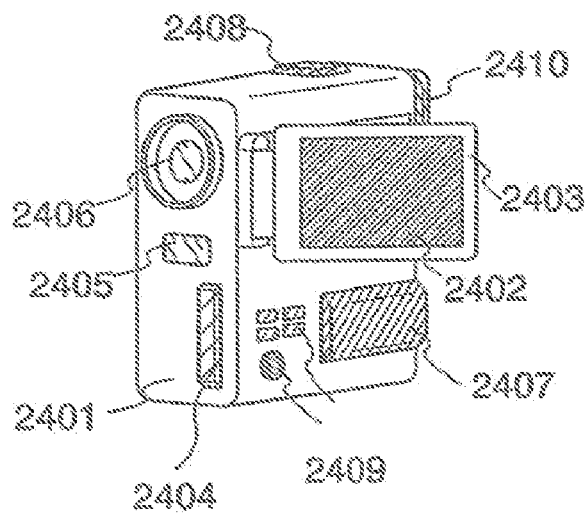

FIG. 21D is a video camera comprising a main body 2401, a display portion 2402, a housing 2403, an external connection port 2404, a remote control receiving portion 2405, an image receiving portion 2406, a battery 2407, an audio input portion 2408, operation keys 2409, an eye contact portion 2410, and the like. The present invention can be applied to the display portion 2402. By applying the display device manufactured according to the invention to the display portion 2402, an image with high reliability and high resolution can be displayed even if the video camera is down-sized and wirings and the like are refined.

Example 1

In this embodiment, advantageous effects of the present invention are explained based on experimental results.

As explained in Embodiment 1, a mask is formed in a subject formation region. As a mask, polyimide is used. The polyimide is discharged over a substrate by droplet discharging. The substrate is formed to have low wettability by using a low wettability substance. FAS is used as the low wettability substance and diluted by octanol of solvent to be coated. Thereafter, the mask is removed. According to the foregoing processes, a low wettability region and a high wettability region are formed, and so the subject formation region has different level of wettability.

Figure 40:
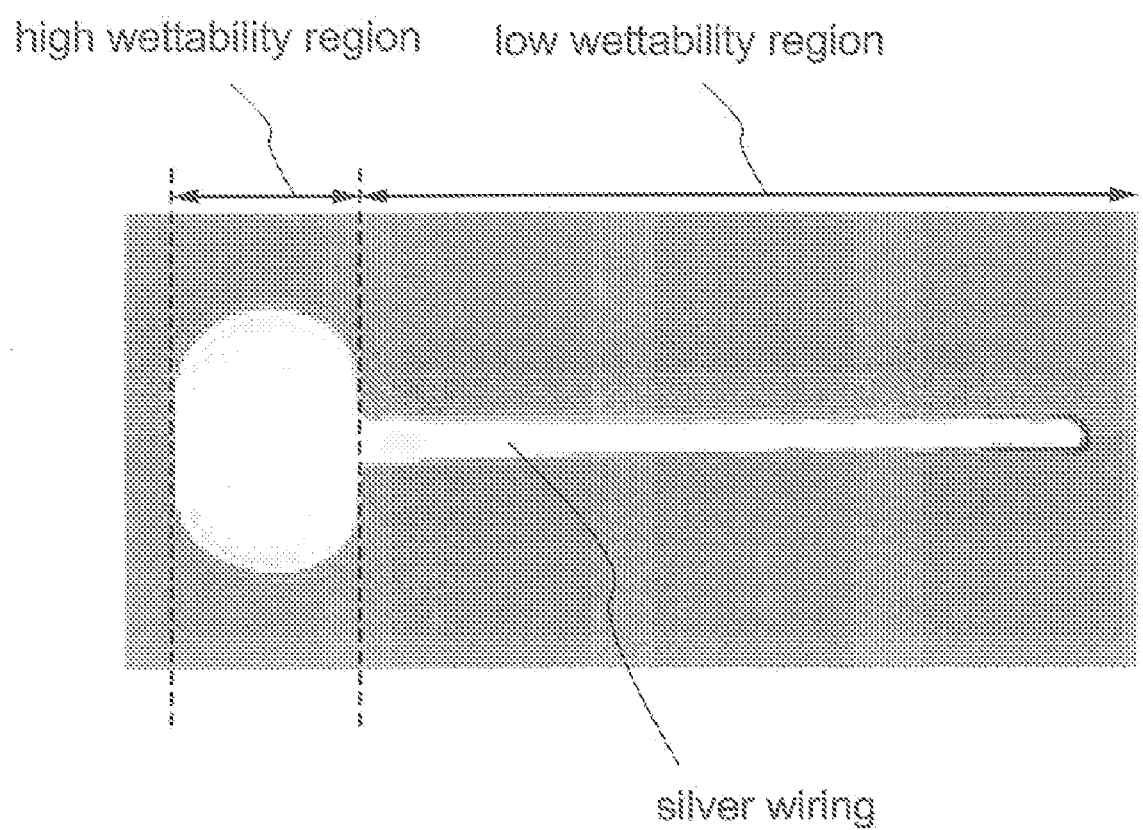
FIG. 40 shows a wiring manufactured according to the present invention.

A silver wiring is formed by discharging a composition containing a silver conductive material by droplet discharging so as to be crossed a boundary between the high wettability region and the low wettability region. A dot pitch for drawing is 60 μm. The dot pitch is a distance between dots. The composition containing silver discharged over the region of low wettability does not settle in there due to the difference of wettability of the subject formation region, and partly flows into the high wettability region from the boundary between the high wettability region and the low wettability region. This arises from the fact that the composition containing silver is repelled in the low wettability region that has low wettability with respect to the composition containing silver, and so the composition does not fix thereto and flows to the high wettability region having further high stability. As a result, as shown in FIG. 40, the silver wiring formed over the low wettability region is formed with stability into a fine wiring to have a thickness of 400 nm, a width of from 50 to 55 μm, and a length of 1 mm. Therefore, a fine wiring can be freely formed according to the present invention.

Figure 41A:
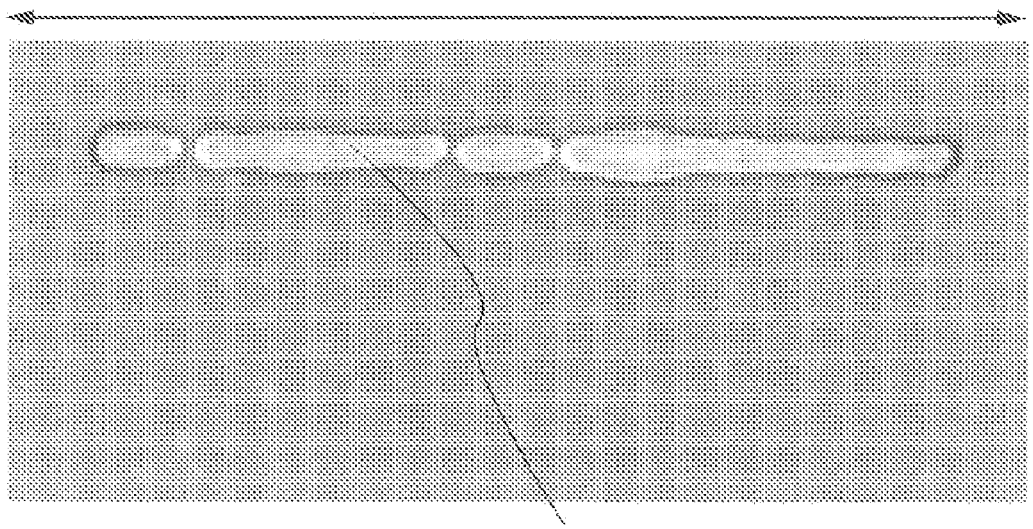
FIGS. 41A and 41B show wirings manufactured according to comparative examples.
Figure 41B:
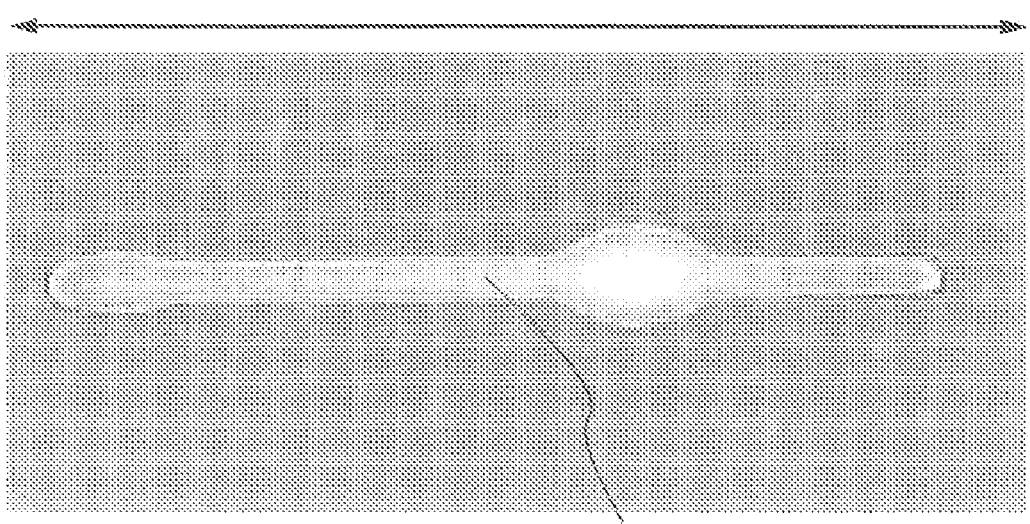

As a comparative example, an example of forming a silver wiring in accordance with the foregoing ways without using the present invention is described. A whole subject formation region is formed to have low wettability. Accordingly, the subject formation region has uniform wettability. A silver wiring is formed by discharging a silver conductive material over the region having uniform wettability. FIGS. 41A and 41B show the results. The silver wirings illustrated in FIGS. 41A and 41B are formed by discharging different amounts of materials; FIG. 41A shows a wiring formed with a dot pitch of 60 μm, and FIG. 41B shows a wiring formed with a dot pitch of 50 μm.

In the comparative example, breaking is produced as illustrated in FIG. 41A in the silver wiring formed with a dot pitch of 60 μm, with which the silver wiring with stability can be formed in this embodiment. Breaking is not produced in the silver wiring having a dot pitch of 50 μm formed by a large discharge rate, in turn, swelling referred to as bulge due to a puddle of liquid is produced therein. The wiring according to the comparative example is formed to have a thickness of 900 nm. Therefore, the wirings formed according to the comparative example have shape deterioration due to breaking or stagnant liquid that does not use the present invention. A stable fine wiring cannot be formed according to the comparative example.

As noted above, it can be confirmed that a stable fine pattern can be formed according to the present invention.

Example 2

An example of a pattern according to the present invention is explained based on experimental results in this example 2.

Three kinds of patterns are formed according to the present invention as is the case with Example 1. FIGS. 42A to 44A illustrate optical photomicrographs; FIGS. 42B to 44B illustrate cross-sectional views taken along line of O-P of each FIGS. 42A to 44A; and FIGS. 42C to 44C illustrate thickness distributions at each line of 1-1 to 1-7, 2-1 to 2-4, and 3-1 to 3-4 of each FIGS. 42A to 44A. In each pattern, a region on the observer's left side where a pattern having a large width is formed is a high wettability region with respect to a composition containing a pattern formation material, whereas a region on the observer's left side where a pattern having a thin width is formed is a low wettability region with respect to a composition containing a pattern formation material. The pattern formation material is discharged so as to be crossing a boundary between the regions having different levels of wettability, and is formed into a stable pattern shape as illustrated in FIGS. 42A to 44C through a process of flowing of a part of the composition due to the different level of wettability.

Patterns illustrated in FIGS. 42A to 43C are silver wirings formed by discharging a composition containing silver as a conductive material. The wiring is formed to have a dot pitch of 60 μm in the atmosphere. A pattern illustrated in FIGS. 44A to 44C is formed by discharging a composition containing polyvinyl alcohol. The pattern is formed to have a dot pitch of 70 μm in the atmosphere.

Figure 42A:
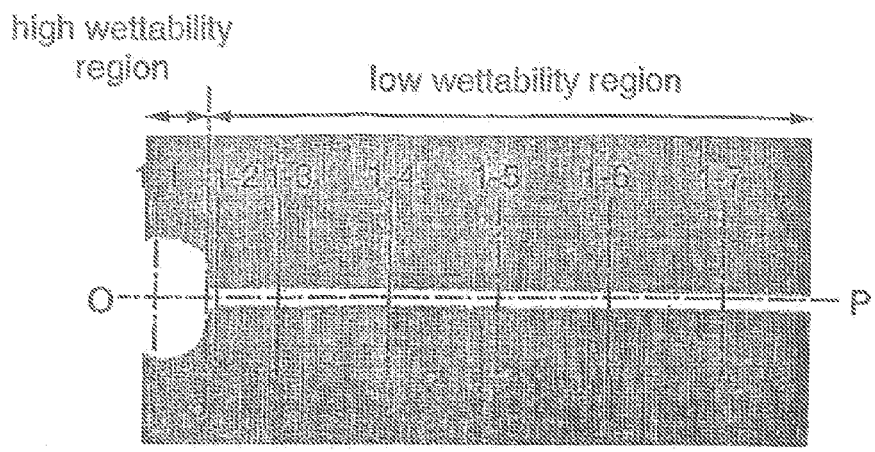
FIGS. 42A to 42C show a wiring manufactured according to the present invention.
Figure 42B:
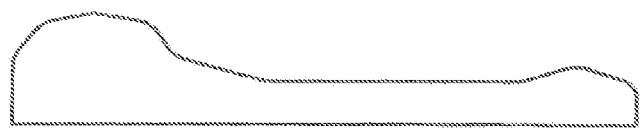
Figure 42C:
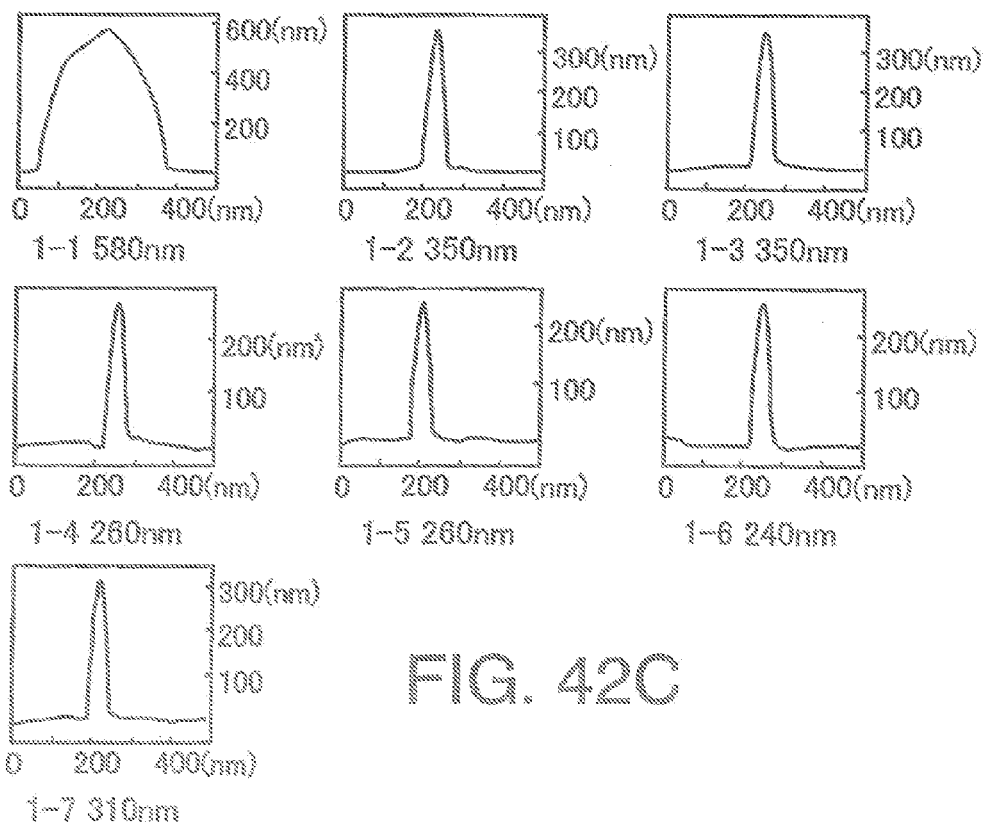

FIG. 42C illustrates the measurement results of thickness distributions at 1-1 to 1-7 of the silver wiring illustrated in FIG. 42A. The horizontal axis in FIG. 42C indicates a measurement region, whereas the vertical axis in FIG. 42C indicates a thickness of the pattern. The indicated thickness value is an approximate average value of a maximum value of each convex portion. From the thickness distributions, a high wettability region at 1-1 shows a wide line, whereas a low wettability region at 1-2 to 1-7 shows a fine line. According to the present invention, a fine wiring having a desired width can be formed without deteriorations such as breaking with high reliability and with stability.

The shape of the silver wiring illustrated in FIGS. 42A to 42C in the thickness direction is considered. The maximum value of the thickness of a center portion of the silver wiring is measured by thickness measurement as shown in FIG. 42C. The measurement results are 580 nm at 1-1, 350 nm at 1-2, 260 nm at 1-4, 260 nm at 1-5, 240 nm at 1-6, and 310 nm at 1-7. From the result, the cross-sectional schematic view taken along line O-P of FIG. 42A can be illustrated as FIG. 42B.

As illustrated in FIG. 42B, as the tendency of the thickness distribution of a cross-section taken along line O-P, the thickness of the low wettability region becomes thick as being away from the high wettability region. This arises from the fact that a composition containing a pattern formation material becomes difficult to flow to the low wettability region as being away from the high wettability region. In addition, a composition discharged over the low wettability region flows to a high wettability region due to the difference of a level of wettability; however, there is a possibility that the composition may stay at the low wettability region since fluidity is diminished due to desiccation of solvent or the like during flowing in the case that there is a long distance to the high wettability region.

A pattern of the high wettability region tends to have a thicker (or approximately the same) thickness than that of a pattern of the low wettability region. This may arise from the fact that a composition containing a pattern formation material that flows to a high wettability region agglutinates due to surface tension and a thickness of the high wettability region is increased.

In the case that the pattern thickness of the high wettability region is thicker than that of the low wettability region as illustrated in FIGS. 42A to 42C, there is a tendency that there is a region having a thickness that is reduced toward the high wettability region from the low wettability region. That is, the thickness at the periphery of a boundary of the high and low wettability regions does not change intermittently but gradually and continuously while crossing the boundary. The change is formed since a composition that flows to the high wettability region loses its fluidity at the periphery of the boundary.

Figure 43A:
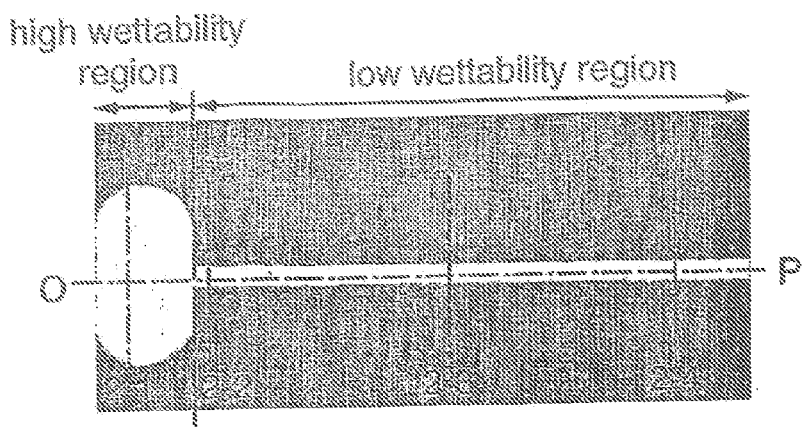
FIGS. 43A to 43C show a wiring manufactured according to the present invention.
Figure 43B:
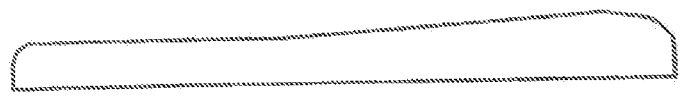
Figure 43C:
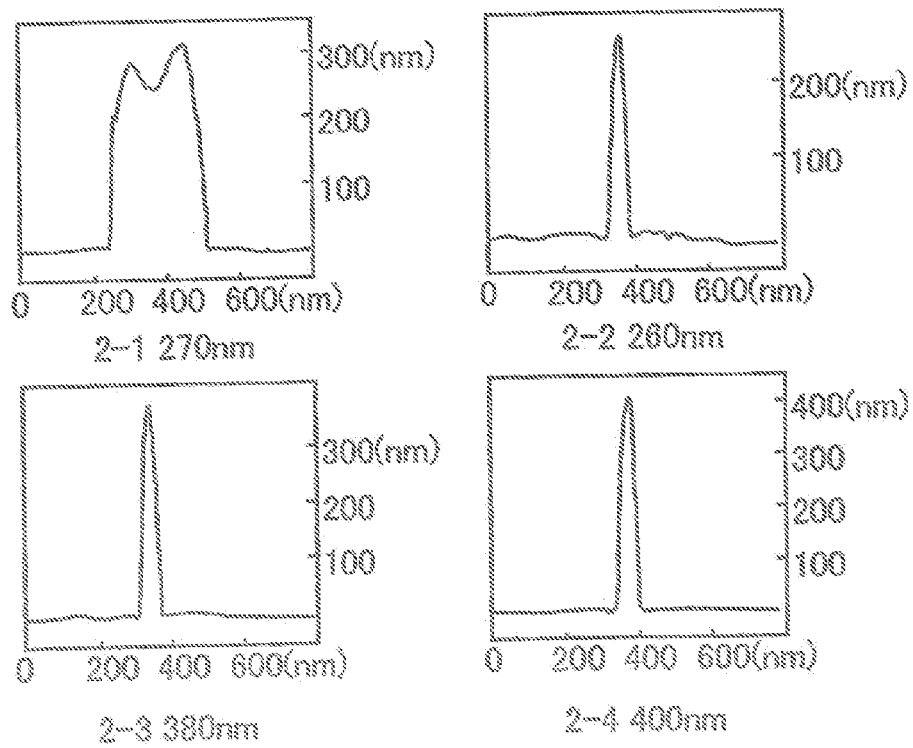
Figure 44A:
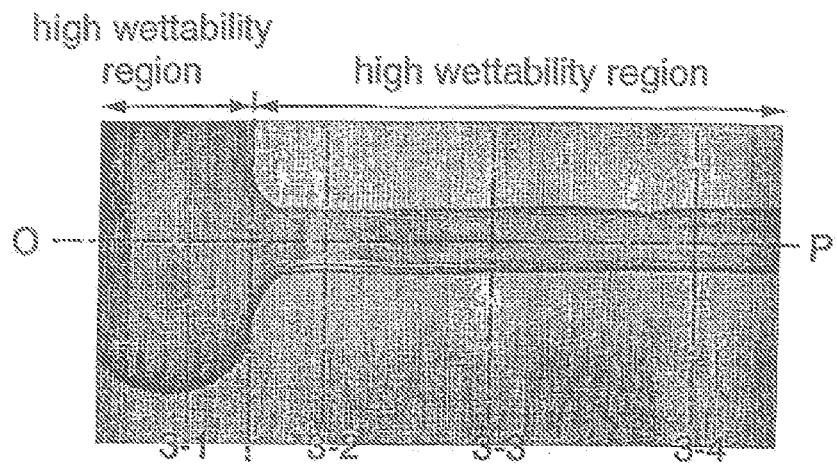
FIGS. 44A to 44C show a wiring manufactured according to the present invention.
Figure 44B:
Figure 44C:
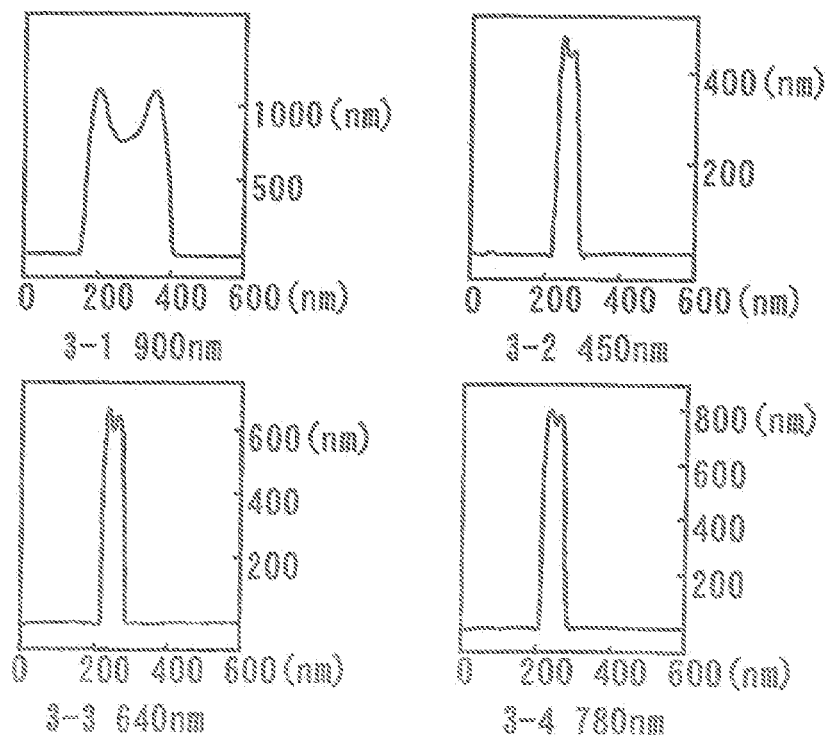

The maximum value of the thickness of a center portion of the silver wiring is measured by thickness measurement as shown in FIG. 43C. The measurement results are 270 nm at 2-1, 260 nm at 2-2, 380 nm at 2-3, and 400 nm at 2-4. From the result, the cross-sectional schematic view taken along line O-P of FIG. 43A can be illustrated as FIG. 43B. Compared to a shape of the silver wiring illustrated in FIGS. 42A to 44C, a shape of the silver wiring illustrated in FIGS. 43A to 43C has a pattern that has no difference in a thickness between a high wettability region and a low wettability region. A composition might not sufficiently flow to a high wettability region since there is a difference of a discharge rate or areas of each region, or the composition is dried and has fluidity for comparative short time. The tendency of increasing a thickness of a pattern from the high wettability region to the low wettability region can also be seen in a pattern of the silver wiring illustrated in FIGS. 42A to 42C.

A pattern illustrated in FIG. 44A to 44C is made from a composition containing polyvinyl alcohol. The pattern is formed over a silicon film. The maximum value of the thickness of a center portion of the pattern is measured by thickness measurement as shown in FIG. 44C. The measurement results are 900 nm at 3-1, 450 nm at 3-2, 640 nm at 3-3, and 780 nm at 3-4. From the result, the cross-sectional schematic view taken along line O-P of FIG. 43A can be illustrated as FIG. 43B. The pattern has the same tendency as that of the silver wiring illustrated in FIGS. 42A to 42C. In this pattern, a concave portion as illustrated by a region 3-1 is formed in a high wettability region. Further, concave portions as illustrated by regions 3-2, 3-3, and 3-4 in FIG. 44C are formed in a fine wiring pattern on a low wettability region.

The foregoing pattern may be affected by various factors such as difference in a contact angle of regions having different wettability in a subject formation region; an area of the different wettability in the subject formation region; viscosity of a composition; a volatilization rate of solvent. Therefore, when a pattern is formed, such factors may be appropriately designed to form a desired pattern. It can be confirmed that various stabilized fine patterns can be formed according to the present invention.

EXPLANATION OF REFERENCE

20: substrate, 30: TFT substrate, 32: sealant, 33: liquid crystal, 34: barrier layer, 35, marker, 40: control device, 42: imaging means, 43: head, 45: marker, 50: substrate, 51: mask, 52: substance, 54: nozzle, 55: droplet, 56: pattern, 57: pattern, 59: pattern, 60: nozzle, 61: droplet, 62: pattern, 63: pattern, 70: substrate, 71a: mask, 71b: mask, 71c: mask, 72: substance, 76: pattern, 77: pattern, 100: substrate, 101: mask, 103: gate electrode layer, 104: gate electrode layer, 105: gate electrode layer, 106: gate electrode layer, 107: semiconductor layer, 108: semiconductor layer, 109: n-type semiconductor layer, 110: n-type semiconductor layer, 111: drain electrode layer, 112: drain electrode layer, 113: drain electrode layer, 114: drain electrode layer, 116: gate insulating layer, 117: gate insulating layer, 121: insulating layer, 122: electroluminescent layer, 123: electrode layer, 125: mask, 126: high wettability region, 127: gate electrode layer, 145: contact hole, 160: connecting wiring layer, 161: connecting wiring layer, 162: connecting wiring layer, 163: connecting wiring layer, 180a: nozzle, 180b: nozzle, 301: low wettability region, 303: gate electrode layer, 305: gate insulating layer, 307: n-type semiconductor layer, 308: drain electrode layer, 311: pixel electrode layer, 312: insulating layer, 320: liquid crystal layer, 321: insulating layer, 322: colored layer, 323: conductive layer, 324: opposing substrate, 325: polarizing plate, 330: drain electrode layer, 345: contact hole, 350: pattern, 351: substance, 360: low wettability substance, 380: nozzle, 381: nozzle, 401: TFT. 402: capacitor element, 403: TFT, 404: TFT, 405: light-emitting element, 406: TFT, 410 signal line, 411: power source line, 412: power source line, 413: power source line, 414: scanning line, 415: power source line, 416: scanning line, 441: switching TFT, 442: capacitor element, 443: driver TFT, 444: light-emitting element, 445: TFT, 450: signal line, 451: power source line, 452: power source line, 453: scanning line, 454: scanning line, 462: drain electrode, 463: electrode, 464: electroluminescent layer, 465: electrode, 471: drain electrode, 472: electrode, 473: electroluminescent layer, 474: electrode, 480: substrate, 481: thin film transistor, 484: electrode, 485: electroluminescent layer, 486: electrode, 500: block, 501: TFT, 502: TFT, 503: light-emitting element, 504: capacitor element, 505: drain wiring layer, 554: common electric potential line, 555: common electric potential line, 556: common electric potential line, 557: common electric potential line, 561: protective diode, 562: protective diode, 563: protective diode, 564: protective diode, 601: TFT, 620: TFT, 901: buffer circuit, 902: pixel, 1400: substrate, 1403: droplet discharging means, 1404: imaging means, 1405: head, 1406: dotted line, 1407: controlling means, 1408: recording medium, 1409: image processing means, 1410: computer, 1411: marker, 1412: head, 1413: material supply source, 1414: material supply source, 2001: housing, 2002: display panel, 2003: main screen, 2004: modem, 2005: receiver, 2006: remote control device, 2007: display portion, 2008: sub screen, 2009: speaker portion, 2101: main body, 2102: housing, 2103: display portion, 2104: key board, 2105: external connecting port, 2106: pointing mouse, 2201: housing, 2203: display portion, 2301: main body, 2302: audio output portion, 2303: audio input portion, 2304: display portion, 2305: operation switch, 2306: antenna, 2401: main body, 2402: display portion, 2405: remote control receiving portion, 2406: image receiving portion, 2407: battery, 2408: audio input portion, 2409: operation key, 2410: eye contact portion, 2600: TFT substrate, 2601: opposing substrate, 2602: sealant, 2603: pixel portion, 2604: liquid crystal layer, 2605: colored layer, 2606: polarizing plate, 2607: polarizing plate, 2608: driver circuit, 2609: flexible wiring substrate, 2610: cold-cathode tube, 2611: reflecting plate, 2612: circuit substrate, 2613: lens film, 2700: substrate, 2701: pixel portion, 2702: pixel, 2703: scanning line side input terminal, 2704: signal line side input terminal, 2750: FPC, 2751: driver IC, 2800: TFT substrate, 2801: protective circuit portion, 2802: TFT, 2803: TFT, 2804: light-emitting element, 2805: light-emitting element, 2806a: spacer, 2806b: spacer, 2807a: colored layer, 2807b: colored layer, 2807c: colored layer, 2809: external circuit, 2810: wiring substrate, 2811: circuit substrate, 2812: radiator plate, 2813: heat pipe, 2820: sealing substrate, 3300: device substrate, 3301: pixel portion, 3302: pixel, 3303: sealant, 3305: drying agent, 3307: filler, 3308: source wiring layer, 3310: sealing substrate, 3350: FPC, 3601: antireflection film, 3602: polarizing plate, 3603: retardation film, 3604: retardation film, 3604a: drying agent, 3604b: drying agent, 3605: insulating layer, 3306a: gate wiring layer, 3306b: gate wiring layer, 3700: substrate, 3701: pixel portion, 3702: scanning line side driver circuit, 3704: signal line side input terminal, 4700: substrate, 4701: pixel portion, 4702: scanning line driver circuit, and 4704: signal line driver circuit.

What is claimed is:

1. A method for manufacturing a thin film transistor comprising the steps of:
   forming a first region and a second region;
   discharging a composition containing a conductive material to a region across the second region and the first region; and
   flowing a part of the composition discharged to the first region into the second region to form an electrode layer over the first region,
   wherein a width of the electrode layer over the first region after flowing is narrower than a width of the composition over the first region immediately after discharging, and
   wherein wettability of the first region with respect to the composition is lower than wettability of the second region with respect to the composition.

2. A method for manufacturing a thin film transistor comprising the steps of:
   forming a first region and a second region;
   discharging a composition containing a first conductive material to a region across the first region and the second region;
   flowing a part of the composition discharged to the first region into the second region to form an electrode layer over the first region; and
   discharging a second conductive material to the second region to be in contact with the electrode layer to form a wiring layer over the second region;
   wherein wettability of the first region with respect to the composition is lower than wettability of the second region with respect to the composition.

3. The method for manufacturing the thin film transistor according to claim 1 or 2, wherein the first region is formed by forming a substance having a fluorocarbon chain.

4. A method for manufacturing a display device using the thin film transistor manufactured by the method according to claim 1, wherein the electrode layer is formed as a gate electrode layer.

5. A method for manufacturing a display device using the thin film transistor manufactured by the method according to claim 2, wherein the electrode layer is formed as a gate electrode layer and the wiring layer is formed as a gate wiring layer.

* * * * *

UNITED STATES PATENT AND TRADEMARK OFFICE
CERTIFICATE OF CORRECTION

PATENT NO.         : 8,318,601 B2                                    Page 1 of 1
APPLICATION NO.    : 13/098751
DATED              : November 27, 2012
INVENTOR(S)        : Gen Fujii It is certified that error appears in the above-identified patent and that said Letters Patent is hereby corrected as shown below:

In the Specifications:

Col. 4, line 37, "Invention" should read --invention--.

Col. 10, line 57, "$Fe_3O_3$" should read --$Fe_2O_3$--.

Col. 11, line 66, "$(C_2)_y$" should read --$(CH_2)_y$--.

Col. 26, line 62, "$Cl_x$" should read --$CN_x$--.

Col. 27, line 11, "333" should read --33B--.

Col. 33, line 37, "LlF" should read --LiF--.

Col. 33, line 38, "$caF_2$" should read --$CaF_2$--.

Col. 33, line 47, "$H_2PC$" should read --$H_2Pc$--.

Col. 34, line 49, "[PDAP]" should read --[PDAF]--.

Signed and Sealed this
Sixteenth Day of July, 2013

Teresa Stanek Rea
*Acting Director of the United States Patent and Trademark Office*